US009691925B2

(12) United States Patent
Niinobe et al.

(10) Patent No.: US 9,691,925 B2
(45) Date of Patent: Jun. 27, 2017

(54) LIGHT RECEIVING ELEMENT MODULE AND MANUFACTURING METHOD THEREFOR

(71) Applicant: Mitsubishi Electric Corporation, Chiyoda-ku (JP)

(72) Inventors: Daisuke Niinobe, Tokyo (JP); Yuichi Sakai, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 441 days.

(21) Appl. No.: 14/302,567

(22) Filed: Jun. 12, 2014

(65) Prior Publication Data

US 2014/0366928 A1    Dec. 18, 2014

(30) Foreign Application Priority Data

Jun. 14, 2013 (JP) .................................. 2013-125473
Mar. 27, 2014 (JP) .................................. 2014-066797

(51) Int. Cl.
*H01L 31/05* (2014.01)
*H01L 31/068* (2012.01)
(Continued)

(52) U.S. Cl.
CPC .. *H01L 31/0516* (2013.01); *H01L 31/022441* (2013.01); *H01L 31/0508* (2013.01); *H01L 31/0682* (2013.01); *Y02E 10/547* (2013.01)

(58) Field of Classification Search
CPC . H01L 31/02; H01L 31/0201; H01L 31/0224; H01L 31/022441; H01L 31/0232;
(Continued)

(56) References Cited

U.S. PATENT DOCUMENTS 4,927,770 A    5/1990   Swanson
6,337,283 B1   1/2002   Verlinden et al.
(Continued)

FOREIGN PATENT DOCUMENTS

JP        8-298334      11/1996
JP        2001-189475    7/2001
(Continued)

OTHER PUBLICATIONS

R.Brendel et al "Recent Progress and Options for Future Crystalline Silicon Solar Cells", 28th European PV Solar Energy Conference and Exhibition, 2013, 16 pages.
(Continued)

*Primary Examiner* — Susan D Leong
(74) *Attorney, Agent, or Firm* — Oblon, McClelland, Maier & Neustadt, L.L.P.

(57) ABSTRACT

Light receiving elements of a back connection type including first and second electrodes on their back sides are connected by an inter-element connecting body including a tabular main body section and an inter-element connecting section to form a light receiving element module. The main body section is selectively directly connected to the first electrode and arranged on the second electrode via an insulating layer. The main body section covers substantially the entire back side of each of the light receiving elements excluding a part of the second electrode. The second electrode is connected to the inter-element connecting section of an adjacent light receiving element. The main body section forms a reflecting section between the main body section and the light receiving element to enable reflected light to be made incident on the light receiving element from a gap between the first and second electrodes.

16 Claims, 47 Drawing Sheets

(51) Int. Cl.
*H01L 31/048* (2014.01)
*H01L 31/0224* (2006.01)
*H01L 31/02* (2006.01)

(58) Field of Classification Search
CPC ..... H01L 31/04; H01L 31/042; H01L 31/048; H01L 31/0481; H01L 31/05; H01L 31/0504; H01L 31/0516; H01L 31/0508; H01L 31/0682
See application file for complete search history.

(56) References Cited

U.S. PATENT DOCUMENTS

| | | | |
|---|---|---|---|
| 7,804,022 | B2 | 9/2010 | De Ceuster |
| 8,409,912 | B2 | 4/2013 | De Ceuster et al. |
| 2006/0130891 | A1 | 6/2006 | Carlson |
| 2007/0137692 | A1 | 6/2007 | Carlson |
| 2010/0051085 | A1 | 3/2010 | Weidman et al. |
| 2011/0192826 | A1* | 8/2011 | Von Moltke ......... B23K 1/0056 219/121.64 |
| 2012/0291846 | A1 | 11/2012 | Mikami et al. |

FOREIGN PATENT DOCUMENTS

| | | |
|---|---|---|
| JP | 2006-165148 | 6/2006 |
| JP | 2008-519438 | 6/2008 |
| JP | 2009-71339 | 4/2009 |
| JP | 2009-76739 | 4/2009 |
| JP | 2009-520369 | 5/2009 |
| JP | 2009-521805 | 6/2009 |
| JP | 2009-200414 | 9/2009 |
| JP | 2009-206366 | 9/2009 |
| JP | 2009-266870 | 11/2009 |
| JP | 2010-521811 | 6/2010 |
| JP | 2010-245399 | 10/2010 |
| JP | 2010-283052 | 12/2010 |
| JP | 2011-129882 | 6/2011 |
| JP | 2011-151262 | 8/2011 |
| JP | 2011-181606 | 9/2011 |
| JP | 2012-501551 | 1/2012 |
| JP | 2012-151240 | 8/2012 |
| JP | 2012-174724 | 9/2012 |
| JP | 2013-98496 | 5/2013 |
| WO | WO 2006/120735 A1 | 11/2006 |
| WO | WO 2008/078741 A1 | 7/2008 |
| WO | WO 2009/096539 A1 | 8/2009 |
| WO | WO 2010/082594 A1 | 7/2010 |
| WO | WO 2010/122935 A1 | 10/2010 |
| WO | WO 2011/105510 A1 | 9/2011 |
| WO | WO 2012/171968 A1 | 12/2012 |

OTHER PUBLICATIONS

Henning Schulte-Huxel et al "Aluminum-Based Mechanical and Electrical Laser Interconnection Process for Module Integration of Silicon Solar Cells", IEEE Journal of Photovoltaics, vol. 2, No. 1, 2012, 6 pages.

* cited by examiner

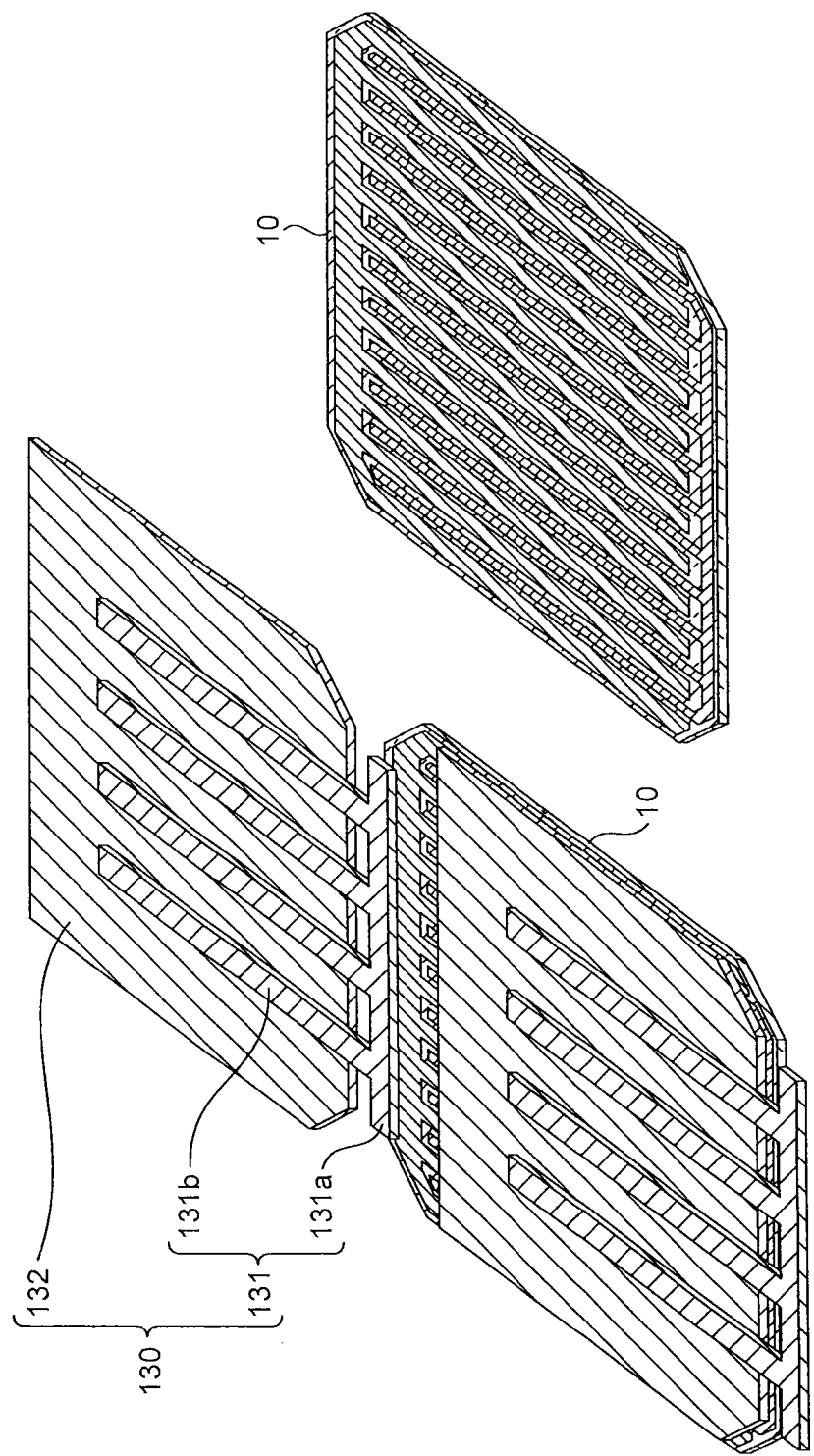

LIGHT RECEIVING ELEMENT MODULE AND MANUFACTURING METHOD THEREFOR

BACKGROUND OF THE INVENTION

1. Field of the Invention

The present invention relates to a light receiving element module and a manufacturing method therefor and, more particularly, to a light receiving element module in which light receiving elements are connected to one another using an inter-element connecting body that connects, in series, the light receiving elements including both of positive electrodes and negative electrodes on one principal plane side.

2. Description of the Related Art

A light receiving element module has been disclosed in which a plurality of light receiving elements, on a light receiving surface side of which electrodes are not provided and on a non-light receiving surface side of which positive electrodes and negative electrodes are provided, are provided side by side lengthwise and breadthwise, and a positive electrode of one light receiving element and a negative electrode of a light receiving element adjacent to the light-receiving element are connected by an inter-element connecting body called inter connector.

In such a light receiving element module, in general, to electrically connect a positive electrode formed on the rear surface of a first light receiving element and a negative electrode formed on the rear surface of a second light receiving element, the elements are connected by the inter-element connecting body. As the inter-element connecting body, in general, metal having high conductivity such as a copper foil entirely covered with solder is used. In the connection of the inter-element connecting body, the inter-element connecting body is arranged on a positive electrode or a negative electrode, which are element electrodes (hereinafter also referred to as electrodes) made of metal such as silver, and heated to compression-bond the inter-element connecting body and the element electrodes partially or over the entire length.

In the case of a light receiving element of a back connection type, only on one surface of which both positive and negative electrodes are arranged, the inter-element connecting body only has to be mounted on the back of the light receiving element. Therefore, the inter-element connecting body does not cover a light receiving surface of the light receiving element. Therefore, it is possible to increase the thickness of the shape of the inter-element connecting body and the element electrodes. It is possible to reduce resistance for collecting electricity in the element and resistance for connecting elements. There is an advantage that the light receiving element is excellent in efficiency of converting light into electricity, that is, photoelectric conversion efficiency.

As such a light receiving element module of the back connection type, there is a light receiving element module in which a large number of elongated linear electrodes are collectively connected to a bus electrode or a current extraction electrode at ends of elements and connected to the current extraction electrode using an inter-element connecting body (Japanese Translation of International Application No. 2010-521811). In such a light receiving element module, a generated current is collected to the end of the element by the large number of elongated linear electrodes. An electric current flows from the end to the element adjacent to the element through the inter-element connecting body.

A solar battery element is also proposed in which positive and negative electrodes are formed in a two-layer structure via an insulating layer on an element (Japanese Patent Application Laid-Open No. 2001-189475). In this structure, it is possible to increase an electrode area per projection area of the element compared with Japanese Translation of International Application No. 2010-521811. As a result, current collection resistance with respect to a light reception current is reduced, and thus it is made possible to reduce a power loss due to resistance.

Another light receiving element module is also disclosed in which a resin sheet provided with a metal electrode having a pattern equivalent to the pattern of a positive electrode and a negative electrode on an element rear surface is arranged with respect to an element, on the element rear surface of which the positive electrode and the negative electrode are formed, and element electrodes among a plurality of the elements are connected using the metal electrode on the resin sheet as an inter-element connecting body and a current extraction electrode (Japanese Patent Application Laid-Open No. 2010-245399).

Another solar battery module is also disclosed in which positive and negative element electrodes are formed in a two-layer structure on the rear surface of a cell (a light receiving element) and a connection line is arranged over the entire element to overlap the element electrodes to reduce current collection resistance with respect to a photocurrent and reduce a power loss due to resistance (Japanese Patent Application Laid-Open No. 2009-206366).

In the element structure of Japanese Translation of International Application No. 2010-521811, the large number of elongated linear electrodes collect the generated current to the end of the element. The linear electrodes are collectively connected to the bus electrode or the current extraction electrode at the end of the element. The inter-element connecting body is connected to the current extraction electrode. An electric current flows to the adjacent element through the inter-element connecting body. However, in such a structure of the element, the generated current needs to be collected to the end of the element by the linear electrode, and a resistance loss during the current collection is relatively large. In Japanese Translation of International Application No. 2010-521811, a positional relation between the positive electrode and the negative electrode of the element electrode on a plane is fixed. Therefore, it is necessary to form strings formed by plurality of elements and arrange and connect a conductor between the strings in a portion where the strings are connected, that is, a turning-back portion of the strings. Therefore, an area is necessary in a portion other than the elements. The photoelectric conversion efficiency of a module cannot be improved.

In Japanese Patent Application Laid-Open No. 2001-189475, the positive and negative electrodes of an element are dividedly formed in two layers. It is costly to form the element having such a structure. Although one electrode covers the entire element rear surface, it is difficult to increase the thickness of the electrodes on the element and attain a sufficient reduction of current collection resistance. A power loss due to resistance cannot be sufficiently reduced.

In Japanese Patent Application Laid-Open No. 2010-245399, a resin film on which the metal pattern is formed is used as an inter-element connecting body without forming a current extraction electrode and a bus electrode on the element. In modularization, it is necessary to align the inter-element connecting body and the electrodes on the light receiving element. Therefore, in the module structure of Japanese Patent Application Laid-Open No. 2010-245399, an interval necessary for preventing a short-circuit between the positive electrode and the negative electrode depends not only on a positional accuracy of the element electrode but also alignment accuracy between the element and the resin film. For example, when an alignment mark is put in the element for highly accurate alignment, it is necessary to introduce a step of forming the alignment mark. When the alignment mark is formed by a silver electrode, silver is necessary for the formation of the alignment mark. Apparatus costs increase because of a highly accurate aligning mechanism. Besides, photoelectric conversion efficiency is deteriorated in an alignment mark section.

In Japanese Patent Application Laid-Open No. 2009-206366, the positive and negative electrodes are formed on the light receiving element rear surface in the two-layer structure. The inter-element connection line is arranged over the entire electrode to overlap the element electrode. Therefore, although the current collection resistance with respect to the photocurrent is reduced, the reduction is insufficient. There is a demand for a reduction in a power loss through a further reduction in resistance.

However, according to the related art, the alignment accuracy between the element electrode and the inter-element connecting body is insufficient. A reduction in the power loss due to the current collection resistance is insufficient. There is a demand for further improvement of the photoelectric conversion efficiency.

SUMMARY OF THE INVENTION

It is an object of the present invention to at least partially solve the problems in the conventional technology.

In order to solve the aforementioned problems, a light receiving element module according to one aspect of the present invention is configured to include: a light receiving element of a back connection type including first and second electrodes on a back side; and an inter-element connecting body; wherein the inter-element connecting body further includes: a tabular main body section selectively directly connected to the first electrode, arranged on the second electrode via an insulating layer, and configured to cover substantially the entire back side of the light receiving element excluding a part of the second electrode; and an inter-element connecting section connected to the second electrode of an adjacent light receiving element, and wherein the main body section includes an inter-element connecting body that connects the adjacent light receiving element in such a manner as to form a reflecting section between the main body section and the light receiving element so as to enable reflected light to be made incident on the light receiving element from a gap between the first and second electrodes.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 17 is a schematic perspective view of a positional relation between a light receiving element and an inter-element connecting body configuring the light receiving element module used in the second embodiment and is a diagram of a state in which an element and the light receiving element connected to the inter-element connecting body are viewed from the rear surface side before the inter-element connecting body is connected;

DETAILED DESCRIPTION OF THE PREFERRED EMBODIMENTS

Figure 1:
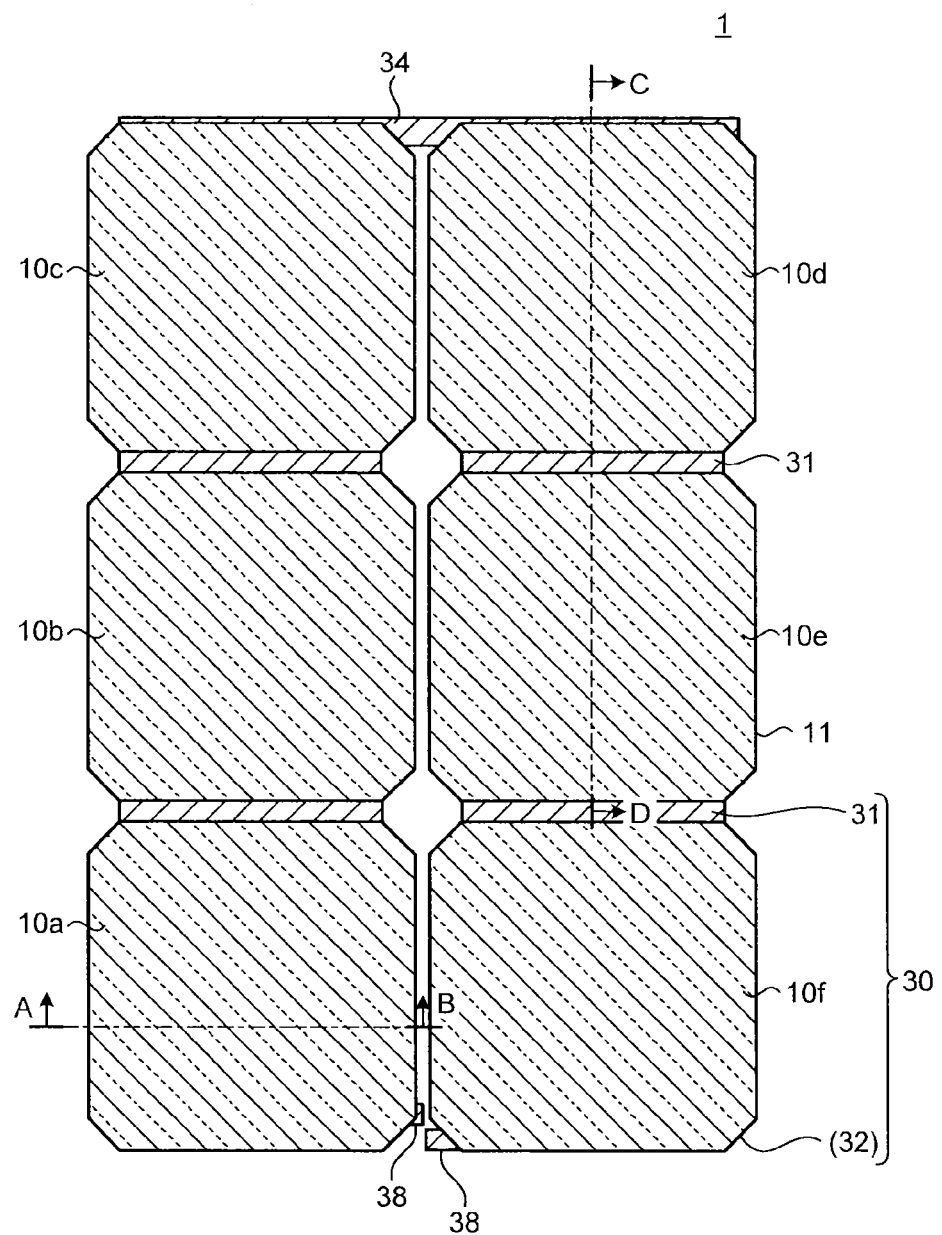
FIG. 1 is a plan view of a light receiving element module according to a first embodiment viewed from a light receiving surface side.

Inter-element connecting bodies, light receiving elements, light receiving element modules, and manufacturing methods therefor according to embodiments of the present invention are explained in detail below with reference to the accompanying drawings. The present invention is not limited by the embodiments and can be changed as appropriate without departing from the spirit of the present invention. In the drawings, for ease of understanding, scales of members are sometimes different from actual scales. The same applies among the drawings. Further, in the embodiments, the same components are denoted by the same reference numerals and signs. Detailed explanation of components explained in a certain embodiment is omitted in the other embodiments. Sizes described below are examples. When a concentrating solar battery, a thermo-electromotive element, or the like is used as a light receiving element, the light receiving element can be used in a smaller size.

First Embodiment

Figure 2:
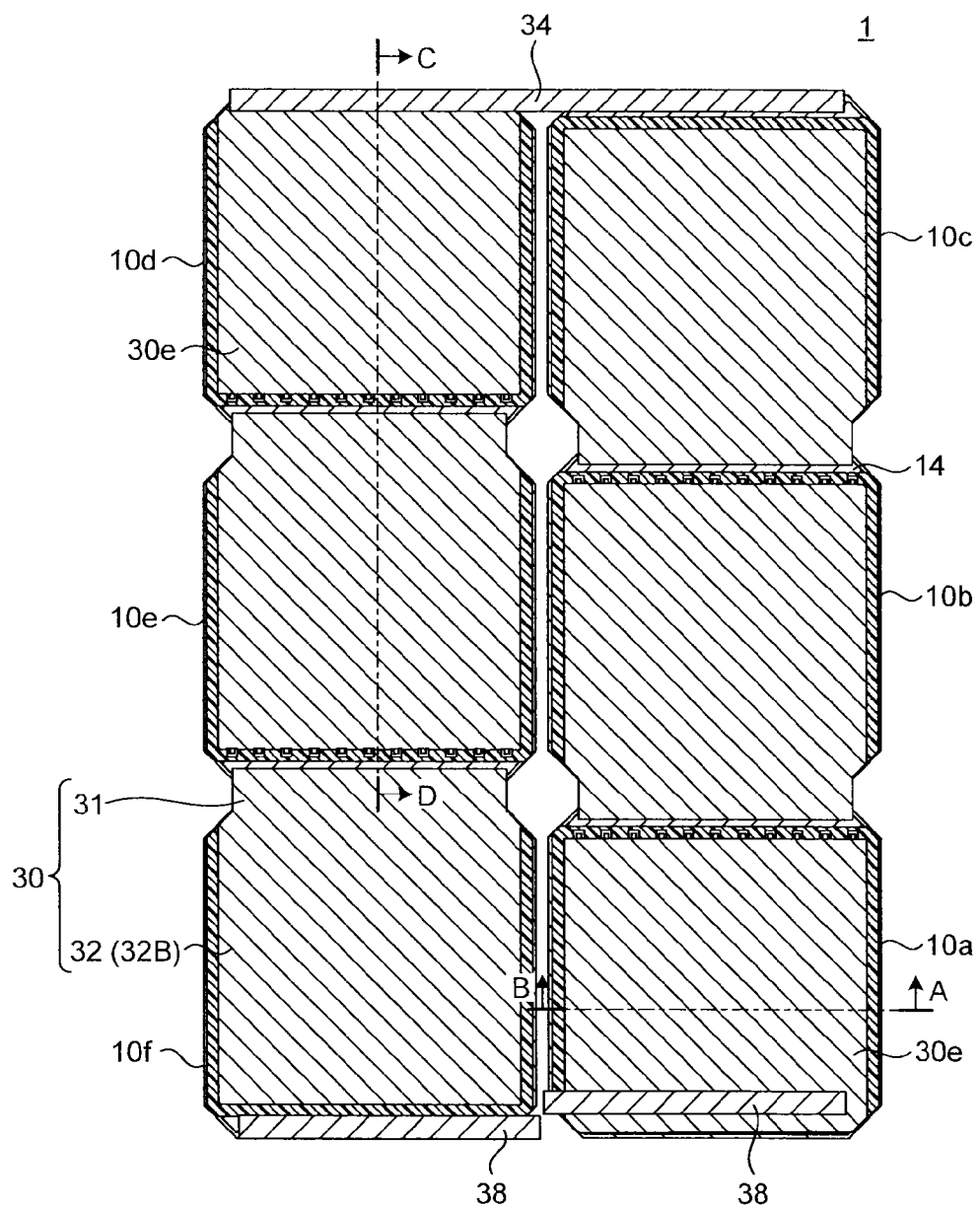
FIG. 2 is a plan view of the light receiving element module according to the first embodiment viewed from a rear surface side.
Figure 3:
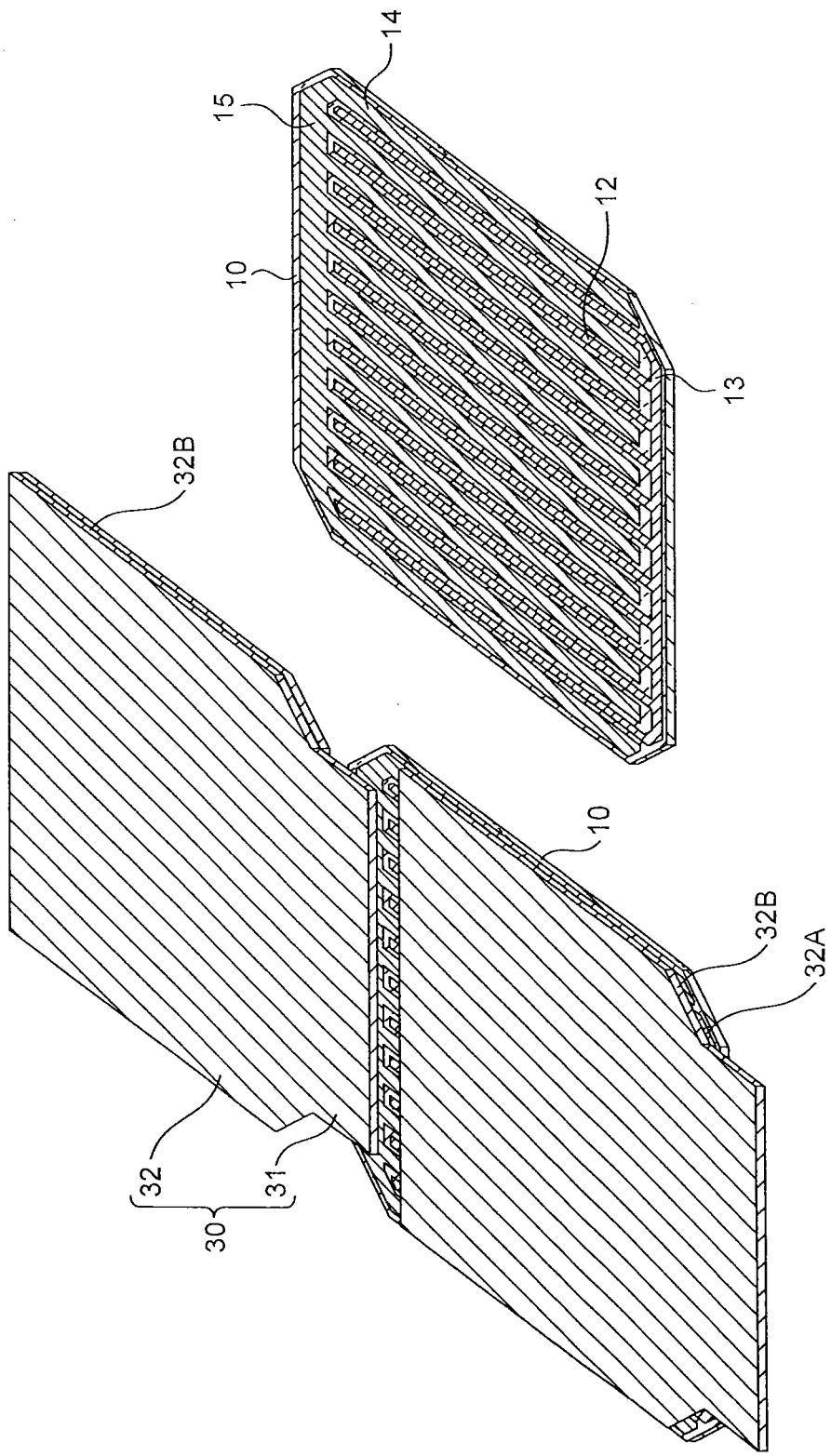
FIG. 3 is a schematic perspective view of a positional relation between a light receiving element and an inter-element connecting body configuring the light receiving element module used in the first embodiment and is a diagram of a state in which an element and the light receiving element connected to the inter-element connecting body are viewed from the rear surface side before the inter-element connecting body is connected.
Figure 4A:
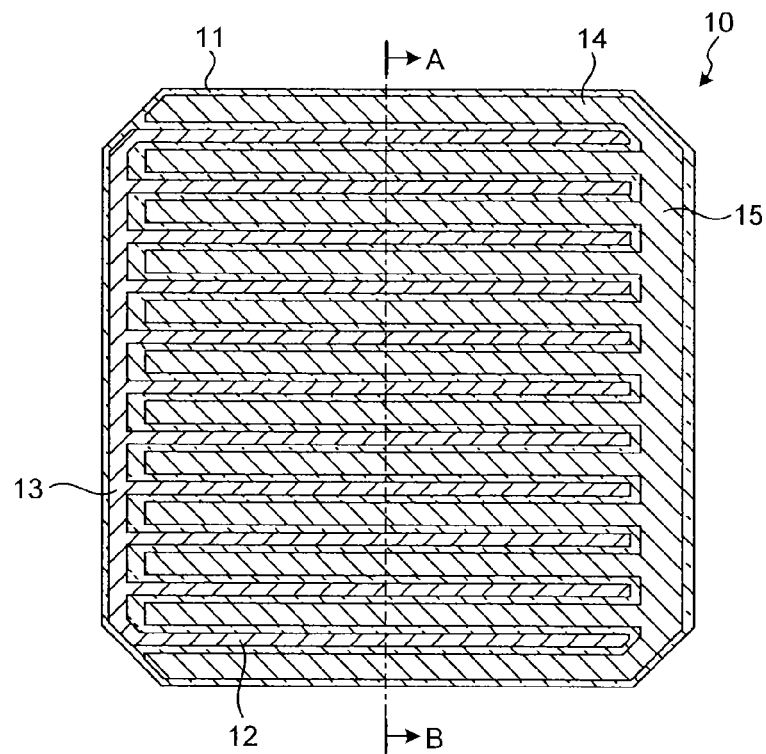
FIG. 4A is a plan view of a light receiving element of a back connection type used in the first embodiment viewed from the rear surface side.
Figure 4B:
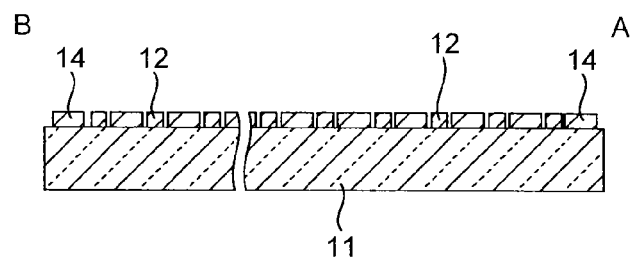
FIG. 4B is an A-B sectional view of FIG. 4A.
Figure 5A:
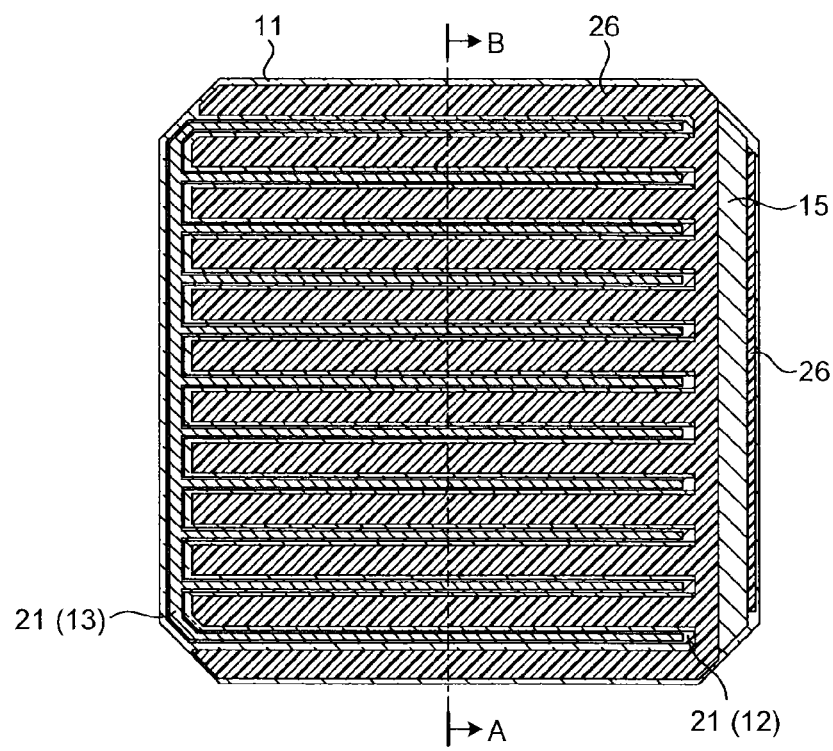
FIG. 5A is a plan view of an example of a positional relation between the light receiving element and a bonding layer in the first embodiment.
Figure 5B:
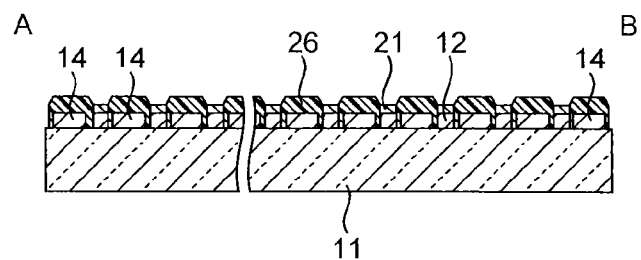
FIG. 5B is an A-B sectional view of FIG. 5A.
Figure 6:
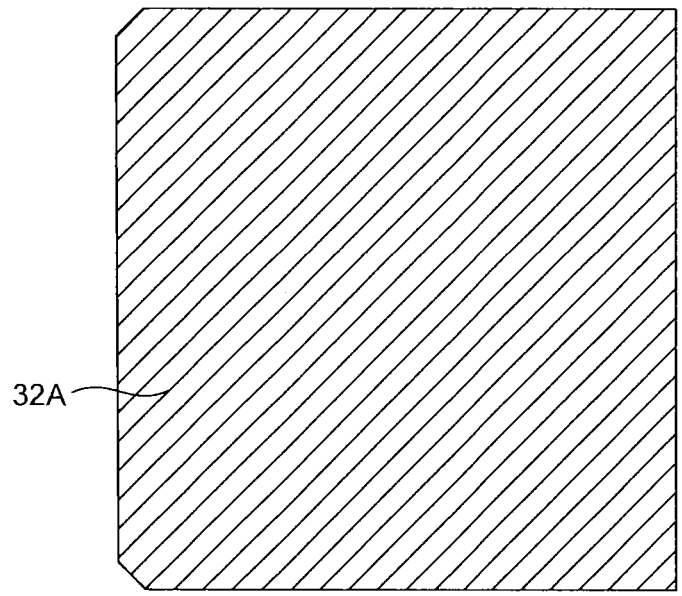
FIG. 6 is a plan view of a first layer of the inter-element connecting body used in the first embodiment.
Figure 7A:
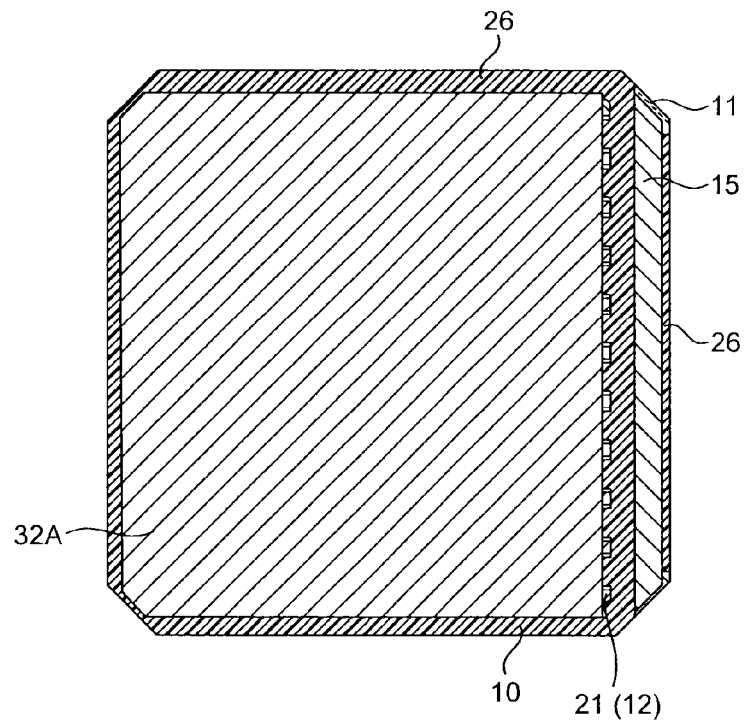
FIG. 7A is a plan view of a positional relation between the light receiving element of the back connection type and the first layer of the inter-element connecting body used in the first embodiment.
Figure 7B:
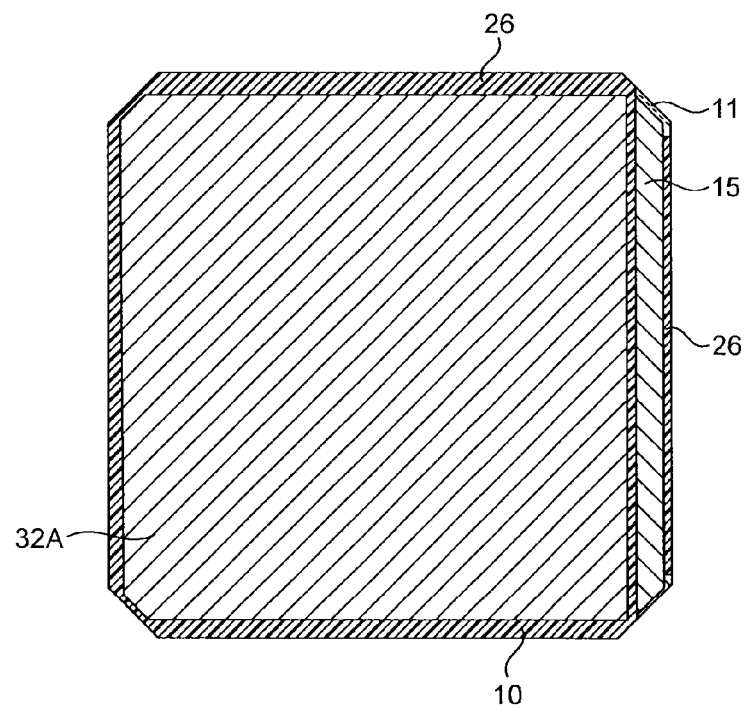
FIG. 7B is a plan view of a modification of the positional relation between the light receiving element of the back connection type and the first layer of the inter-element connecting body used in the first embodiment.
Figure 8A:
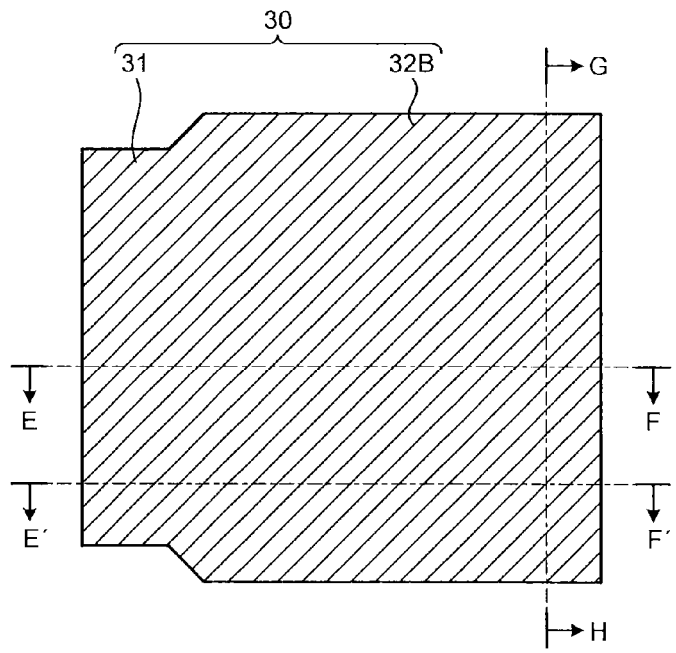
FIG. 8A is a plan view of the inter-element connecting body used in the light receiving element module in the first embodiment.
Figure 8B:
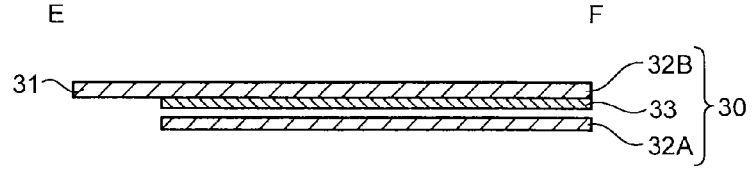
FIG. 8B is an E-F sectional view of FIG. 8A.
Figure 8C:
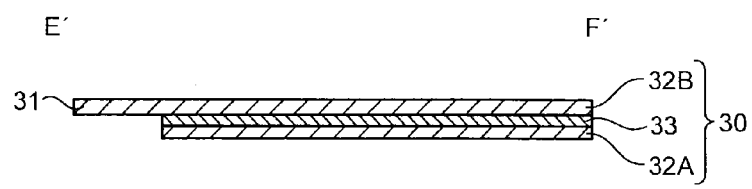
FIG. 8C is an E'-F' sectional view of FIG. 8A.
Figure 8D:
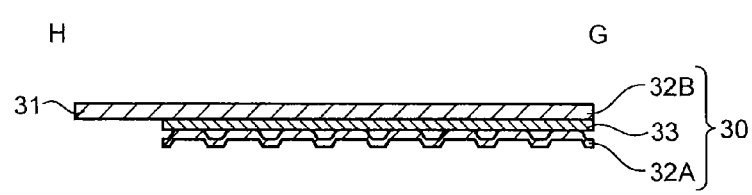
FIG. 8D is a G-H sectional view of FIG. 8A.
Figure 9A:
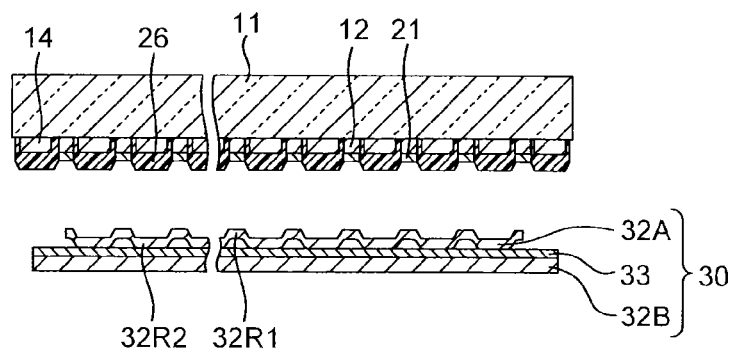
FIG. 9A is a process sectional view of a process for connecting the inter-element connecting body to the light receiving element in the first embodiment.
Figure 9B:
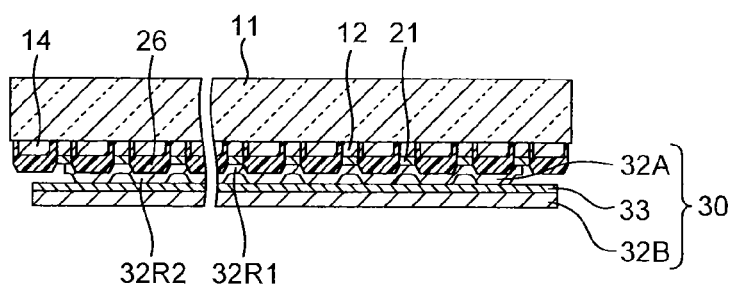
FIG. 9B is a process sectional view of the process for connecting the inter-element connecting body to the light receiving element in the first embodiment.
Figure 9C:
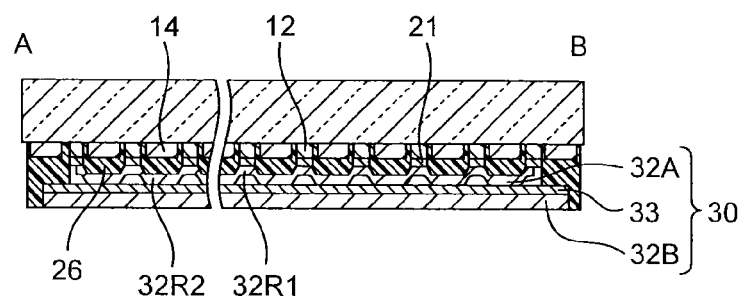
FIG. 9C is a process sectional view of the process for connecting the inter-element connecting body to the light receiving element in the first embodiment.
Figure 10:
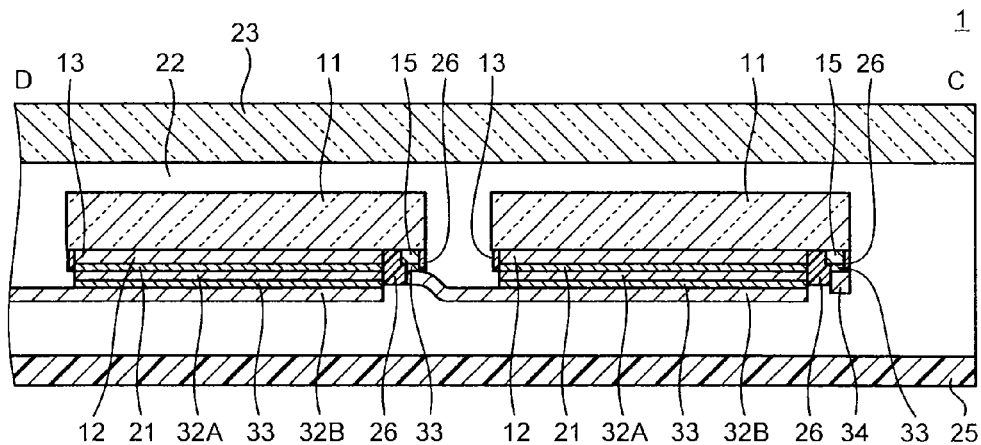
FIG. 10 is a sectional view of the configuration of the light receiving element module in the first embodiment and is a C-D sectional view of FIGS. 1 and 2.
Figure 11:
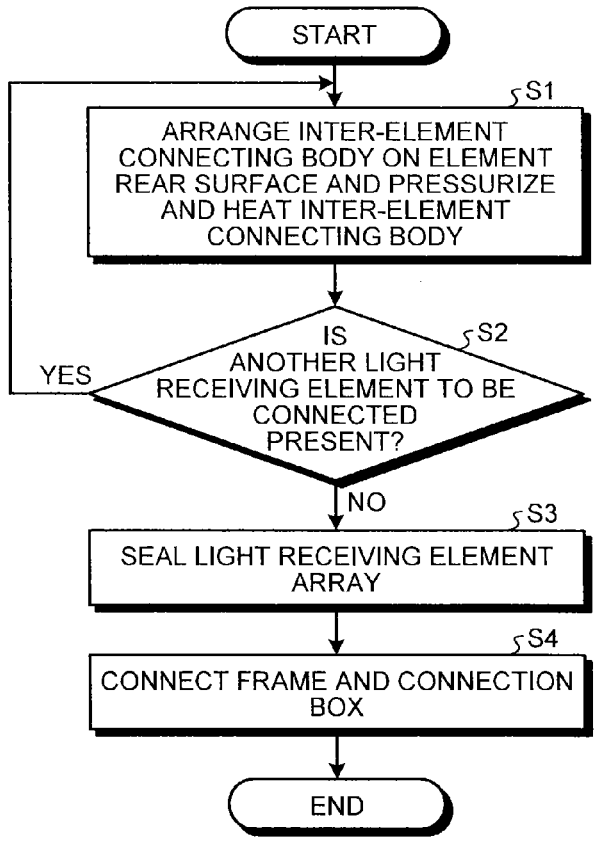
FIG. 11 a flowchart for explaining a mounting process of the light receiving element module in the first embodiment.

FIG. 1 is a plan view of a light receiving element module according to a first embodiment viewed from a light receiving surface side. FIG. 2 is a plan view of the light receiving element module according to the first embodiment viewed from a rear surface side. FIG. 3 is a schematic perspective view of a positional relation between a light receiving element and an inter-element connecting body configuring the light receiving element module in the first embodiment and is a diagram of a state in which an element and the light receiving element connected to the inter-element connecting body are viewed from the rear surface side before the inter-element connecting body is connected. FIG. 4A is a plan view of a light receiving element of a back connection type used in the first embodiment viewed from the rear surface side. FIG. 4B is an A-B sectional view of FIG. 4A. FIG. 5A is a plan view of an example of a positional relation between the light receiving element and a bonding layer in the first embodiment. FIG. 5B is an A-B sectional view of FIG. 5A. FIG. 6 is a plan view of a first layer of the inter-element connecting body used in the first embodiment. FIG. 7A is a plan view of a positional relation between the light receiving element of the back connection type and the first layer of the inter-element connecting body used in the first embodiment. FIG. 7B is a plan view of the positional relation between the light receiving element of the back connection type and the first layer of the inter-element connecting body used in the first embodiment. FIGS. 8A to 8D are diagrams of the inter-element connecting body used in the light receiving element module in the first embodiment. FIG. 8A is a plan view, FIG. 8B is an E-F sectional view of FIG. 8A, FIG. 8C is an E'-F' sectional view of FIG. 8A, and FIG. 8D is a G-H sectional view of FIG. 8A. FIGS. 9A to 9C are process sectional views of a process for connecting the inter-element connecting body to the light receiving element in the first embodiment. FIGS. 9B and 9C are diagrams of the light receiving element with the inter-element connecting body and are A-B sectional views of FIGS. 1 and 2. FIG. 10 is a sectional view of the light receiving element module in the first embodiment and is a C-D sectional view of FIGS. 1 and 2. FIG. 11 is a flowchart for explaining a mounting process of the light receiving element module. FIGS. 12A to 12C, FIGS. 13A and 13B, FIGS. 14A and 14B are process explanatory diagrams for explaining the mounting process of the light receiving element module in the first embodiment. For clearness, an element sealing material, a frame, and a junction box (a connection box) are not shown in FIGS. 1, 2, 7A, and 8A to 8D and a module main face material used for a light receiving surface and a rear surface are not shown in FIGS. 1, 2, and 7A. A light receiving element 10 is sometimes denoted by 10a to 10f depending on positions on a string.

An inter-element connecting body 30 in this embodiment connects the light receiving elements 10a to 10f of a back connection type. The inter-element connecting body 30 includes a main body section 32 that covers substantially the entire back surface of a light receiving element and an inter-element connecting section 31 connected to the main body section 32 and connected to a second electrode of a light receiving element adjacent to the light receiving element (FIGS. 1 to 3). The surface of a portion of the main body section 32 other than a connecting point (a connection region) to a first electrode of the light receiving element 10 is formed of a light reflector having high reflectivity to light. The main body section 32 is selectively directly connected to linear electrode 12, which is a first electrode, of each of the light receiving elements 10a to 10f and arranged on current collecting electrode 14, which is a second electrode, via a bonding layer 26, which is an insulating layer. In addition to reflection by the main body section 32, a reflecting section is configured between the main body section 32 and each of the light receiving elements 10a to 10f. Reflected light is made incident on the light receiving elements 10a to 10f from a gap of the first and second electrodes (the linear electrode 12 and the current collecting electrode 14) to improve photoelectric conversion efficiency.

In this embodiment, as shown in FIGS. 8A to 8D, the main body 32 of the inter-element connecting body 30 is configured by a two-layer structure including an element rear portion (a main body section) 32A, which is a first layer, formed in contact with the rear surface of the light receiving element 10 and an outer side portion 32B, which is a second layer. Reference numeral 33 denotes an electric connection body formed of a solder plating layer. The element rear portion (the main body section) 32A is formed of a thin conductor foil having flexibility and has unevenness to be selectively connected to the linear electrode 12 (and a current extraction electrode 13), which is a first electrode. The outer side portion 32B has a flat structure and is formed continuously to the inter-element connecting section 31. The inter-element connecting section 31 integrally formed with the outer side portion 32B is in contact with a current extraction electrode 15, which is a second electrode, of the adjacent light receiving element 10. The bonding layer 26 made of insulative resin including reflective particles is filled between the light receiving element 10 and the excluding a connecting point of the element rear portion (the main body section) 32A and the linear electrode 12.

By the way, it should be noted that although each of the linear electrode 12 and the current extraction electrode 13 is regarded as being a first electrode, they may collectively be referred to as a first electrode, and although each of the current collecting electrode 14 and the current extraction electrode 15 is regarded as being a second electrode, they may collectively be referred to as a second electrode.

Therefore, in a light receiving element module 1 formed by connecting the light receiving elements 10a to 10f of the back connection type using the inter-element connecting body 30, at least the linear electrode 12 (which is the first electrode) on each of the light receiving elements 10a to 10f are distributed widely on the principal plane of each of the light receiving elements and connected to a plane-shaped portion of the inter-element connecting body 30 in the entire region of the substrate surface.

With the inter-element connecting body 30, the light receiving element, and the light receiving element module in this embodiment, a connection distance from a connected element electrode to the inter-element connecting body 30 is short. Further, a conductor having an area substantially the same as the area of the light receiving elements 10a to 10f can be used. Therefore, a resistance loss is small. It is possible to reflect transmitted light transmitted through each of the light receiving elements 10a to 10f and make the transmitted light incident on the light receiving element again, and thus it is made possible to reduce a light transmission loss and obtain the light receiving element module 1 having a high power generation output with respect to a setting area.

Regarding the main body section 32, different materials can be used for the element rear portion (the main body section) 32A for light reflection and the outer side portion 32B and the inter-element connecting section 31 for performing electrical and mechanical connection, and thus it is possible to improve connectability and light use efficiency. Further, because the inter-element connecting section 31 and the outer side portion 32B are configured by a connecting body of metal, light is not leaked.

The first electrode can be projected further to the inter-element connecting body side than the second electrode according to necessity. Therefore, it is possible to separate a conducting section and an insulating section according to the height of the first electrode. In this case, accurate alignment in connecting the inter-element connecting body to the element is unnecessary.

Structure of the Light Receiving Element Module

First, the structure of the light receiving element module in which the light receiving elements are connected by each of the inter-element connecting bodies is explained. Then, the structure of the light receiving element is explained and the structure of the inter-element connecting body that connects the light receiving elements is explained.

As shown in FIGS. 1 and 2, the light receiving element module 1 in the first embodiment is configured by connecting the light receiving elements 10a to 10f of the back connection type in series. A light receiving element row shown in FIGS. 1 and 2 is sealed by a sealing material 22 between a glass plate, which is a light receiving surface side main face material 23, and a rear surface sheet, which is a rear surface side main face material 25, not shown in FIGS. 1 and 2.

The light receiving elements 10a to 10f are electrically connected by the inter-element connecting body 30 to form linear element rows (strings). The strings are electrically connected by an inter-string connecting body 34.

In the light receiving elements 10a and 10f at an end of a series element row, current draw-out lines 38 are connected to the elements. A part of two current draw-out lines 38 is drawn out to the outside of the sealing material 22 and the rear surface side main face material 25 from portions of holes formed in the sealing material 22 and the rear surface side main face material 25 on the rear surface side. The current draw-out line 38 drawn out from the sealing material 22 on the rear surface side can be connected to a lead wire in a junction box and drawn out to the outside of the light receiving element module 1 through a cable connected to the junction box. Consequently, the light receiving element module 1 is formed.

As shown in FIGS. 3, 4A, and 4B, each of the light receiving elements 10a to 10f in the first embodiment is configured by a semiconductor substrate (hereinafter also referred to as element substrate) 11 for the light receiving element having pn junction and formed in a thin plate having a substantially rectangular shape as a plane shape of a front surface (a light receiving surface) and a rear surface (a non-light receiving surface), which are principal planes, and thickness of, for example, 0.1 to 0.5 millimeters. The substantially rectangular shape only has to be a square shape having two sets of parallel sides perpendicular to each other. In the figures, an example of a shape obtained by cutting off a part of corners of a square is shown. However, the substantially rectangular shape can be a rectangle. In particular, in a light receiving element including a single crystal, when a rectangular substrate is formed from a columnar single crystal ingot, in order to reduce a wasted portion cut out in a rectangular shape from a circular shape, a substrate having the shape obtained by cutting off a part of the corners shown in FIGS. 3 and 4A is often used. Such a shape is also included in the substantially rectangular shape. Besides, the substantially rectangular shape can be a shape such as a triangle, a hexagon, and an octagon.

As such a light receiving element, a crystalline silicon light receiving element including a crystalline silicon having pn junction, a compound light receiving element including a compound semiconductor such as gallium arsenide, and the like can be used. The pn junction can be formed by impurity diffusion or can be an element of a hetero junction type formed by a thin film of amorphous silicon, crystalline silicon, or the like.

As shown in FIG. 3, in a region on the rear surface side of each of the light receiving elements 10a to 10f, the linear electrode 12 and the current extraction electrode 13 are each formed as an electrode at one side (hereinafter may be referred to just as a first electrode) and the current collecting electrode 14 and the current extraction electrode 15 are each formed as an electrode at the other side (hereinafter may be referred to just as a second electrode). In the linear electrode 12 and the current extraction electrode 13, as portions in contact with the element substrate 11 for the element, for the purpose of reflecting light transmitted through the element, it is desirable to use a metal material mainly including a material having high light reflectance in a wide wavelength range such as nickel, tin, copper, silver, and gold, a mixture and an alloy of these kinds of metal, and the like to form a reflective metal layer. It is possible to improve electric conduction in the linear electrodes by laminating a barrier layer for suppressing reaction with the metal material and the reflective metal layer on the reflective metal layer as a second layer. As a material for this improvement of electric conduction, nickel, tin, copper, and silver, a mixture and an alloy of these kinds of metal, and the like can be used. Besides, for example, in the case of a light receiving element in which semiconductor junction is formed by hetero junction, a material obtained by laminating a translucent electrode formed by an indium oxide or the like and aluminum, silver, gold, or the like can be used.

As an outermost layer of the linear electrode, it is desirable to use a material suitable for connection to the inter-element connecting body in modularization. For example, when the element and the inter-element connecting body are connected using solder, it is desirable to use copper, tin, silver, or the like.

The linear electrode 12 and the current collecting electrode 14 in the first embodiment are electrodes for extracting and collecting, from the semiconductor substrate, charges generated by photo carrier generation and are arranged at an appropriate interval. The pattern of the linear electrode 12 is different depending on junction formed by doping, hetero junction, substrate resistance, or the like. However, for example, the linear electrode 12 has a structure in which linear shape portions extending in a predetermined direction at width of about 0.05 to 0.5 millimeters are arranged in a direction orthogonal to an extending direction of the electrode at a period of 0.2 to 2.5 millimeters from each other. The pattern of the current collecting electrode 14 is also different depending on junction formed by doping, hetero junction, or the like. For example, the current collecting electrode 14 has a structure in which linear shape portions extending in a predetermined direction at width of about 0.2 to 2 millimeters are arranged in a direction orthogonal to the extending direction of the electrode at a period of 0.2 to 2.5 millimeters from each other.

The current extraction electrode 13 is connected to the linear electrode 12 having one polarity and functions as a current extraction electrode that extracts an electric current collected by the linear electrode 12 to the outside of the light receiving element 10. The inter-element connecting body 30 and the current extraction electrode 13 that electrically connect a plurality of light receiving elements are formed to extend on the light receiving element 10 in a direction orthogonal to the linear electrode 12. Further, because the current extraction electrode 13 is connected to the inter-element connecting body 30, the current extraction electrode 13 is often thicker than the linear electrode 12 and has width of, for example, about 1 to 2 millimeters. The width is preferably a value smaller than dispersion length of a small number of carriers of the substrate. For this purpose, in the current extraction electrode 13, a plurality of linear electrodes can be formed at a fixed distance. When a pitch is about 1 millimeter in an array direction and the size of the element substrate is 156 millimeters, the number of the current collecting electrode 14 is about one hundred and fifty. However, in FIGS. 3, 4A, and 5A and the subsequent figures, the current collecting electrode 14 are shown schematically and reduced in number. In the subsequent figures, the size of uneven portions formed on the element electrode and the main body section 32 of the inter-element connecting body 30 corresponding to the element electrode is shown larger than an actual scale to clearly show a positional relation in the figures.

As shown in FIGS. 4A and 4B, in a part of a region on the rear surface side, which is the principal plane, of the light receiving element 10, the current collecting electrode 14 and the current extraction electrode 15 having a polarity different from the polarity of the linear electrode 12 and the current extraction electrode 13 are formed as rear surface electrodes. The current collecting electrode 14 is provided on substantially the entire surface or a part of the region on the rear surface side and has a function of collecting an electric current to the current extraction electrode 15. The current collecting electrode 14 can be formed of, for example, a material containing Al (aluminum), silver, or copper and a material obtained by laminating Al, silver, and copper.

The current extraction electrode 15 is connected to the current collecting electrode 14 having one polarity and functions as an current extraction electrode that extracts an electric current collected by the current collecting electrode 14 to the outside of the light receiving element 10. The current extraction electrode 15 is desirably formed of a metal material mainly containing Ag, aluminum, or copper and a laminated body of Ag, aluminum, and copper. An electric current collected by the current collecting electrode 14 in this way is extracted to the outside via the inter-element connecting body 30.

The electrode height of these electrodes can be different among the linear electrode 12, the current collecting electrode 14, and the current extraction electrodes 13 and 15. However, in this embodiment, the heights are substantially the same. In this case, the electrode height of the linear electrode 12, the current collecting electrode 14, and the current extraction electrodes 13 and 15 is preferably set to about 1 to 50 micrometers.

In this explanation, the linear electrode 12 is formed of a material containing Ag as a main component in a linear shape to collect electric currents. However, the linear electrode 12 does not always need to be formed in the linear shape and can be an electrode group formed by separating a plurality of dot-like electrodes. Besides, the rear surface electrodes can have a laminated structure of a translucent conductive film and a metal electrode formed over substantially the entire surface, wherein the negative electrode and the positive electrode are insulated from each other. In the module having the structure in this embodiment, the main body section 32 of the inter-element connecting body 30 and the current collecting electrode 14 can be directly connected. Therefore, the current extraction electrode 13 does not always have to be provided.

In the light receiving element 10 in this embodiment, in order to improve current extraction efficiency, dispersion length of a small number of carriers needs to be set larger than the distance between the element electrodes. Therefore, the element surface is preferably inactivated (passivated). Examples of such an element structure include a hetero junction type solar battery formed by an amorphous silicon film and a microcrystalline silicon formed on a single crystal silicon substrate. A light receiving element of a rear surface connection type is not particularly limited. However, for example, in the case of a light receiving element including hetero junction, as the element substrate 11, intrinsic amorphous silicon films having thickness of about 5 nanometers are formed on both surfaces of a silicon substrate and a p-type amorphous silicon film and an n-type amorphous silicon film are respectively formed to be laminated on the intrinsic amorphous silicon films. For example, the p-type amorphous silicon film is formed in an electrode portion having one polarity, for example, the portion where the current collecting electrode 14 and the current extraction electrode 15 are formed, and the n-type amorphous silicon film is formed in a portion where the linear electrode 12 and the current extraction electrode 13 are formed, which are electrode portions having the other polarity. A gap formed between these electrodes can take a structure in which the intrinsic amorphous silicon film or an insulating film such as a silicon oxide film is formed.

Further, a translucent electrode of an indium oxide or the like can be formed on an outermost layer on the non-light receiving surface side. A structure in which indium oxide can be electrically separated between one electrode portion and the other electrode portion can be adopted. The linear electrode 12, the current extraction electrode 13, the current collecting electrode 14, and the current extraction electrode 15 are formed on a laminated film of the translucent conductive film and an impurity-doped amorphous silicon film. On the other hand, on the light receiving surface side, an n-type amorphous silicon film is formed to be laminated as a passivation film or an amorphous silicon nitride film formed by sputtering or a CVD method or a high refractive index film of titanium dioxide or the like is formed to be laminated as a reflection prevention film.

Connection Method Between the Inter-Element Connecting Body and the Element Electrode In the connection of the inter-element connecting body and the element electrode, because the element rear surface electrode has a positive electrode and a negative electrode on the same surface of the element, it is necessary to insulate the electrodes. Therefore, as shown in FIGS. 5A and 5B, the bonding layer 26 is formed to mainly cover the current collecting electrode 14 excluding only a part of the current extraction electrode 15 of the element and expose most of the linear electrode 12 and the current extraction electrode 13 to the outside. In this case, the bonding layer 26 can partially overlap the linear electrode 12. In the formation of the bonding layer 26, it is possible to use a method of once forming the bonding layer 26 thicker than a planned gap between the element rear portion (the main body section) 32A and the element substrate 11 and thereafter pressing the element rear portion (the main body section) 32A against the element substrate 11 to spread the bonding layer 26 in the lateral direction. In this case, the width of the bonding layer 26 is formed thinner than the line width of the current collecting electrode 14. The bonding layer 26 spreads and changes to a shape shown in FIG. 5B when the element rear portion (the main body section) 32A is connected.

In this way, to give high bonding strength between the light receiving element 10 and the inter-element connecting body 30 and insulate the current collecting electrode 14 and the element rear portion (the main body section) 32A of the inter-element connecting body 30, a portion other than a soldered portion between the inter-element connecting body 30 and the light receiving element 10 is bonded by the bonding layer 26. Specifically, resin such as ethylene vinyl acetate, epoxy containing a filler, or polyimide can be used. However, in order to reflect light transmitted through the element on the inter-element connecting body and make the light incident on the element again, it is desirable to use a material having as little absorption of light as possible. For the above purpose, the bonding layer 26 can have a light reflection or light scattering function. As such a bonding layer 26, ethylene vinyl acetate or the like containing titanium dioxide particles of about several hundred nanometers at high concentration can be used. The size of inorganic particles used here is preferably as small as about a half of the distance between the light receiving element 10 and the inter-element connecting body 30. To give light scattering property, it is preferable to set the size to a particle diameter as small as about a half of a wavelength of light desired to be scattered.

In this case, it is possible to use, as the material of the bonding layer 26, a resin film having a shape that covers a part of the current collecting electrode 14 and the linear electrode 12 and does not cover most of the current extraction electrode 15. When such a resin film is used, electrical connection of the linear electrode 12 and the element rear portion (the main body section) 32A of the inter-element connecting body 30 is not hindered. On the other hand, it is possible to keep insulation of the current collecting electrode 14 and the element rear portion (the main body section) 32A of the inter-element connecting body 30. Alternatively, it is also possible that resin having a shape equivalent to the shape of the current collecting electrode 14 is applied to the element rear portion (the main body section) 32A of the inter-element connecting body 30 in advance and solder paste is applied to the other portions so as to form an electric connection body 21 for the linear electrode 12, the current extraction electrode 13, and the inter-element connecting body 30 on the rear surface. In this case, it is preferable that the melting point of an electric connection body 33 used after the electric connection body 21 is lower than the melting point of the electric connection body 21 because, for example, positional deviation of the electric connection body 21 involved in re-melting does not occur. On the other hand, it is desirable that the melting temperature of the bonding layer 26 is higher than the melting point of the electric connection body 21. Consequently, it is possible to prevent re-melting or the like from occurring by keeping the bonding layer 26 at temperature equal to or lower than the melting temperature in a bonding process.

For the electric connection body 21, specifically, tin, silver solder, a conductive adhesive, a conductive tape, and the like can be used. The electric connection body 21 is formed in only portions where the electrodes are connected and mainly formed in overlapping portions of the inter-element connecting body 30 and the current extraction electrodes 13 and 15 and the linear electrode 12 (FIGS. 5A and 5B). On the other hand, the electric connection body 21 can cover the entire surface on the element side or the entire both surfaces of the inter-element connecting body 30. However, in that case, the electric connection body 21 is preferably a material having as high light reflectance as possible.

The element rear portion (the main body section) 32A of the inter-element connecting body 30 shown in FIG. 6 is connected to the rear surface electrode of the light receiving element formed in this way. A light receiving element with an inter-element connecting body having a rear surface shown in FIG. 7A is obtained. As a modification, as shown in FIG. 7B, unlike the example shown in FIGS. 2, 3, and 7A, the linear electrode 12 and the current extraction electrode 13, which are element electrodes, can be formed to be hidden by the element rear portion (the main body section) 32A and the bonding layer 26 and not to be exposed on the surface of the light receiving element 10. In such a structure, it is preferable that the linear electrode 12 and the current extraction electrode 13 are covered with metal of the element rear portion (the main body section) 32A and resin formed by the bonding layer 26 as shown in FIG. 7A, because, for example, intrusion of moisture from the outside decreases and reliability and durability are improved.

The element rear portion (the main body section) 32A of the inter-element connecting body 30 is made of a conductor foil having flexibility and only has to be molded in an uneven shape as shown in the sectional views of FIGS. 8B to 8D by pressing, for example, a copper foil in advance. The element rear portion (the main body section) 32A is conducted to the linear electrode 12 and the current extraction electrode 13, which configure one electrode, through the electric connection body 21 and insulated from the current collecting electrode 14, which is of the other electrode, by the bonding layer 26. As shown in a process for mounting the inter-element connecting body 30 on the light receiving element 10 in FIGS. 9A to 9C, in the portion of the current collecting electrode 14 and the current extraction electrode 15, which configure the other electrode, the element rear portion (the main body section) 32A of the inter-element connecting body 30 has a retracted shape (concave sections) with respect to the element rear portion (the main body section) 32A in portions corresponding to the linear electrode 12 and the current extraction electrode 13, which configure one electrode. The element rear portion (the main body section) 32A of the inter-element connecting body 30 has a relatively projected shape (convex sections) in the portions corresponding to the linear electrode 12 and the current extraction electrode 13.

In this way, in the first embodiment, the element rear portion (the main body section) 32A of the inter-element connecting body 30 has convex sections indicated by 32R1 and concave sections indicated by 32R2 in the figure. In this way, the conductor having flexibility is used as the element rear portion (the main body section) 32A of the inter-element connecting body 30. The conductor is not directly fixed to the light receiving element 10 in a portion other than a portion where the conductor is electrically connected. Consequently, the element rear portion (the main body section) 32A of the inter-element connecting body 30 is deformed in the portion not connected to the light receiving element 10. It is possible to reduce deformation of the light receiving element 10 and stress to the light receiving element 10 caused by a difference in a coefficient of thermal expansion between the light receiving element substrate and the element rear portion (the main body section) 32A and the outer side portion 32B of the inter-element connecting body 30 altogether. It is possible to obtain the light receiving element 10 with the inter-element connecting body and the light receiving element module 1 having a less bend of the light receiving element 10 and excellent in strength, long-term reliability, and productivity. For the inter-element connecting body 30, the bonding layer 26 functions as an insulating layer and function as a deformable layer that fixes the light receiving element 10 and the inter-element connecting body 30. Consequently, the bonding layer 26 also functions as a layer for reducing stress.

In order to give flexibility to the element rear portion (the main body section) 32A of the inter-element connecting body 30, the element rear portion (the main body section) 32A of the inter-element connecting body 30 is formed to be thin and have low electric conductivity. Therefore, when an electric current flows from a light receiving element 10 to another light receiving element 10, the photoelectric conversion efficiency is deteriorated by a resistance loss. Therefore, the outer side portion 32B is connected to the non-light receiving surface side of the element rear portion (the main body section) 32A of the inter-element connecting body 30 shown in FIGS. 8B to 8D. Consequently, the outer side portion 32B acts as a conductor, so that it is made possible to suppress the deterioration in the photoelectric conversion efficiency during modularization of the element. In the first embodiment, the element rear portion (the main body section) 32A of the inter-element connecting body 30 is conducted to the element rear portion (the main body section) 32A of the inter-element connecting body 30 shown in FIGS. 8A to 8D through the electric connection body 33. In this case, a bonding layer can be provided between the element rear portion (the main body section) 32A of the inter-element connecting body 30 and the outer side portion 32B of the inter-element connecting body 30 to reinforce the connection.

In the inter-element connecting body 30, as shown in FIGS. 8A to 8D, the inter-element collecting body 31 that connects the elements and the outer side portion 32B having a size substantially the same as the size of the light receiving element 10 and a shape equivalent to the shape of the light receiving element 10 and also formed in a planar conductor portion connected to the rear surface side of the light receiving element 10 are integrally configured. The element rear portion (the main body section) 32A of the inter-element connecting body 30 directly connected to the element electrode and the outer side portion 32B are connected to each other on principal planes thereof through the electric connection body 21. Consequently, the linear electrode 12, the current extraction electrode 13, and the inter-element connecting section 31 formed on the rear surface side of the light receiving element 10 are electrically connected.

The inter-element connecting body 30 having the shape shown in FIGS. 8A to 8D can be manufactured by, for example, punching a copper foil. The outer side portion 32B and the inter-element connecting section 31 do not always have to be integrally configured. The inter-element connecting section 31 and the element rear portion (the main body section) 32A can be configured separately and connected by solder, a conductive adhesive, or the like later. Here, the copper foils are used as the element rear portion (the main body section) 32A of the inter-element connecting body 30 having flexibility and the outer side portion 32B of the inter-element connecting body 30. However, in the first embodiment, the copper foils do not have to be a continuous metal foil. For example, a metal film formed by vapor-deposited on a polyimide film or a film or a foil formed by connecting, in a pattern shape same as the pattern shape of the element electrode, resin containing metal particles, a metal particulate group formed by drying printing paste, a metal sintered body, or the like can be used.

The thickness of the inter-element connecting body 30 can be set to, for example, 0.01 to 1 millimeter. It is possible to reduce resistance by setting the thickness of the inter-element connecting body, in particular, the main body section. When the thickness exceeds 1 millimeter, workability is deteriorated and joining property with the light receiving element is deteriorated or weight increases. By forming at least the main body section as a tabular body such as a metal foil or a metal plate having thickness equal to or larger than 0.01 millimeter, it is made possible to form a light receiving element module having low resistance and high reliability. In this embodiment, the element rear portion 32A is set in the range explained above and the outer side portion 32B is joined. Therefore, it is made possible to attain a further reduction in current collection resistance. The strength of the module is increased.

The main body section is desirably a metal plate sufficiently thicker than the first electrode of the light receiving element. Consequently, it is possible to attain a reduction in current collection resistance. It is possible to form a light receiving element module having high supporting strength for the light receiving element and high reliability.

The main body section is desirably a metal plate having thickness three times or more as large as the thickness of the first electrode of the light receiving element. Consequently, it is possible to attain a further reduction in current collection resistance. It is possible to form a light receiving element module having higher supporting strength for the light receiving element and higher reliability.

The main body section is desirably configured by a metal plate, and is joined with the first electrode of the light receiving element via an electric connection body selectively formed only in the connecting section. Consequently, it is possible to attain a further reduction in current collection resistance, and also made possible to form a light receiving element module having higher supporting strength for the light receiving element and higher reliability.

The main body section is configured by the metal plate, and is joined with the first electrode of the light receiving element via a solder layer. Consequently, connection having low resistance and high reliability is realized.

The surface of the main body section 32 of the inter-element connecting body 30 in portions other than a connecting point to the first electrode of the light receiving element is desirably configured by a light reflector for the light transmitted through the light receiving element. With such a configuration, it is possible to attain a further increase in a light amount.

The surface of the main body section 32 of the inter-element connecting body 30 opposed to the light receiving element desirably configures a concave section with respect to the light receiving element in a region equivalent to the second electrode. With such a configuration, it is possible to prevent a leak according to a difference in electrode height.

The surface of the main body section opposed to the light receiving element can be a flat surface. In this case, workability is satisfactory.

The surface of the main body section opposed to the light receiving element desirably has an insulating layer pattern in a region equivalent to the second electrode. With such a configuration, it is possible to surely separate the first and second electrodes according to the difference in electrode height. It is possible to prevent a leak.

As shown in FIGS. 4A, 4B, and 9C, on the rear surface side of the light receiving element 10 (the element substrate 11 for the light receiving element), the current extraction electrode 13 and the linear electrode 12 orthogonal to the current extraction electrode 13 are formed, and the current extraction electrode 15 and the current collecting electrode 14 are formed. The inter-element connecting section 31 of the inter-element connecting body 30 is connected to the current extraction electrode 15 formed on the rear surface of the light receiving element 10 via the electric connection body 21. The element rear portion (the main body section) 32A and the outer side portion 32B are connected to the current extraction electrode 13 and the linear electrode 12 formed on the rear surface side of a light receiving element 10 different from the light receiving element 10. Consequently, electrical connection between the two light receiving elements 10 adjacent to each other is attained. An element string is formed.

By connecting the light receiving elements 10 using the inter-element connecting body 30 in this way, as shown in FIGS. 1 and 2, a string in which the light receiving elements 10a, 10b, and 10c are linearly connected is formed. The linear string formed by the light receiving elements 10a, 10b, and 10c and a linear string formed by the light receiving elements 10d, 10e, and 10f are connected by the inter-string connecting body 34, solder, or the like. Consequently, an element array of the light receiving element module 1 in which two string rows are connected in series shown in FIGS. 1 and 2 is formed.

The light receiving elements 10a and 10f at the terminal ends of the light receiving element module 1 are connected to the current draw-out lines 38 for extracting an electric current from the light receiving element module 1.

The current draw-out lines 38 of the module are connected to the terminal ends of the elements configuring the module by solder or the like. Therefore, the shape of the inter-element connecting body 30 of the light receiving element 10f is different from that of the other light receiving elements 10b to 10e and is the shape of only the element rear portion (the main body section) 32A (FIG. 6).

The current draw-out line 38 is connected to the current extraction electrode 15 portion in the light receiving element 10a and the current draw-out line 38 is connected to the element rear portion (the main body section) 32A of the inter-element connecting body 30 in the light receiving element 10f through the electric connection body 21 to enable external connection.

Although not shown in FIGS. 1 and 2, as shown in the sectional view in FIG. 10, on the front surface side and the rear surface side of the light receiving element array formed by the two rows of strings shown in FIGS. 1 and 2, the sheet-like sealing materials 22 such as ethylene vinyl acetate resin sheets are arranged. The light receiving surface side main face material 23 such as glass is bonded to the front surface (the light receiving surface) side, and the rear surface side main face material 25 such as weather resistant polyethylene terephthalate resin sheet is bonded to the rear surface side via the sealing materials 22.

The structure held between the light receiving surface side main face material 23 and the rear surface side main face material 25 is supported by a frame made of metal or the like. The current draw-out line 38 is drawn out to the rear surface via the connection box from a gap between the sealing material 22 and the rear surface side main face material 25. The light receiving element module 1 is configured.

The light receiving surface side and the rear surface side of the thus formed element string are sealed by the sealing material and the main face material in this way. Consequently, it is possible to obtain a light receiving element module structure shown in FIGS. 1, 2, and 10.

Next, a manufacturing method for the light receiving element module 1 according to the first embodiment is explained with reference to the use of a single crystal silicon solar battery as an example. FIG. 11 is a flowchart of an example of a procedure of the manufacturing method for the light receiving element module according to the first embodiment. FIGS. 12A to 12C, FIGS. 13A and 13B, and FIGS. 14A and 14B are schematic plan views of the example of the procedure of the manufacturing method for the light receiving element module according to the first embodiment. In this example, the light receiving element module 1 shown in FIGS. 1 and 2 is manufactured using, as the light receiving element, a single crystal silicon solar battery having a substantially square shape 156 millimeter lengthwise and breadthwise including Ag electrodes of a pattern such as the linear electrode 12, the current extraction electrodes 13 and 15, and the current collecting electrode 14 shown in FIGS. 4A and 4B on the rear surface.

For example, in the case of the light receiving element including hetero junction, for the element substrate 11, an amorphous silicon film having thickness of about 5 nanometers is formed on the rear surface of a single crystal n-type silicon substrate, and a boron-doped amorphous silicon film is formed on an intrinsic amorphous silicon film of the portions where the electrodes having one polarity, for example, the current collecting electrode 14 and the current extraction electrode 15 shown in FIGS. 4A and 4B are formed, and a phosphorus-doped amorphous silicon film is formed on an intrinsic amorphous silicon film in the portions of the linear electrode 12 and the current extraction electrode 13, which are the electrodes having the other polarity, to be laminated on the amorphous silicon film. Halfway in a gap portion between the electrodes, the element substrate 11 includes a region where only the intrinsic amorphous silicon film or an insulating film such as a silicon oxide film is formed and a p-type amorphous silicon layer and an n-type amorphous silicon layer are not present or a region where the p-type amorphous silicon layer and the n-type amorphous silicon layer overlap. A translucent electrode of an indium oxide or the like is further laminated on the principal plane (the non-light receiving surface) side on which the electrodes are formed. The element substrate 11 linearly continuously includes a region where a translucent electrode layer is absent between one electrode portion and the other electrode portion. The electrodes are electrically insulated.

The linear electrode 12, the current extraction electrode 13, the current collecting electrode 14, and the current extraction electrode 15 are formed on the translucent conductive film and on a part of the insulating film between the electrodes. In the element electrodes, electrode patterns of two polarities indicated by the linear electrode 12, the current extraction electrode 13, the current collecting electrode 14, and the current extraction electrode 15 shown in FIGS. 4A and 4B are formed by a screen printing method using nano-silver paste formed by silver having a particle diameter of about several ten nanometers formable at a low temperature and solvent and resin components. The electrode patterns are heated at about 100° C. to 200° C. to remove the solvent component and improve conductivity among the silver particles, whereby the linear electrode 12, the current extraction electrode 13, the current collecting electrode 14, and the current extraction electrode 15 are formed. In this case, it is preferable that the solvent and the resin component are evaporated or dissolved in the temperature range. The electrodes indicated by the linear electrode 12, the current extraction electrode 13, the current collecting electrode 14, and the current extraction electrode 15 are formed to be aligned on the translucent conductive films having the respective polarities. In the first embodiment, the linear electrode 12, the current extraction electrode 13, the current collecting electrode 14, and the current extraction electrode 15 are formed by one screen printing. Therefore, the thicknesses (the heights) of the electrodes are substantially equal.

An n-type amorphous silicon film of about 5 nanometers or a silicon oxide film of about 30 nanometers is formed on the light receiving surface side as a passivation film. An amorphous silicon nitride film or a reflection preventing film of titanium dioxide, an indium oxide, tin oxide, or the like is formed at thickness of about 40 to 80 nanometers formed by a sputtering method, a chemical vapor deposition method, or the like is formed to be laminated on the silicon oxide film. The light receiving element shown in FIGS. 4A and 4B is obtained.

The electric connection body 21 is formed to electrically connect the element rear portion (the main body section) 32A of the inter-element connection body 30 shown in FIGS. 4A and 4B to the light receiving element formed in this way. Specifically, solder paste is applied to overlap the linear electrode 12 and the current extraction electrode 13 shown in FIGS. 4A and 4B using the screen printing method. In the light receiving element including the amorphous silicon, deterioration occurs in a photoelectric conversion characteristic of the element because of high temperature. Therefore, as the solder paste used in the electric connection body 21, it is desirable to use low-temperature solder that can suppress a connection temperature in connection to the element. As a material that can be connected at a low temperature, materials including tin, bismuth, silver, indium, and the like can be used. It is preferable in efficiently performing work of module formation to use, for example, solder containing tin, bismuth, silver, or indium and use paste having a low melting point compared with tin or silver solder to be used later and, on the other hand, having a melting point higher than the melting point of the material used in the electric connection body 33.

The element rear surface electrode and the inter-element connecting body of the element in this embodiment include a positive electrode and a negative electrode on the same surface of the element. Therefore, it is important to insulate the electrodes not to be short-circuited. Therefore, as shown in FIGS. 5A and 5B, the bonding layer 26 having electric insulation is formed to mainly cover the current collecting electrode 14 excluding only a part of the current extraction electrode 15 of the element and expose most of the electrode 12 and 13 to the outside.

In this case, the bonding layer 26 can overlap the linear electrode 12 as long as an overlapping area is small. The bonding layer 26 can be formed by application by a dispenser or the screen printing using epoxy resin including a silica filler and a polymerization initiator and having a coefficient of thermal expansion after applied film drying set close to the coefficient of thermal expansion of the element substrate. Polyimide and the like having high heat resistance can be used as the bonding layer 26. In the case of a thermosetting material, the material can be applied in a heated state and hardened after being fluidized to cover the current collecting electrode 14. A thermoplastic material can be heated and fluidized after being applied. By using such a method, the surfaces of the current collecting electrode 14 can be surely covered with the bonding layer 26. As the bonding layer 26 having further improved heat radiation properties, a high heat conductive insulating bonding sheet and the like including AlN and the like as fillers can be used.

When the bonding layer 26 and the electric connection body 21 are directly formed on the substrate in this way, if a problem less easily occurs even if the electric connection body 21 overlaps the bonding layer 26, the electric connection body 21 can be formed after the bonding layer 26 is formed. It is preferable to form the bonding layer 26 and the electric connection body 21 in this order because insulation between the electrodes are high and likelihood of printing alignment is increased. The bonding layer 26 desirably has high light transmissivity to light of about 800 to 1300 nanometers transmitted through a silicon substrate. It is more preferable to use a material not including a hydroxyl group in a composition. In this way, the element rear portion (the main body section) 32A of the inter-element connecting body 30 is formed by the bonding layer 26 over substantially the entire region of the surface of the light receiving element 10 on which the electrodes are formed. Consequently, deterioration in the element electrode itself and a connection between the element electrode and the element due to penetration of moisture or the like is prevented. Deformation and stress due to a difference in a coefficient of thermal expansion between the light receiving element and the element rear portion (the main body portion) 32A of the inter-element connecting body 30 are reduced, and heat radiation properties from the light receiving element are improved and the photoelectric conversion efficiency of the light receiving element is improved.

Subsequently, a copper sheet having the shape shown in FIG. 6 and thickness of about 0.02 millimeter is machined by punching, laser scribe, or the like to form the element rear portion (the main body section) 32A of the inter-element connecting body 30. A continuous body of the inter-element connecting section 31 and the outer side portion 32B shown in FIG. 8A is formed at thickness of about 0.05 millimeters by the same method.

Separately from the above, as an element connecting body 30e for the light receiving elements 10a and 10d at the end of the light receiving element module 1, a copper sheet having the shape same as that shown in FIG. 6 and thickness of about 0.2 millimeter is manufactured. The current draw-out line 38 made of a copper wire having width of about 3 millimeters, thickness of about 0.2 millimeters, and length of about 160 millimeters is connected to the sheet in advance. The current draw-out line 38 and the element connecting body 30e are preferably connected using, for example, tin/silver solder, which can withstand a high temperature of about 200° C., such that the current draw-out line 38 and the element connecting body 30e do not peel because of heating in connecting the electric connection bodies 21 and 33 in a later process.

As the inter-string connecting body 34 between the light receiving elements 10c and 10d at the end of the light receiving element module 1, belt-like copper having width of 8 millimeters, thickness of about 0.2 millimeter, and length of about 285 millimeter is manufactured. About a half of the entire copper is coated with low-melting point solder such as tin/bismuth solder or indium/tin solder. The element connecting body 30e, which becomes the light receiving element 10c portion shown in FIG. 2, and the inter-string connecting body 34 are connected in advance. In this case, the element connecting body 30e and the inter-string connecting body 34 are preferably connected using, for example, tin/silver solder, which can withstand a high temperature of about 200° C., such that the element connecting body 30e and the inter-string connecting body 34 do not peel because of heating in melting the electric connection bodies 21 and 33 in a later process. The inter-string connecting body 34 is connected to the element connecting body 30e using a portion not coated with the solder.

On the other hand, a copper sheet having thickness of about 0.05 millimeter punched in the shape shown in FIG. 8A by punching in advance is formed as the inter-element connecting section 31 and the outer side portion 32B of the inter-element connecting body 30. Mainly one surface of the sheet is immersed in a heated and melted tin/bismuth solder bath, whereby one surface of the inter-element connecting body 30 is coated with the electric connection body 33 (the tin/bismuth solder) in advance. Similarly, a surface of the element connecting body 30e at the end connected to the element is coated with solder. The melting point of the electric connection body 33 is preferably lower than the melting point of the electric connection body 21. As the electric connection body 33, it is preferable to use a material having a low melting point compared with the electric connection body 21 by changing the quantity of bismuth to be added to the tin/bismuth solder. In the first embodiment, copper is used as the outer side portion 32B of the inter-element connecting body 30. However, a nickel iron alloy such as invar can be used. In this case, it is possible to reduce the difference in a deformation amount between the light receiving element 10 and the inter-element connecting body 30 with respect to a temperature change by, for example, adjusting the ratio of nickel and iron to set the coefficient of thermal expansion of the outer side portion 32B of the inter-element connecting body 30 to a coefficient of thermal expansion substantially the same as the coefficient of thermal expansion of the silicon substrate.

In the first embodiment, the element rear portion (the main body section) 32A of the inter-element connecting body 30 having flexibility is present between the light receiving element and the outer side portion 32B of the inter-element connecting body 30. Therefore, the element rear portion (the main body section) 32A is deformed or distorted, whereby the difference in a deformation amount between the light receiving element and the inter-element connecting body can be covered. Therefore, it is possible to reduce stress that occurs in the light receiving element. It is also made possible to obtain a light receiving element and a solar battery excellent in strength, reliability, and power generation life.

The element rear portion (the main body section) 32A, the outer side portion 32B, and the element connecting body 30e at the end are formed in the size substantially the same as that of the element substrate 11 for the light receiving element configuring the single crystal silicon solar battery and the shape substantially similar to the shape of the element substrate 11. As shown in FIGS. 7A and 9A, the element rear portion (the main body section) 32A, the outer side portion 32B, and the element connecting body 30e are formed in the size and the shape slightly larger than the linear electrode 12 and the current extraction electrode 13 forming one polarity of the element and smaller than the outermost section of the current extraction electrode 15 to cover the entire current collecting electrode 14 having the other polarity. Specifically, as the material of the element rear portion (the main body section) 32A and the outer side portion 32B, a copper foil can be used. As the specific size, the element rear portion (the main body section) 32A and the outer side portion 32B can be formed in a pseudo-rectangle having a long side of 152 millimeters and a short side of 150 millimeters. Two corners forming one long side can be an arc formed at a radius of 98 millimeters. The thickness of the element rear portion (the main body section) 32A and the outer side portion 32B can be set to about 0.01 to 1 millimeter. The inter-element connecting section 31 can be, for example, a copper foil having width of about 3 to 10 millimeters, length of about 130 millimeters, and thickness of about 0.01 to 1 millimeter. Most of a surface side (the rear surface side), which is not a connection surface to the element, of the element rear portion (the main body section) 32A and the element connecting body 30e other than electrical connecting sections can be covered with resin such as polyimide. For example, a film or a plate obtained by sticking copper to polyimide can be used.

Subsequently, the light receiving element 10 shown in FIG. 5, on the non-light receiving surface side of which the solder paste and the epoxy resin, which becomes the bonding layer, are applied in advance, is set on a hot plate heated to about 100° C. to 140° C. with the light receiving surface directed to the hot plate side (downward) (FIG. 9B). The element rear portion (the main body section) 32A is arranged to be superimposed on the element rear portion (the main body section) on the non-light receiving surface side of the light receiving element 10. The temperature of the hot plate is set to the temperature equal to or higher than a hardening temperature of a hardening material included in the epoxy resin and to temperature equal to or higher than a connection temperature of the electric connection body 21, specifically, the melting point of the solder. For example, when the electric connection body 21 is the tin/bismuth solder, the temperature can be set to about 140° C. to 200° C. In this case, the temperature is controlled not to exceed the heat decomposition temperature of epoxy. As the solder, solder including indium and silver other than tin and bismuth is used, and by this, the hardening temperature of the bonding layer 26 and the connection temperature of the electric connection body 21 can be balanced. While hardening of the epoxy resin is started by heat, the electric connection body 21 can be prevented from melting. In the case of connection by solder having higher temperature, polyimide or the like can be used as a bonding layer that can be hardened at higher temperature.

The element rear portion (the main body section) 32A of the inter-element connecting body 30 is pressurized toward the hot plate using a diaphragm, foaming silicone rubber, or the like while being heated by the hot plate, whereby the element rear portion (the main body section) 32A of the inter-element connecting body 30 is deformed by pressure and heat applied in the state shown in FIG. 7. In this case, these stampers have flexibility, so that a portion corresponding to the portion of the bonding layer 26 hardened to a certain degree recesses and a portion without the bonding layer 26 projects to the element side. As shown in FIG. 9C, the element rear portion (the main body section) 32A is insulated from the current collecting electrode 14 of the light receiving element rear surface through the bonding layer 26 and is connected to the linear electrode 12 and the current extraction electrode 13 through the electric connection body 21. In this heating process, it is more preferable to use a heating vacuum laminator.

If necessary, an electric characteristic of the light receiving element is evaluated in this state. Consequently, it is possible to evaluate electric characteristics including an effect of actual light reflection by the inter-element connecting body in the back of the electrode.

Further, the inter-element connecting body 30, on only the one surface of which the tin/bismuth solder is applied, that is, the element connecting body 30e (when a target is an element in the string row, the inter-element connecting body 30 is used) is arranged on the element rear portion (the main body section) 32A of the inter-element connecting body 30 of the light receiving element 10a. In this case, a bonding layer can be partially provided between the element connecting body 30e (or the outer side portion 32B) and the element rear portion (the main body section) 32A using a dispenser or the like. At the same time, the inter-element connecting section 31 of a new inter-element connecting body 30 is arranged to partially overlap the current extraction electrode 15 portion of the light receiving element 10a and heated by the hot plate (step S1, FIG. 12A). When the hot plate is heated, the outer side portion 32B of the inter-element connecting body 30 is pressurized toward the hot plate using a diaphragm, foaming silicone rubber, or the like, whereby the element rear portion (the main body section) 32A and the outer side portion 32B of the inter-element connecting body 30 are connected, the current extraction electrode 15 of the light receiving element 10a are connected, and the inter-element connecting section 31 of the inter-element connecting body 30 are connected. In the connection, the position of the materials of the light receiving element 10a and that of the inter-element connecting body 30 are prevented from deviating. The end of the element rear portion (the main body section) 32A and that of the outer side portion 32B of the inter-element connecting body are aligned not to directly come into contact with the electrodes on the outermost side of the current collecting electrode 14 of the light receiving element. Subsequently, the hot plate temperature is lowered to about 100° C.

The connection is sequentially performed in this way. The connection process can be divided into three. When another light receiving element to be connected is present (Yes at step S2), the processing returns to step S1. That is, the connection of the next light receiving element can be divided into a connection process 1 for connecting the next light receiving element 10 along the extending direction of the element string, a connection process 2 for connecting the next light receiving element 10 in a direction different from the extending direction of the element string, and a connection process 3 for connecting the light receiving element 10f at the other end of the light receiving element module 1. The respective connection processes are briefly explained with reference to an example in which six light receiving elements are connected in three sets and two rows.

Connection Process 1

Figure 12A:
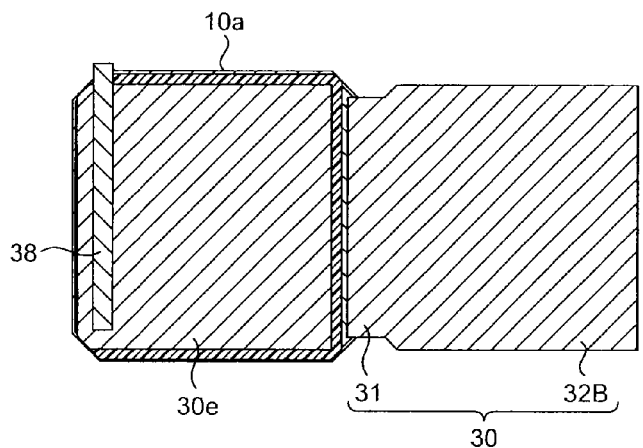
FIG. 12A is a process explanation diagram for explaining the mounting process of the light receiving element module in the first embodiment.
Figure 12B:
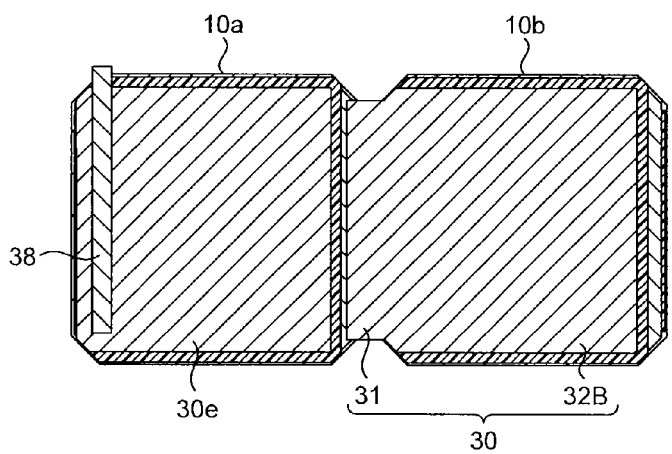
FIG. 12B is a process explanation diagram for explaining the mounting process of the light receiving element module in the first embodiment.
Figure 12C:
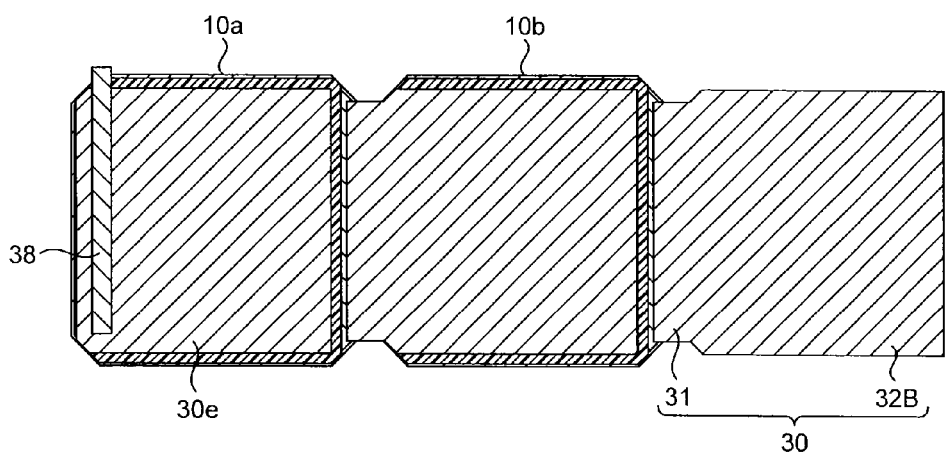
FIG. 12C is a process explanation diagram for explaining the mounting process of the light receiving element module in the first embodiment.

The connection process 1 is a process for connecting the next light receiving element 10 along the extending direction of the element string. The light receiving element 10b, to which the element rear portion (the main body section) 32A is connected in advance, is arrange on the hot plate. The inter-element connecting section 31 of the inter-element connecting body 30 connected to the current extraction electrode 15 of the light receiving element 10a is arranged to overlap the element rear portion (the main body section) 32A of the light receiving element 10b (FIG. 12B). The inter-element connecting section 31 of the new inter-element connecting body 30 is arranged on the current extraction electrode 15 of the light receiving element 10b (FIG. 12C, a state in which the processing returns to step S1). The light receiving element 10a is removed from the hot plate to leave only the light receiving element 10b portion on the hot plate. While downward pressure is applied to the outer side portion 32B of the inter-element connecting body 30 on the light receiving element 10b, the temperature of the hot plate is raised to about 140° C. to 200° C. again and, then, lowered to about 100° C. again, whereby the solder covering the one surface of the inter-element connecting body 30 is fused to the rear surface electrode of the element. The element rear portion (the main body section) 32A and the outer side portion 32B of the inter-element connecting body are connected by the electric connection body 33. The last light receiving element 10a is allowed to escape from the hot plate, whereby the solder of the light receiving element 10a is not removed even if the new light receiving element 10b is heated together with the hot plate. In this case, the light receiving element 10a can be cooled. In the above explanation, pressure is applied by rubber or the like under the atmospheric pressure. However, it is more desirable to use a heating vacuum laminator. The processing returns to step S2.

Further, when the string is extended, similarly, a new light receiving element 10c is prepared and the element rear portion (the main body section) 32A of the inter-element connecting body 30 at the string end is connected to the light receiving element 10c in the same manner (step S1). The light receiving element 10c is arranged on the hot plate with the light receiving surface directed to the hot plate side. The outer side portion 32B of the inter-element connecting body 30 at the string end connected to the light receiving element 10b is arranged on the linear electrode 12 and the current extraction electrode 13 of the light receiving element 10c. The inter-element connecting section 31 of a new inter-element connecting body 30 is arranged to overlap the current extraction electrode 15 (step S2). In this case, the element electrode of one polarity side is prevented from coming into contact with the element electrode of the other polarity side.

The light receiving elements 10a and 10b, to which the inter-element connecting body 30 is connected, are moved to the outside of a heating portion of the hot plate and the light receiving element 10c is heated and pressurized to be bonded and connected to the light receiving elements 10a and 10b (step S1). This process is repeated by a desired number of times, whereby a string row of the light receiving elements 10 can be formed.

Connection Process 2

Figure 13A:
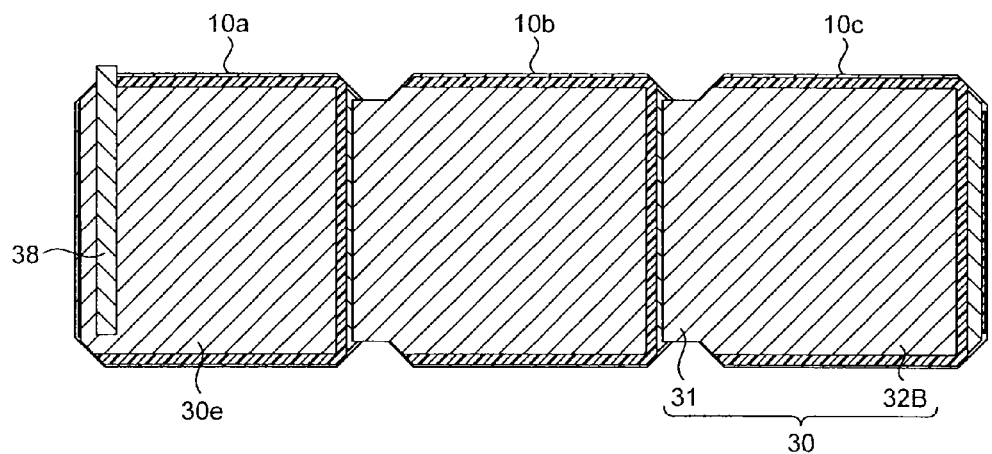
FIG. 13A is a process explanation diagram for explaining the mounting process of the light receiving element module in the first embodiment.
Figure 13B:
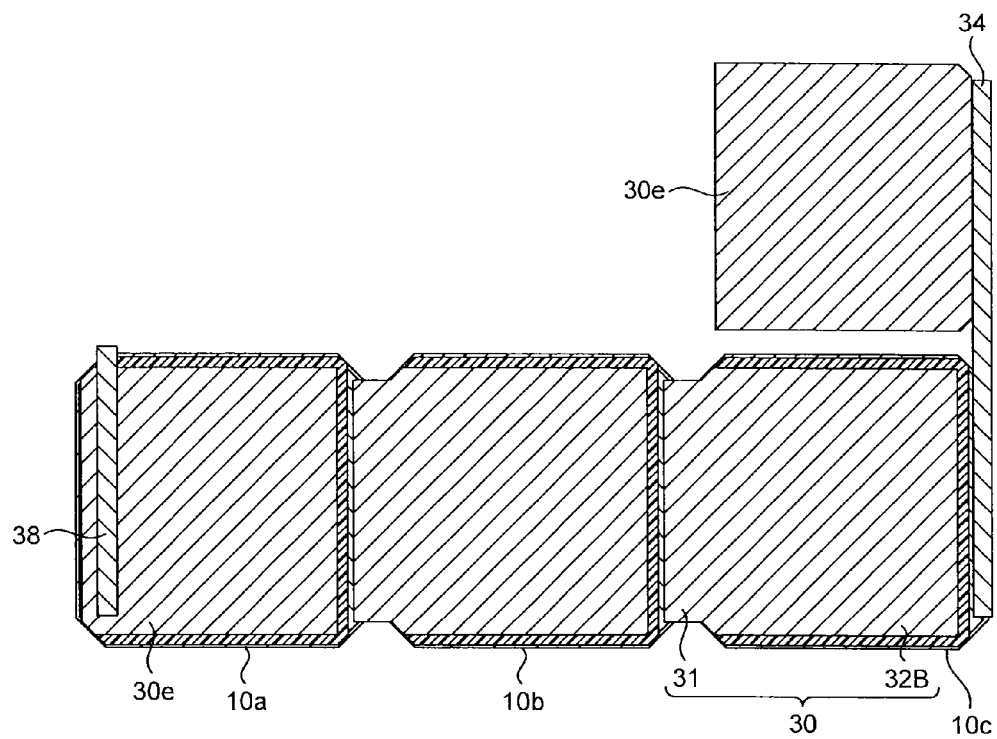
FIG. 13B is a process explanation diagram for explaining the mounting process of the light receiving element module in the first embodiment.

The connection process 2 is a process for connecting the light receiving element 10 in a direction different from the extending direction of the element string. In this case, at step S1, first, the light receiving element 10c at a turning-back point of the string is arranged below the inter-element connecting body 30 and arranged as shown in FIG. 13A. At this point, the light receiving element 10c and the inter-element connecting body 30 are not heated and bonded yet. Subsequently, the inter-string connecting body 34 coated with solder is arranged to overlap the current extraction electrode 15 on the substrate. In this case, the element connecting body 30e is connected to the inter-string connecting body 34 in advance as explained above. An element row is formed as shown in FIG. 13B.

The light receiving element 10c, the outer side portion 32B of the inter-element connecting body 30, and the inter-string connecting body 34 are pressurized and heated on the hot plate (step S1). Consequently, the light receiving elements 10c and 10b are connected by the inter-element connecting body 30. The current extraction electrode 15 on the light receiving element 10c and the element connecting body 30e are connected. The element connecting body 30e is connected in a state in which the string is folded back in the light receiving element 10c.

Thereafter, when the element is connected to extend the string, the element only has to be connected by the inter-element connecting body in the same procedure as the connection process 1. Specifically, the element connecting body 30e is arranged on the element rear portion (the main body section) 32A of the inter-element connecting body 30 of the light receiving element 10d. At the same time, the inter-element connecting section 31 of a new inter-element connecting body 30 is arranged to partially overlap the current extraction electrode 15 portion of the light receiving element 10d and heated by the hot plate (step S1). When the hot plate is heated, the outer side portion 32B of the inter-element connecting body 30 is pressurized toward the hot plate using a diaphragm, foaming silicone rubber, or the like, whereby the element rear portion (the main body section) 32A and the outer side portion 32B of the inter-element connecting body 30 are connected, and the current extraction electrode 15 of the light receiving element 10d and the inter-element connecting section 31 of the inter-element connecting body 30 are connected. In the connection, the position of each of the materials of the light receiving element 10d and the inter-element connecting body 30 should be arranged to be prevented from deviating. The end of the element rear portion (the main body section) 32A and that of the outer side portion 32B of the inter-element connecting body 30 are aligned not to directly come into contact with the electrode on the outermost side of the current collecting electrode 14 of the element. The hot plate temperature is lowered to about 100° C. The connection of one element is completed.

Connection Process 3

Figure 14A:
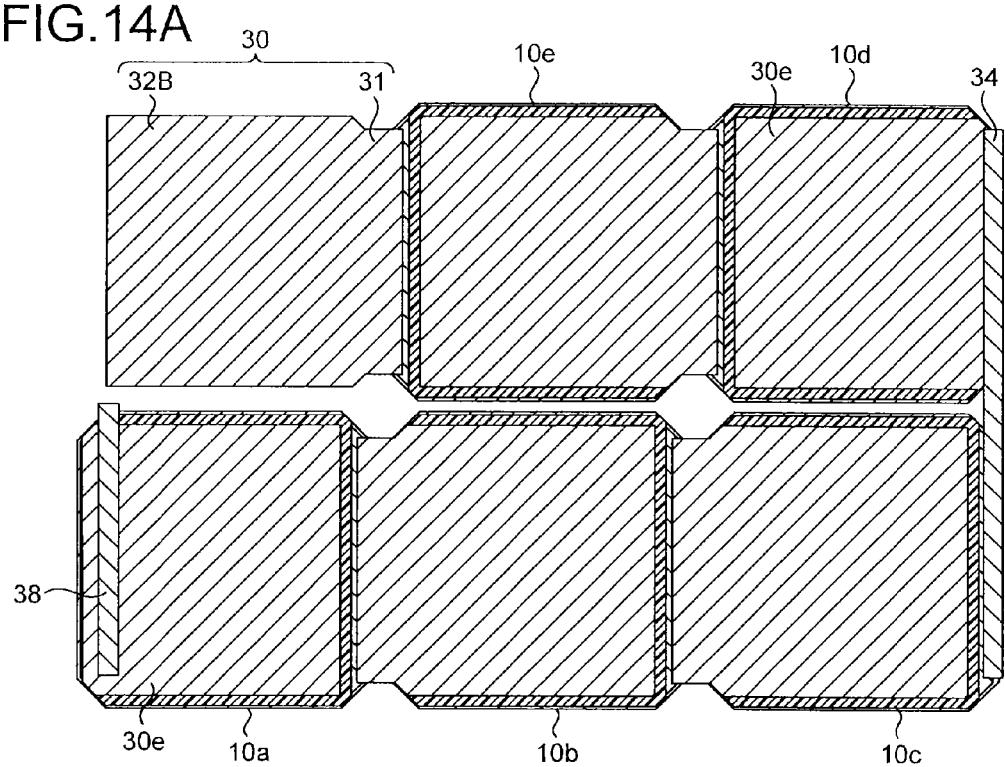
FIG. 14A is a process explanation diagram for explaining the mounting process of the light receiving element module in the first embodiment.
Figure 14B:
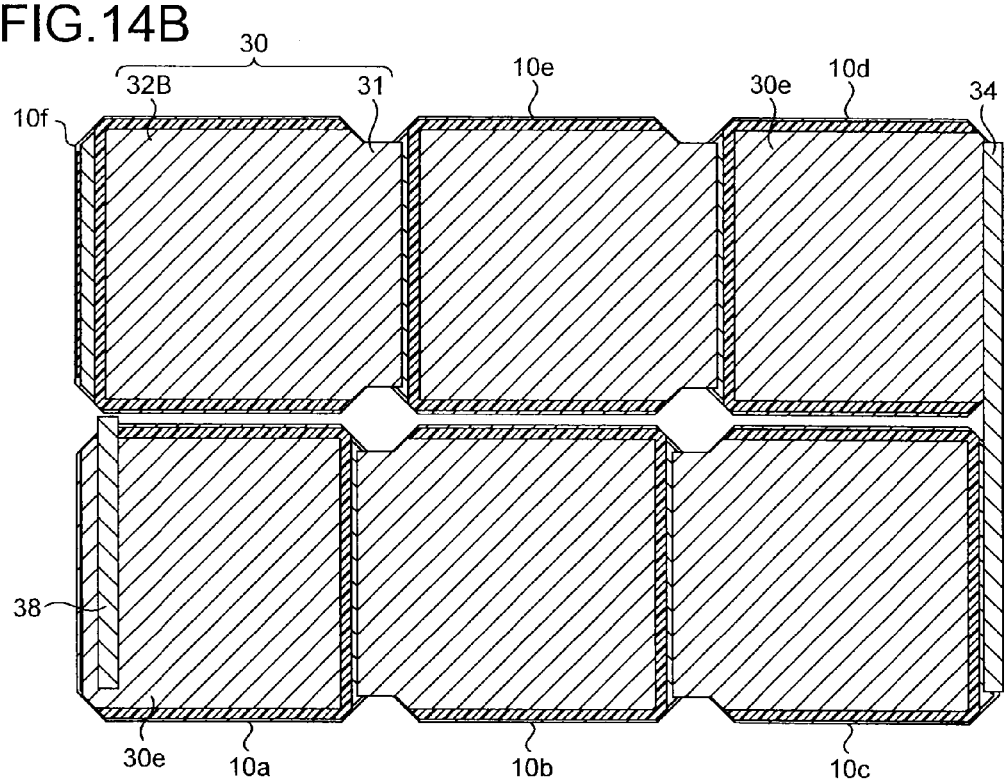
FIG. 14B is a process explanation diagram for explaining the mounting process of the light receiving element module in the first embodiment.

The connection process 3 is a process for connecting the light receiving element 10f at the other end of the light receiving element module 1. In this case, the light receiving element 10f, to which the element rear portion (the main body section) 32A of the element connecting body 30e is connected in advance, is arranged on the hot plate with the light receiving surface directed to the hot plate side. The outer side portion 32B of the inter-element connecting body 30 connected to the current extraction electrode 15 of the light receiving element 10e in advance shown in FIG. 14A is arranged to overlap the light receiving element 10f (FIG. 14B).

A new current draw-out line 38 is arranged on the current extraction electrode 15 of the light receiving element 10f to leave only the light receiving element 10f portion on the hot plate. While pressure to the hot plate side is applied to the outer side portion 32B of the inter-element connecting body 30 on the light receiving element 10f, the temperature of the hot plate is raised to about 140° C. to 200° C. (step S1), then, lowered to about 100° C. again, whereby the solder covering the one surface of the inter-element connecting body 30 and the current draw-out line 38 is fused to the current extraction electrode 15 of the light receiving element 10f. The element rear portion (the main body section) 32A of the inter-element connecting body 30 and the outer side portion 32B are connected by the electric connection body 33. The current draw-out line 38 and the current extraction electrode 15 of the light receiving element 10f are connected by the electric connection body 33. The light receiving elements other than the light receiving element 10f are allowed to escape from the hot plate, whereby the solder of the other light receiving elements is not re-melted and removed even if the light receiving element 10f is heated together with the hot plate. In the above explanation, pressure is applied by rubber or the like under the atmospheric pressure. However, it is more desirable to use a heating vacuum laminator.

The steps explained above are repeatedly executed while being combined. When no other light receiving element to be connected is present at step S2 in FIG. 11 (No at step S2), the light receiving element array shown in FIGS. 1 and 2 is obtained.

The method of forming the light receiving element module by connecting the light receiving elements from the light receiving element 10a to the light receiving element 10f is explained above. However, the light receiving elements can be connected conversely from the light receiving element 10f to the light receiving element 10a. That is, the outer side portion 32B of the inter-element connecting body 30 is connected to the element and, then, the inter-element connecting section 31 of the inter-element connecting body 30 and the current extraction electrode 15 on the light receiving element adjacent to the light receiving element are connected. In the above explanation, the light receiving element 10 is connected with the light receiving surface side directed to the hot plate side. However, the light receiving element 10 can be connected to the inter-element connecting body 30 with the rear surface of the light receiving element directed to the hot plate side.

Thereafter, a laminated body is configured in which, on the front surface side of a light receiving element array configured by two rows of strings, the sealing material 22 such as sheet-like ethylene vinyl acetate resin having a size slightly larger than the light receiving element array and the front surface side main face material 23 such as glass are arranged and, on the rear surface side, the rear surface side main face material 25 (the back sheet) formed by the sealing material 22 such as sheet-like ethylene vinyl acetate resin having size slightly larger than the size of the light receiving element array, a sheet obtained by sticking together weather resistant polyethylene terephthalate resin and aluminum, and the like is arranged. The laminated body is heated for about 20 minutes at temperature of 100° C. to 150° C. under decompression by a heating vacuum laminator, whereby the light receiving element array is sealed by the front surface side main face material 23 and the rear surface side main face material 25 (step S3).

In this case, holes are opened in the rear surface side main face material 25 and the sealing material 22 on the rear surface side. The two current draw-out lines 38 of the light receiving element module 1 are sealed in a state in which the current draw-out lines 38 are drawn out from the portions of the holes formed on the rear side of the light receiving element array. The current draw-out lines 38 can be drawn out from the hole portions of the rear surface side main face material 25. The current draw-out lines 38 are connected to the lead wires in the junction box and drawn out to the outside of the light receiving element module 1 through the cable connected to the junction box.

Thereafter, the frame is bonded to the end of the sealed tabular light receiving element array and the junction box is bonded to the current draw-out line 38 portion by silicone resin or the like (step S4). In this way, the light receiving element module 1 shown in FIGS. 1 and 2 can be obtained.

As explained above, in the light receiving element module 1 according to the first embodiment, the patterns of the element electrodes of the light receiving element take the usual configuration and formed on the same surface at the same thickness. The inter-element connecting body 30 is electrically connected to the first electrode, which is the negative electrode, in the element rear portion (the main body section) 32A and is insulated from the second electrode, which is a positive electrode, by the bonding layer 26, which is an insulating layer. Therefore, the current collection in the negative electrode is performed through not only the linear electrode 12 but also the inter-element connecting body 30 that is in surface contact right above the linear electrode 12. Therefore, compared with performing the current collection through only the linear electrode 12, it is possible to greatly reduce current collection resistance and improve the photoelectric conversion efficiency compared with the relate art. Consequently, it is possible to use a module having larger element size as the module, and it is also made possible to obtain a light receiving element module excellent in the photoelectric conversion efficiency. The same holds true concerning heat resistance for heat radiation from the element. In the first embodiment, it is made possible to keep an element temperature low. As a result, it is possible to obtain the light receiving element module 1 excellent in the photoelectric conversion efficiency.

In the light receiving element module 1 according to the first embodiment, the bonding layer 26, which is an insulating layer, is formed on the second electrode (the current collecting electrode 14 and the current extraction electrode 15), which configure one element electrode, in advance. Consequently, it is possible to connect the copper foil to only the first electrode (the linear electrode 12 and the current extraction electrode 13), which configure the other element electrode, without performing highly accurate alignment during modularization. Consequently, it is unnecessary to perform fine adjustment between the inter-element connecting body 30 and the light receiving element 10, which needs to be performed in the conventional light receiving element module. It is possible to narrow the electrode pitch of the element electrodes without depending on alignment accuracy. Therefore, the light receiving element module has small internal resistance, has high carrier collection efficiency, and is excellent in the photoelectric conversion efficiency, and it is also made possible to manufacture a light receiving element module having a narrower electrode pitch.

The light receiving element module 1 according to the first embodiment includes, on the element back, the copper foil (the element rear portion (the main body section) 32A of the inter-element connecting body 30) having a small light absorption coefficient of the silicon substrate and having high reflectance to light having a part of wavelengths to be transmitted (FIG. 9C). Only the bonding layer 26 having high translucency is present between the light receiving element 10 and the element rear portion (the main body section) 32A of the inter-element connecting body 30. Therefore, even if light having a wavelength of about 800 to 1300 nm is transmitted to the rear surface, it is possible to make the light incident on the element again with the element rear portion (the main body section) 32A of the inter-element connecting body 30. Therefore, a loss of light decreases, and thus it is made possible to obtain a light receiving element module excellent in the photoelectric conversion efficiency.

The element electrode portion of the light receiving element module 1 according to the first embodiment can be covered with metal (the inter-element connecting body 30) and the sealing material 22. Therefore, it is possible to reduce moisture that reaches from the ambient environment of the light receiving element to the element electrode portion. Therefore, it is possible to prevent a short circuit between the positive and negative electrodes due to migration of the element electrode metal and an increase in resistance due to electrochemical reaction. The light receiving element module is excellent in the photoelectric conversion efficiency. This is particularly important in the case of a light receiving element having a small inter-element distance between a positive electrode and a negative electrode and having high photoelectric conversion efficiency.

In the light receiving element module 1 according to the first embodiment, the inter-element connecting body connected to one electrode covers the entire element rear surface. Therefore, light transmitted through the element is reflected on the electrode and made incident on the element again. A transmission loss of the light is reduced. Moreover, compared with the structure in which the element electrode covers the entire element rear surface, it is possible to easily increase the thickness of the inter-element connecting body. Therefore, it is possible to greatly reduce conductive resistance in the element compared with the element including only the element electrodes. As a result, current collection resistance with respect to a light reception current is reduced. It is possible to reduce a power loss due to resistance.

Current collection is not performed by only the element electrodes but is performed by the inter-element connecting body. Therefore, unlike an element on which thick-film electrodes are formed, the element does not bend or a crack or peeling due to film reaction to the element electrodes does not occur.

In a light receiving element used outdoors, it is likely that moisture intrudes into resin because of high humidity of the outdoor air and corrosion of metal electrodes due to electrochemical reaction is caused. However, in this embodiment, it is possible to suppress intrusion of moisture with the inter-element connecting body 30 and the sealing material 22.

In the first embodiment, to connect the inter-element connecting body to the element in performing modularization, the inter-element connecting body only has to be bonded to fit the rear surface of the light receiving element. Highly accurate alignment is unnecessary. As a result, it is possible to improve alignment accuracy. By the way, when the boning layer 26 is formed, the alignment is performed. However, in performing the alignment, it is sufficient to completely cover one electrode and expose a part of the other electrode. Therefore, the alignment does not need to be highly accurate.

In the light receiving element module 1 according to the first embodiment, the flat inter-element connecting body 30 shown in FIGS. 6 and 8A to 8D is connected to the positive electrodes of the light receiving element 10 and, on the other hand, insulated from the negative electrodes by the bonding layer 26. Therefore, it is unnecessary to perform the alignment between the elements performed in the related art. In the method of the first embodiment, in each of the light receiving elements 10, the connection of each of the portions therein can be connected per each light receiving element, and thereafter they can be collected as one module. Therefore, productivity is high. Further, when positional deviation occurs, the element in which the positional deviation occurs only has to be arranged again. Therefore, workability is high.

Still further in this embodiment, an electric current is carried by the inter-element connecting body. Therefore, unlike the carrying of an electric current by the element electrodes, the requirements such as metal having high light reflectivity, an increase in thickness for improvement of lateral direction conductivity, securing soldering properties for modularization, and high adhesion to the element rear surface are all unnecessary. When copper is used, for example, formation of barrier metal for preventing, when the copper is directly touched, the copper from diffusing in silicon and deteriorating the photoelectric conversion characteristic of the element.

In the first embodiment, the rear surface side electrodes contributing to current collection in the element can be realized by the inter-element connecting body. The function of the rear surface reflecting film for reflecting light transmitted through the element can be imparted to the inter-element connecting body. Therefore, it is possible to form, with a smaller number of processes, the inter-element connecting body that connects the elements. It is possible to manufacture, with a smaller number of steps, a light receiving element module excellent in the photoelectric conversion efficiency.

The connection of the first electrode, which is an element electrode on the light receiving element, and the inter-element connecting body can be realized by directly bringing the inter-element connecting body into contact with the first electrode. Therefore, a current carrying distance on the element is extremely short. A resistance loss is small. It is possible to obtain a light receiving element excellent in the photoelectric conversion efficiency.

When the inter-element connecting body 30, which is such a reflector, is present on the element rear surface, a photocurrent amount changes according to a gain obtained when light transmitted between the linear electrode 12 and the current collecting electrode 14, which are the element electrodes, is reflected by the inter-element connecting body 30. In the first embodiment, the inter-element connecting body 30 is connected to the element and, then, a photocurrent amount is evaluated. The light receiving elements having the same photocurrent amount can be combined to form a module. Therefore, it is possible to cause generated current value of each of the light receiving elements to substantially coincide with one another. As a result, the light receiving element 10 having an extremely low generated current value compared with the other light receiving elements 10 is not present in the string. Therefore, it is possible to improve the power generation efficiency of the light receiving element module 1 compared with the related art. Therefore, unlike the related art, it is possible to eliminate a situation in which electric currents do not coincide with one another among the light receiving elements.

In the first embodiment, as the light receiving element, the hetero junction solar battery in which the amorphous silicon layer is formed on the single crystal silicon substrate is explained as an example. However, the light receiving element module can be applied to all light receiving elements such as a diffusion-type solar battery in addition to hetero junction solar batteries in which other semiconductor thin film layers such as microcrystalline amorphous silicon and microcrystalline silicon carbide are formed.

In the first embodiment, the solar battery for not condensing light is explained. However, the light receiving element module can be used for a solar battery for condensing light. In that case, the size of the element is reduced and an interval between the elements is increased. As the light receiving surface material, a light transmitting member having a lens function can be used for each of the elements rather than flat sheet glass. However, a basic structure is the same as the structure in the first embodiment.

The light receiving element module does not include electrodes on the light receiving surface side. Therefore, the external appearance of the light receiving element module can be uniform. Design properties of the light receiving element module are high. The light receiving element module can also be applied to a power supply for a clock, a light reception sensor such as a light amount sensor, and the like.

Second Embodiment

Figure 15:
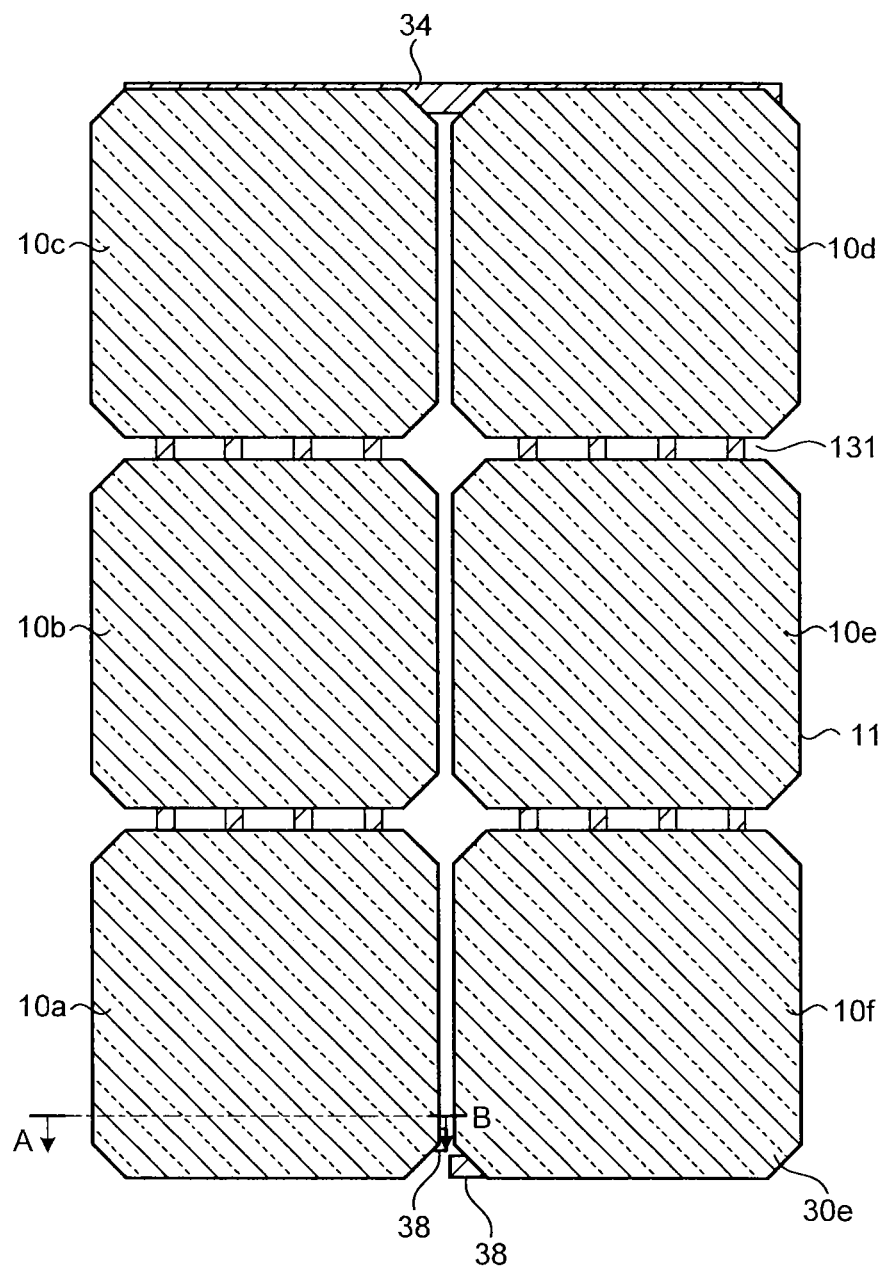
FIG. 15 is a plan view of a light receiving element module according to a second embodiment viewed from a light receiving surface side.
Figure 16A:
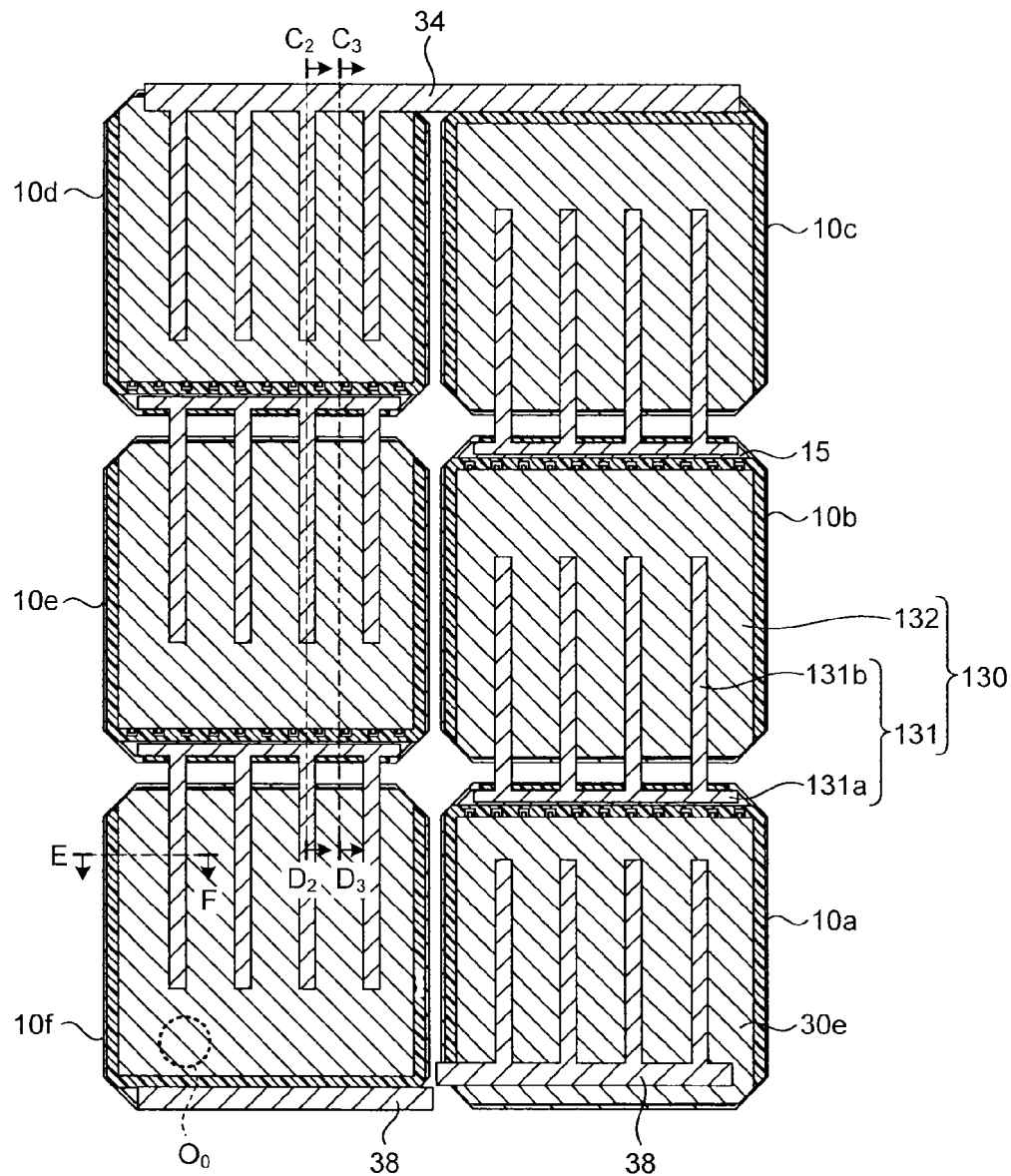
FIG. 16A is a plan view of the light receiving element module according to the second embodiment viewed from a rear surface side.

In the first embodiment, the element is connected using the inter-element connecting body 30 in which the inter-element connecting section 31 and the main body section 32 connected to the rear surface of the element are integral. In a light receiving element module in a second embodiment, as the inter-element connecting body 30, as shown in FIGS. 15 and 16A, a separate-type inter-element connecting body 130 configured by a main body section 132 and a finger-like inter-element connecting section 131 superimposed on the main body section 132 is used. In the inter-element connecting body 130 in the second embodiment, the main body section 132 is formed in a single-layer structure. The inter-element connecting section 131 is formed in a finger shape including a finger base section 131*a* and fingers 131*b*. The rear surface side of the main body section 132 is supported by the fingers 131*b*.

Figure 16B:
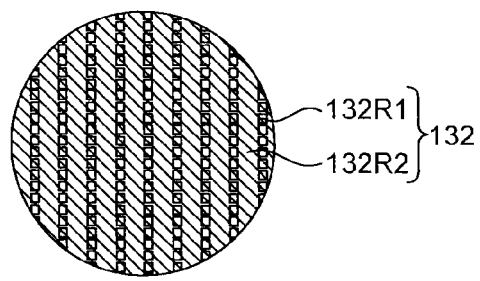
FIG. 16B is a main part enlarged plan view of the light receiving element module according to the second embodiment viewed from the rear surface side.
Figure 18:
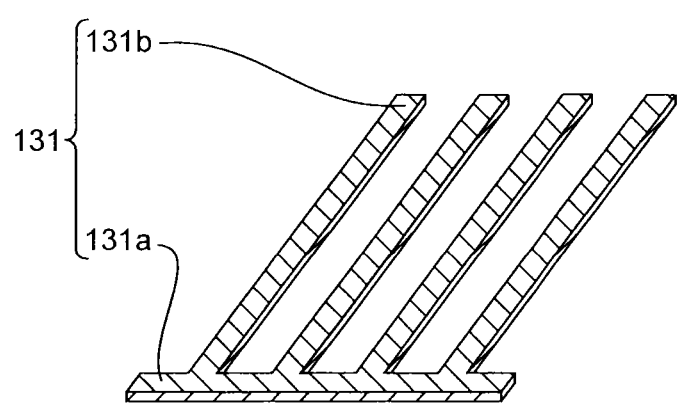
FIG. 18 is a perspective view of a connecting section of the inter-element connecting body used in the second embodiment.
Figure 19A:
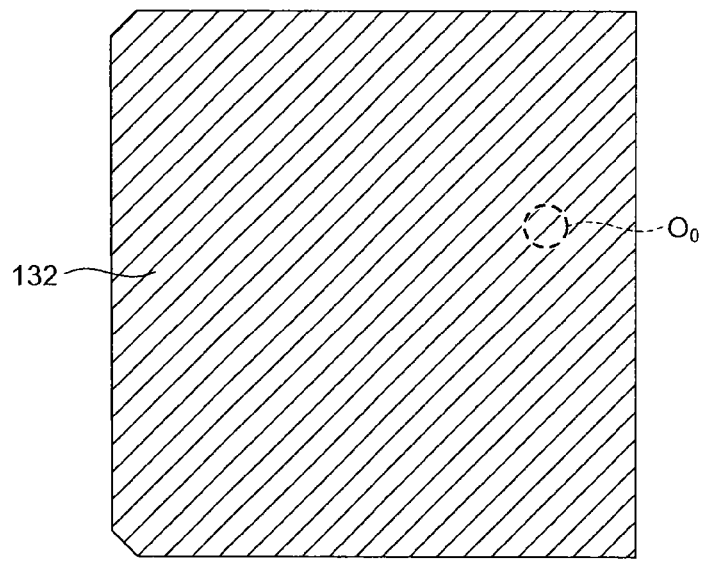
FIG. 19A a plan view of a main body section of the inter-element connecting body used in the second embodiment.
Figure 19B:
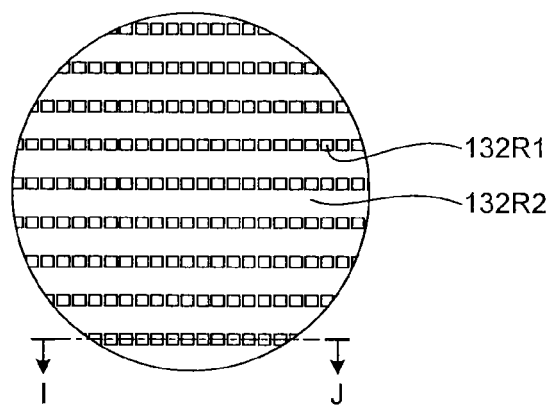
FIG. 19B is a main part enlarged plan view of the main body section of the inter-element connecting body used in the second embodiment.
Figure 19C:
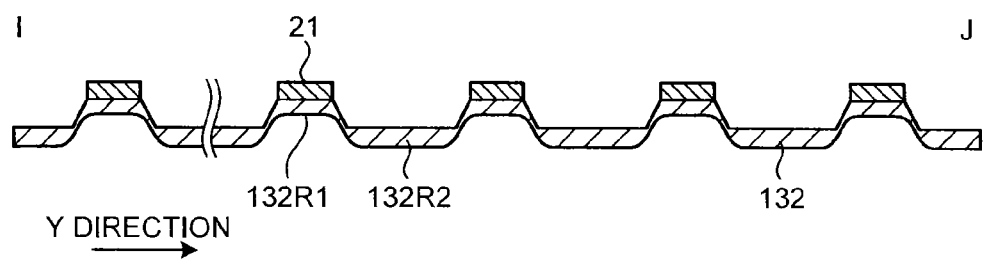
FIG. 19C is a main part enlarged sectional view of the main body section of the inter-element connecting body used in the second embodiment.
Figure 20A:
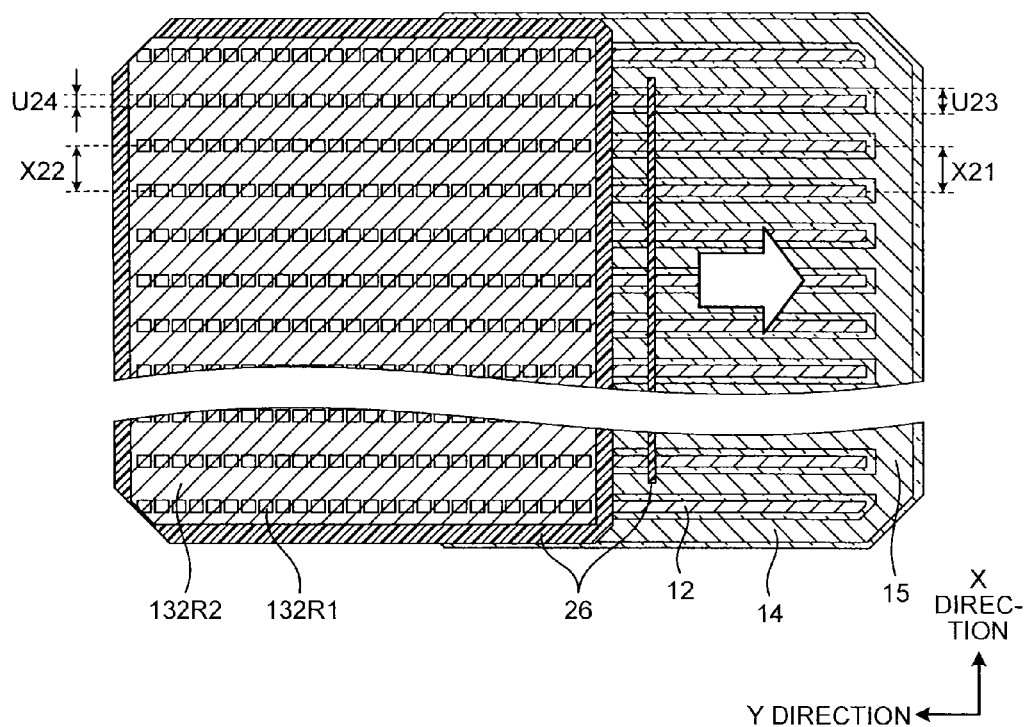
FIG. 20A is a plan view of a positional relation between a light receiving element of a back connection type and the main body section of the inter-element connecting body used in the second embodiment.
Figure 20B:
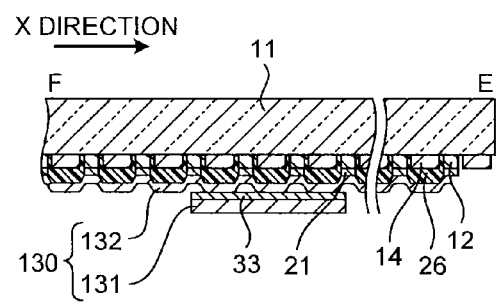
FIG. 20B is a sectional view of the configuration of the light receiving element and the inter-element connecting body and is an E-F sectional view of FIG. 16A.
Figure 21A:
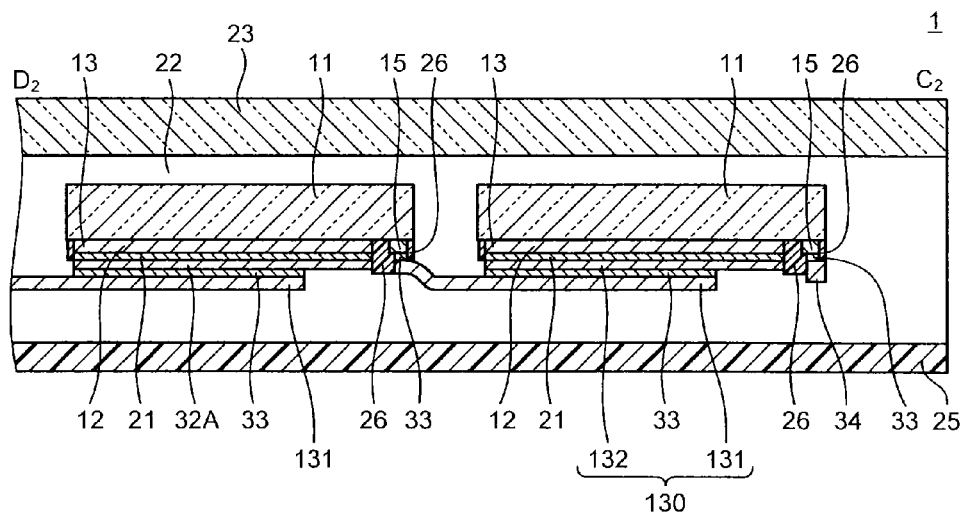
FIG. 21A is a sectional view of the configuration of the light receiving element module in the second embodiment and is a $C_2$-$D_2$ sectional view of FIG. 16A.
Figure 21B:
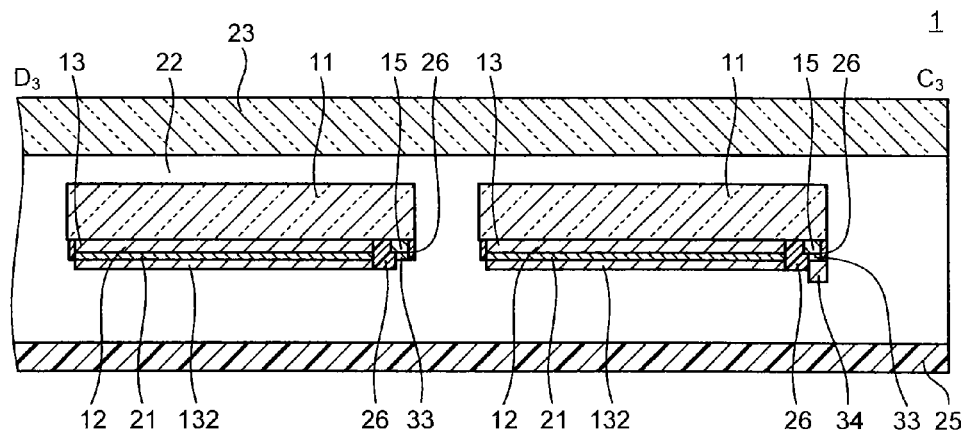
FIG. 21B is a sectional view of the configuration of the light receiving element module in the second embodiment and is a $C_3$-$D_3$ sectional view of FIG. 16A.

FIG. 15 is a plan view of the light receiving element module according to the second embodiment viewed from a light receiving surface side. FIG. 16A is a plan view of the light receiving element module according to the second embodiment viewed from a rear surface side. FIG. 16B is an enlarged plan view of an $O_0$ portion of FIG. 16A. FIG. 17 is a schematic perspective view of a positional relation between a light receiving element and an inter-element connecting body configuring the light receiving element module in the second embodiment and is a diagram of a state in which an element and the light receiving element connected to the inter-element connecting body are viewed from the rear surface side before the inter-element connecting body is connected. FIG. 18 is a perspective view of an inter-element connecting section. FIG. 19A is a plan view of the inter-element connecting section used in the second embodiment. FIG. 19B is a main part enlarged plan view of FIG. 19A. FIG. 19C is an I-J sectional view of FIG. 19B. FIG. 20A is a plan view of an example of a positional relation between a light receiving element and a main body section of the inter-element connecting body (in particular, a bonding layer) in the second embodiment. FIG. 20B is a diagram equivalent to an X-direction cross section of FIG. 20A and is a diagram of a state in which the inter-element connecting section is mounted. That is, FIG. 20B is equivalent to an E-F sectional view of FIG. 16A. FIGS. 21A and 21B are sectional views of the light receiving element module in the second embodiment and are a $C_2$-$D_2$ sectional view and a $C_3$-$D_3$ sectional view of FIG. 16A. In this embodiment as well, for clearness, an element sealing material, a frame, and a junction box are not shown in FIGS. 15, 16, 20A, and 21A and 21B and a module main face material used for a light receiving surface and a rear surface are not shown in FIGS. 15 and 16.

As shown in FIG. 17, the inter-element connecting body 130 in this embodiment is configured by the main body section 132 and the finger-like inter-element connecting section 131 connected to the main body section 132. The main body section 132 is formed in a one-layer structure and includes convex sections 132R1 and concave sections 132R2. A light receiving element including the inter-element connecting body 130 includes a substrate formed in a pseudo square of about 156 mm square. As element electrodes of the light receiving element, in the second embodiment, both two electrodes are grid-like current collecting electrodes as in the first embodiment. The element electrodes can have other shapes. For example, the element electrode of one polarity side can be an electrode in which a plurality of dot-like electrodes are formed in rows separated from one another as in a light receiving element in a third embodiment explained below.

In general, from a viewpoint of improving photoelectric conversion efficiency in the light receiving element, the width of the current collecting electrodes is desirably narrower than the diffusing length of a small number of carriers in an element substrate. Therefore, the width of the current collecting electrodes is equal to or smaller than about 2 millimeters. However, in FIG. 20A, to clearly show a position in an X direction of the inter-element connecting body with respect to the element substrate, the electrode width in the X direction is shown large and the number of the current collecting electrodes with respect to the element substrate is shown small. In FIG. 20A, the number of the element electrodes formed on the substrate is reduced for clearness. Therefore, the width of the element electrodes is shown large with respect to the size of the element substrate. Accordingly, the convex sections 132R1 and the concave sections 132R2 formed in the element rear portion (a main body section) 132 of the inter-element connecting body 130 are also shown large. The positions of substrate upper electrodes of the light receiving element 10 and the positions in a Y direction of the convex sections 132R1 formed in the main body section 132, which is an element rear portion of the inter-element connecting body 130, coincide with each other. The main body section 132 of the inter-element connecting body and the linear electrode 12 formed on the substrate are in contact with each other in the convex sections 132R1. On the other hand, the bonding layer 26 is formed to mainly cover the current collecting electrode 14 substantially in the same manner as the bonding layer 26 shown in FIG. 5 in the first embodiment. Therefore, the current collecting electrode 14, which configures the other electrode of the element electrodes formed on the substrate, and the main body section 132 of the inter-element connecting body 130 are electrically insulated from each other.

As shown in FIG. 20A, the convex sections 132R1 of the inter-element connecting body 130 is connected while being aligned with the light receiving element 10 such that the convex sections 132R1 is aligned with the linear electrode 12 configuring one polarity on the light receiving element 10. In the inter-element connecting body 130 in the second embodiment, the width in the X direction of the formed convex section 132R1 is formed small compared with the interval between the current collecting electrode 14 adjacent to each other having one polarity formed on the light receiving element substrate as shown in FIG. 20A (U23>U24). X21 indicates a pitch of the linear electrode 12 and X22 indicates a pitch of the convex sections 132R1. The convex sections 132R1 of the inter-element connecting body 130 project to the direction of the element electrodes. The linear electrode 12 on the element and the convex sections 132R1 are connected. The convex sections 132R1 are located among the current collecting electrode 14. When shown as a sectional view taken along a surface parallel to the X direction, a layer structure among the inter-element connecting body 130, the bonding layer 26, and the element electrodes formed on the substrate is as shown in FIG. 19.

In FIGS. 20A and 20B, the bonding layer 26 is also formed in the outer peripheral section of the current collecting electrode 14. Such an inter-element connecting body 130 can be formed by a copper foil, and the thickness thereof can be set to 20 to 50 micrometers. Silver/tin solder or the like can be used as the electric connection body 33. A sectional view of the inter-element connecting body for forming such a light receiving element with an inter-element connecting body is shown in FIG. 19C. In the inter-element connecting body shown in FIG. 19C, metal having high solderability such as tin is formed over substantially the entire region of the convex sections 132R1 by plating as a connection region to the light receiving element. Further, the electric connection body 21 can be formed in a connection region to the element electrodes by immersing the convex sections 132R1 in a melted solder bath. As in light receiving element modules in third and fifth embodiments explained below, the light receiving element side can be immersed in the melted solder bath to form the electric connection body 21 on the element electrodes.

The structure and a manufacturing process of the light receiving element are the same as those in the first embodiment. A manufacturing process of the light receiving element module is also the same as that in the first embodiment. The manufacturing process is as shown in a $C_2$-$D_2$ sectional view and a $C_3$-$D_3$ sectional view of FIG. 16A in FIGS. 21A and 21B. FIG. 21A is a cross section on which the finger-like inter-element connecting section 131 is present. FIG. 21B is a cross section on which the finger-like inter-element connecting section 131 is absent. As in the first embodiment, the sheet-like sealing material 22 is arranged on the front surface side and the rear surface side of a light receiving element array including two rows of strings. The front surface side main face material 23 is boned to the front surface (the light receiving surface) side. The rear surface side main face material 25 is bonded to the rear surface side.

The structure held between the light receiving surface side main face material 23 and the rear surface side main face material 25 is supported by a frame made of metal or the like. The current draw-out line 38 is drawn out to the rear surface from a gap between the sealing material 22 and the rear surface side main face material 25 via the connection box. Consequently, the light receiving element module 1 is configured.

The light receiving surface side and the rear surface side of the formed element string are sealed by the sealing materials and the main face materials in this way. Consequently, it is possible to obtain a light receiving element module structure.

In the structure of the inter-element connecting body, the light receiving element with the inter-element connecting body, and the light receiving element module in the second embodiment, because the main body section 132 of the inter-element connecting body 130 has regular surface roughness, an area ratio occupied by the convex sections 132R1 on the main body section 132 is small. Therefore, it is possible to reduce an overlapping area between the convex sections on the inter-element connecting body 130 and the current collecting electrode 14 on the element in the other polarity. Therefore, it is possible to improve insulation property and increase a ratio of copper, which has a high infrared ray reflection ratio, exposed to the surface. It is possible to increase a light reflection amount to the substrate on the rear surface side of the light receiving element 10 and improve the photoelectric conversion efficiency of the light receiving element 10. With the presence of the surface unevenness, it is possible to prevent a connection failure due to slight bend or deformation. Because absorption of thermal distortion is high, it is possible to prevent the inter-element connecting body 130 from peeling from the light receiving element and being deformed.

The shapes of the main body section 132 and the inter-element connecting section 131 of the inter-element connecting body 130 are not limited to the shapes explained above. Not all of the convex sections 132R1 formed on the inter-element connecting body 130 do not have to be present among the current collecting electrode 14 as long as the main body section 132 of the inter-element connecting body 130 is not in contact with the current collecting electrode 14 and the current extraction electrode 15 configuring the other polarity on the light receiving element 10. For example, an unevenness row can be formed in the inter-element connecting body 130 to be oblique to the sides of the light receiving element 10. In that case, convex sections are not parallel to the linear electrode 12 on the element. Therefore, a part of the convex sections 132R1 can overlap the current collecting electrode 14 or the like.

In the inter-element connecting body 130 in the second embodiment, the main body section 132 is formed in the single-layer structure. The inter-element connecting section 131 is formed in a finger shape including the finger base section 131a and the finger 131b. The rear surface side of the main body section 132 is supported by the fingers 131b. From another viewpoint, a part of the main body section 132 is formed in a two-layer structure by the fingers 131b and has an effect of reinforcement and a reduction in energization resistance.

Third Embodiment

Figure 22:
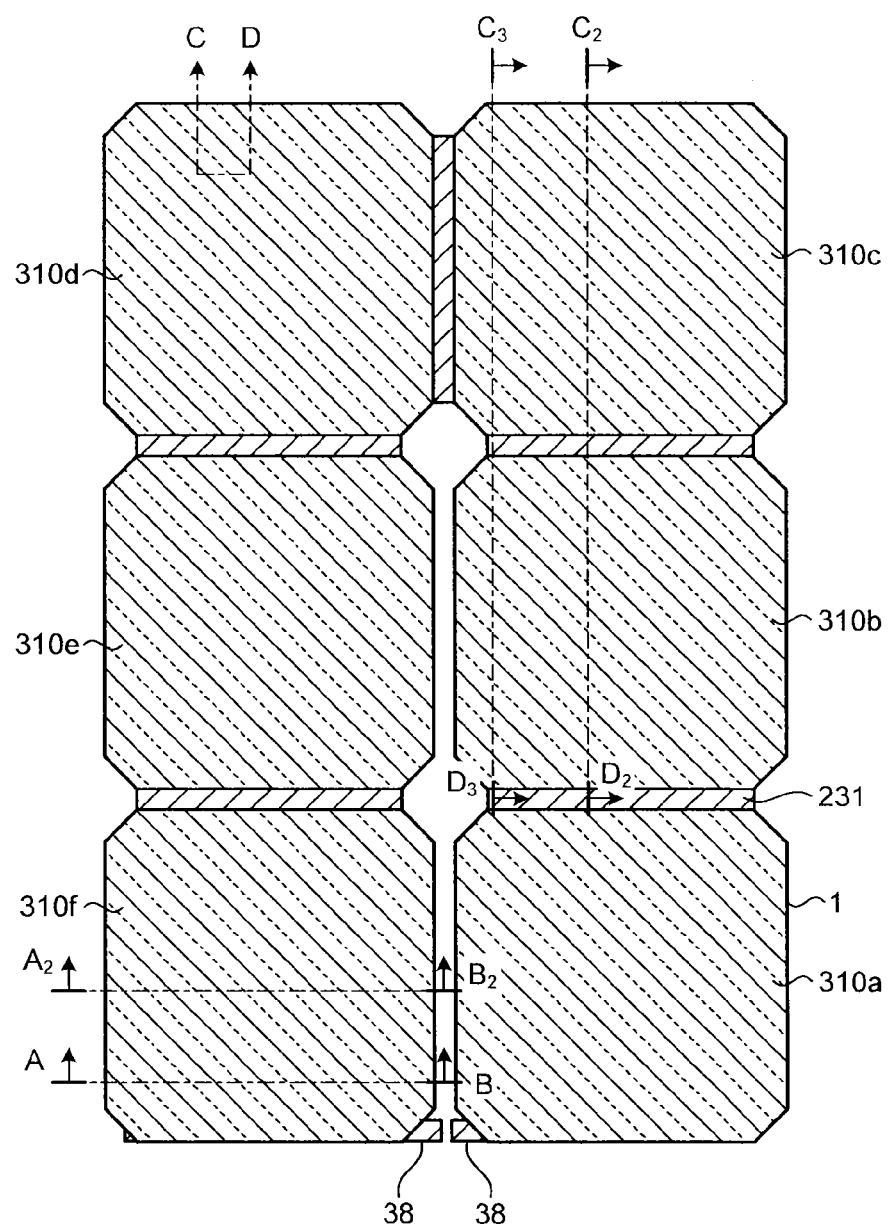
FIG. 22 is a plan view of a light receiving element module according to a third embodiment viewed from a light receiving surface side.
Figure 23:
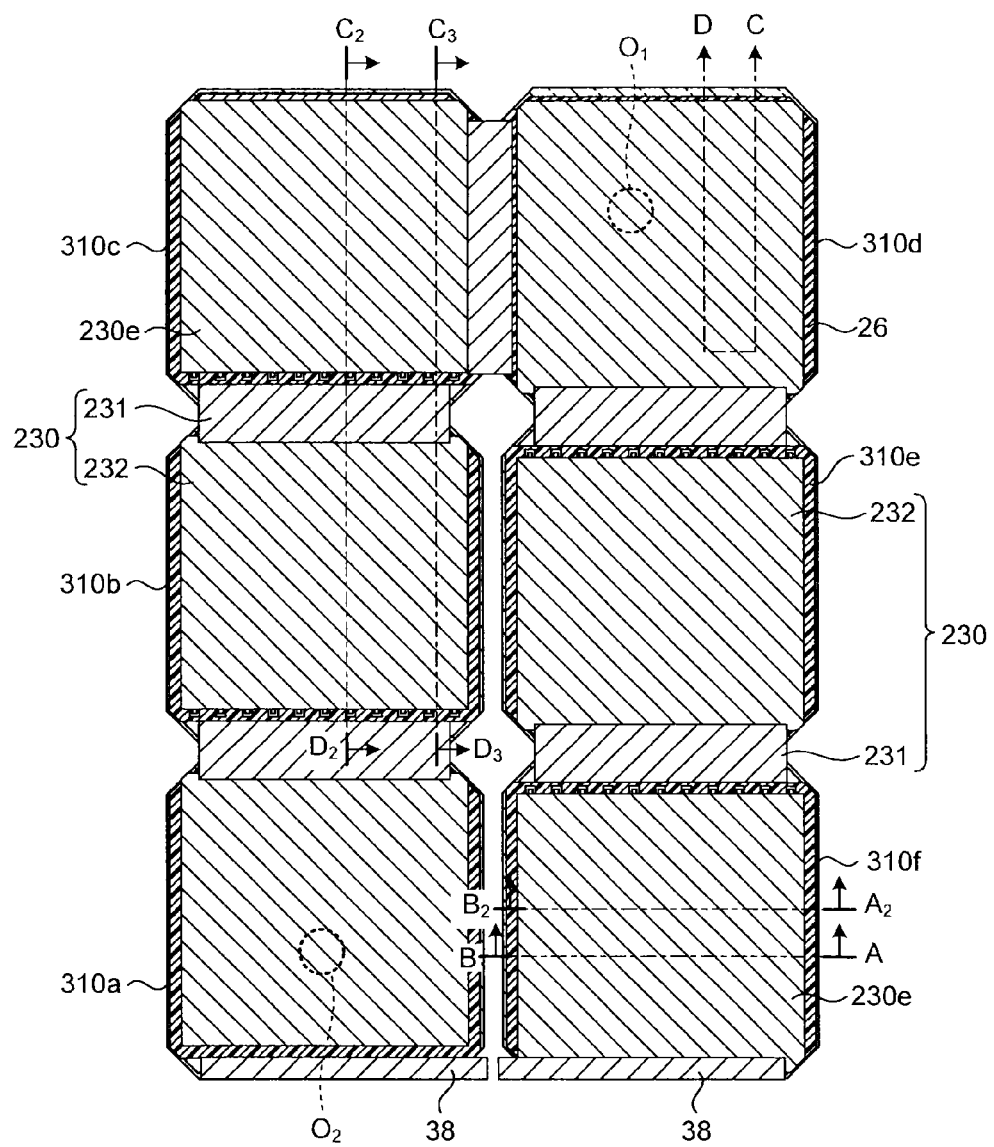
FIG. 23 is a plan view of the light receiving element module according to the third embodiment viewed from a rear surface side.
Figure 24A:
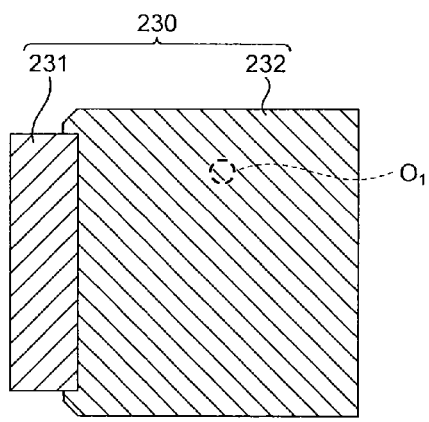
FIG. 24A is a diagram of an inter-element connecting body of the light receiving element module according to the third embodiment.
Figure 24B:
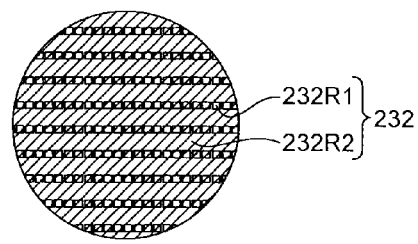
FIG. 24B is an enlarged view of an $O_1$ portion of FIGS. 23 and 24A.
Figure 24C:
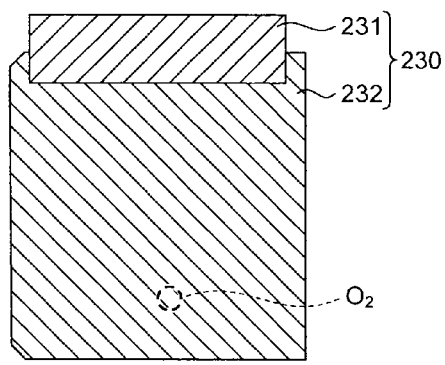
FIG. 24C is a diagram of the inter-element connecting body in a turning-back section of a string of the light receiving element module according to the third embodiment.
Figure 24D:
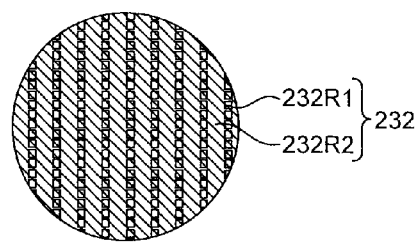
FIG. 24D is an enlarged view of an $O_2$ portion of FIGS. 23 and 24C.
Figure 24E:
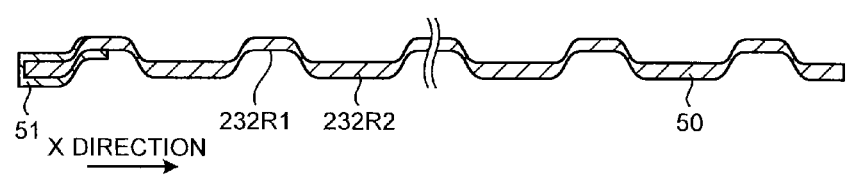
FIG. 24E is a sectional view of FIGS. 24A and 24C.
Figure 25A:
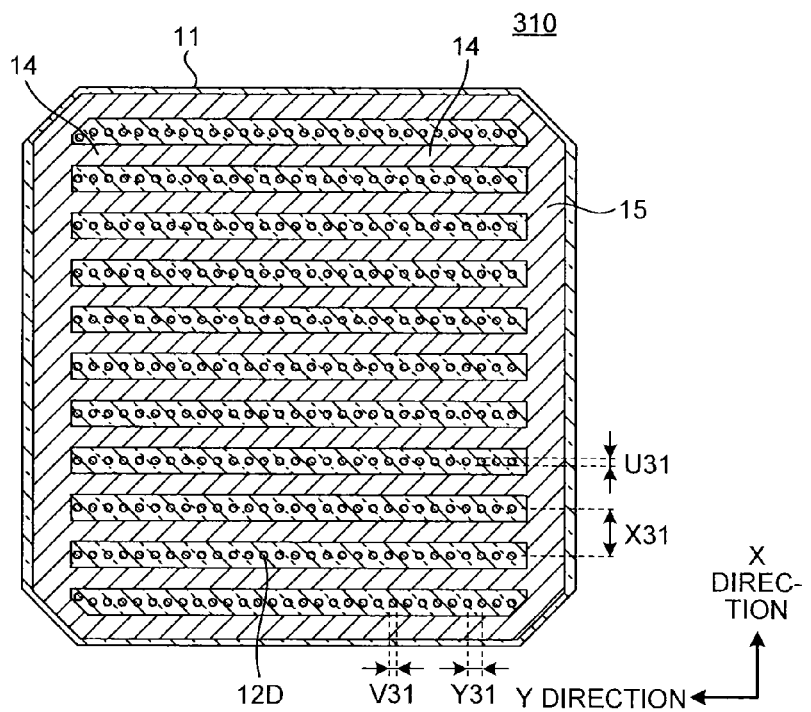
FIG. 25A is a plan view of a light receiving element used in the third embodiment.
Figure 25B:
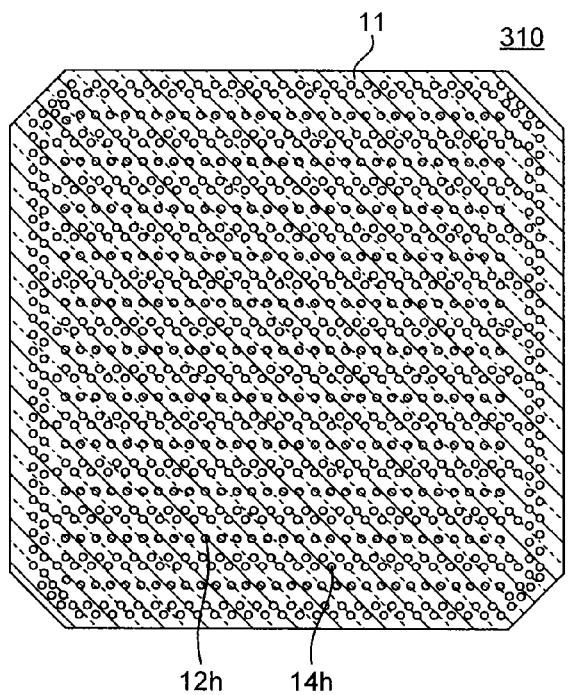
FIG. 25B is a diagram of a contact position for forming an electrode of the light receiving element.
Figure 26:
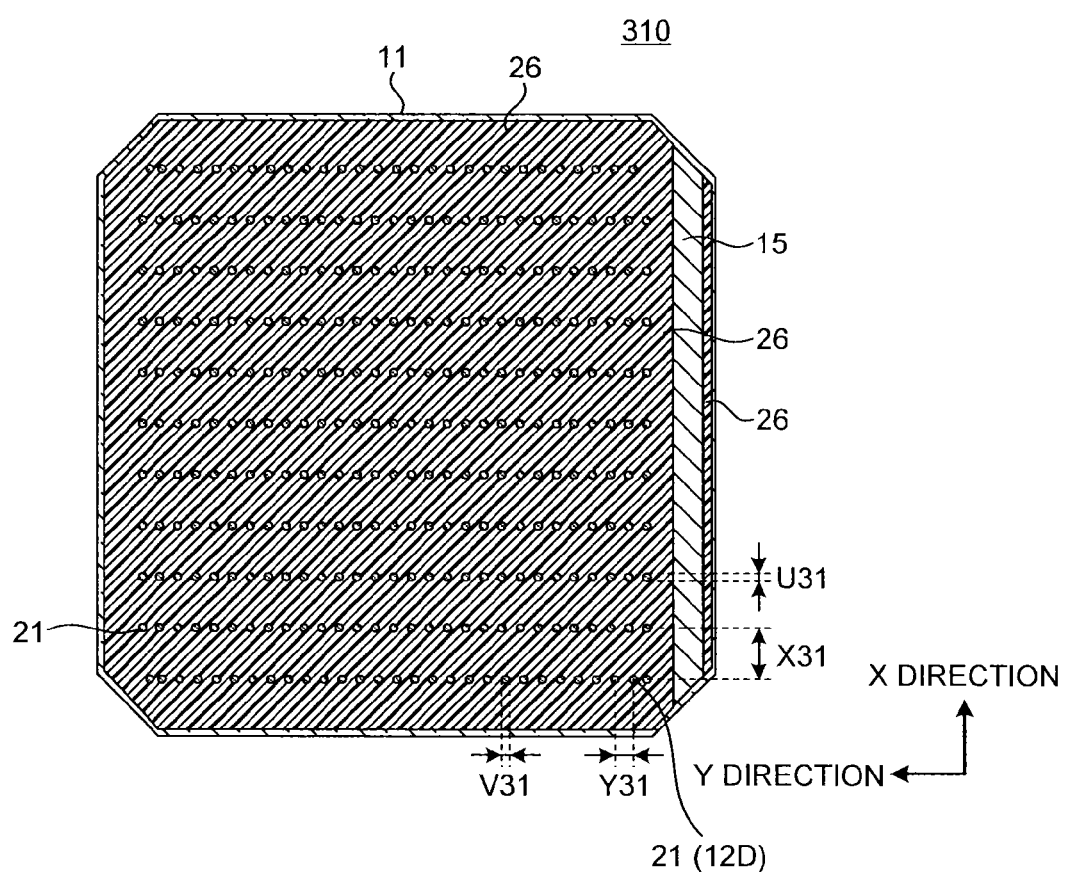
FIG. 26 is a plan view of an example of a contact shape of an electrode and an insulating layer on an element substrate in the third embodiment and is a perspective view of the inter-element connecting body of the light receiving element with a finished connecting body seen through the rear surface (a non-light receiving surface) side.
Figure 27A:
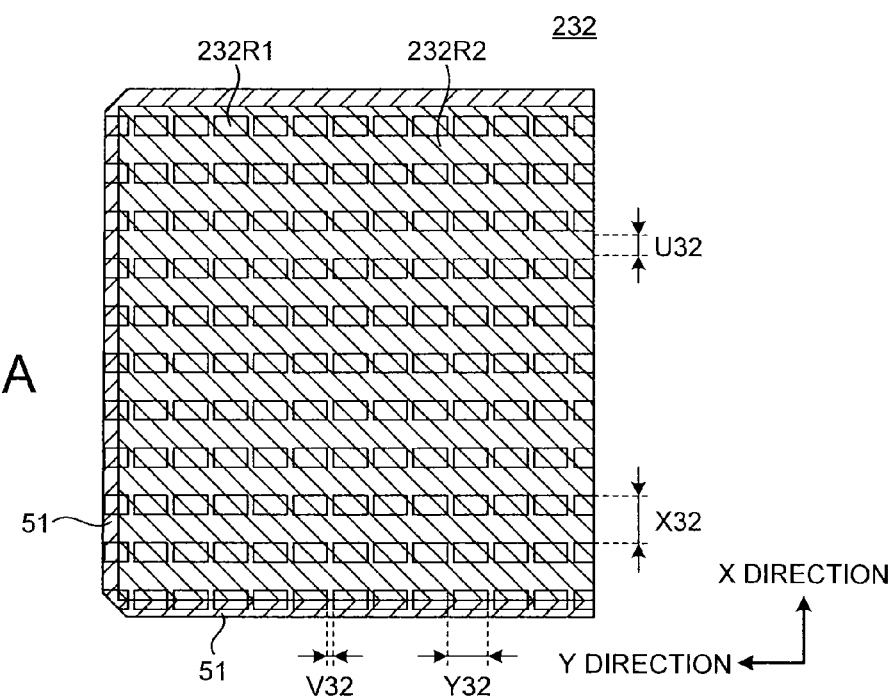
FIG. 27A is a plan view of the inter-element connecting body used in the light receiving element module in the third embodiment.
Figure 27B:
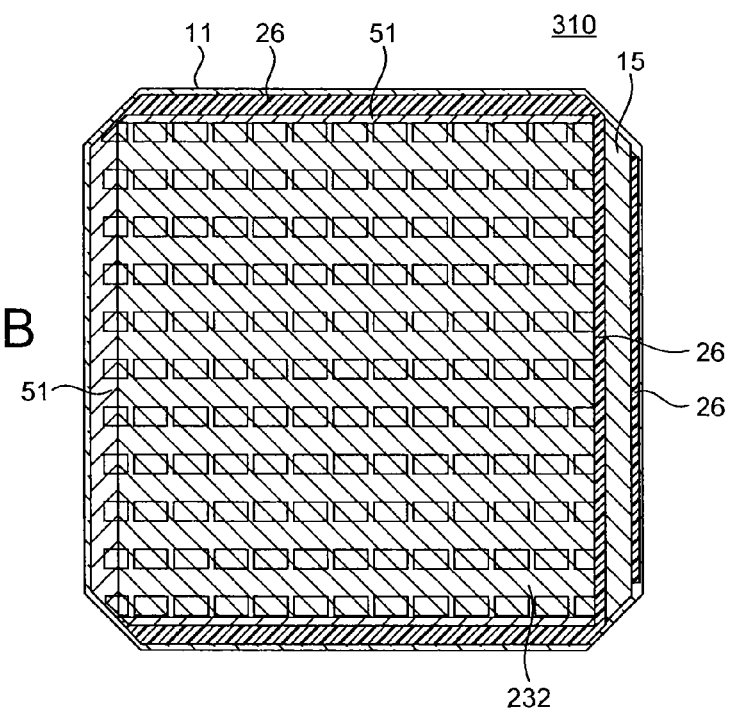
FIG. 27B is a diagram of a state in which a bonding layer is formed on the light receiving element to connect the inter-element connecting body.
Figure 28:
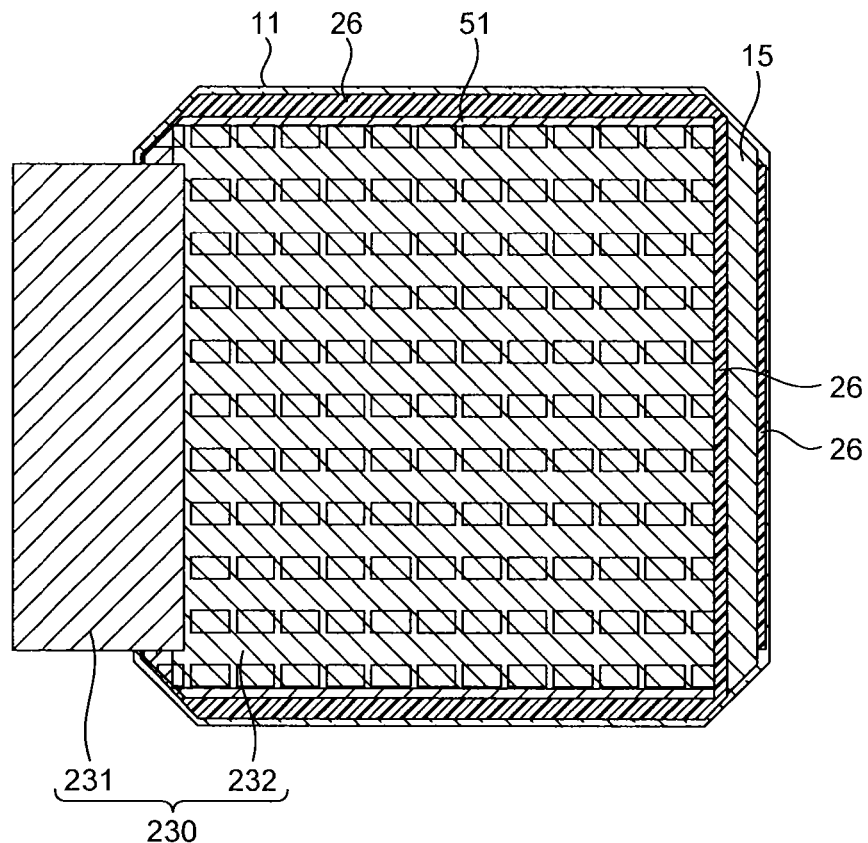
FIG. 28 is a diagram of the light receiving element module with the inter-element connecting body.
Figure 29:
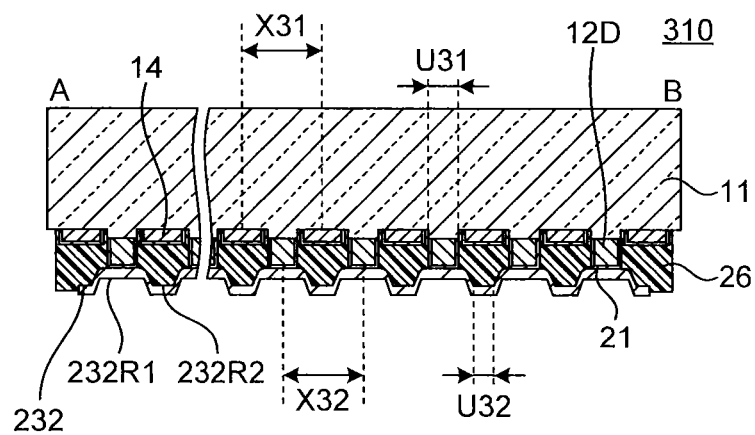
FIG. 29 is a sectional view of a state of connection of the light receiving element and the inter-element connecting body.
Figure 30A:
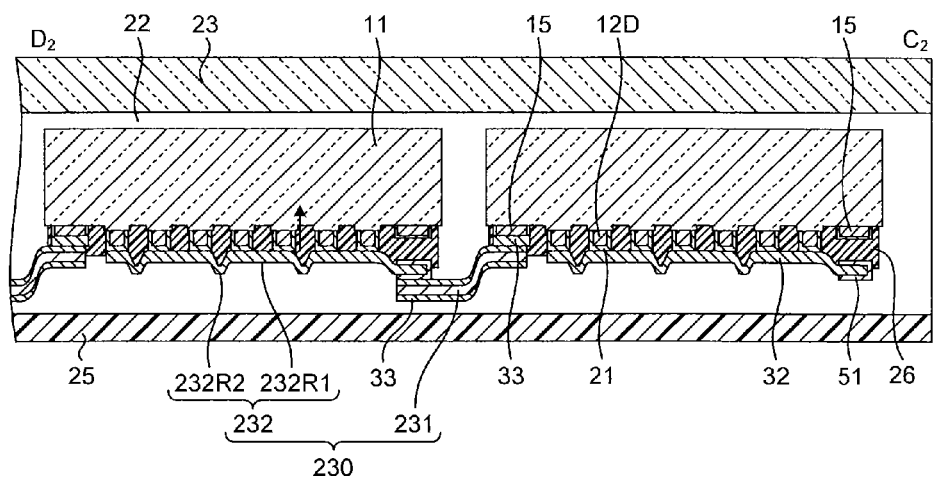
FIG. 30A is a sectional view of the light receiving element module in the third embodiment and is a $C_2$-$D_2$ sectional view of FIG. 23.
Figure 30B:
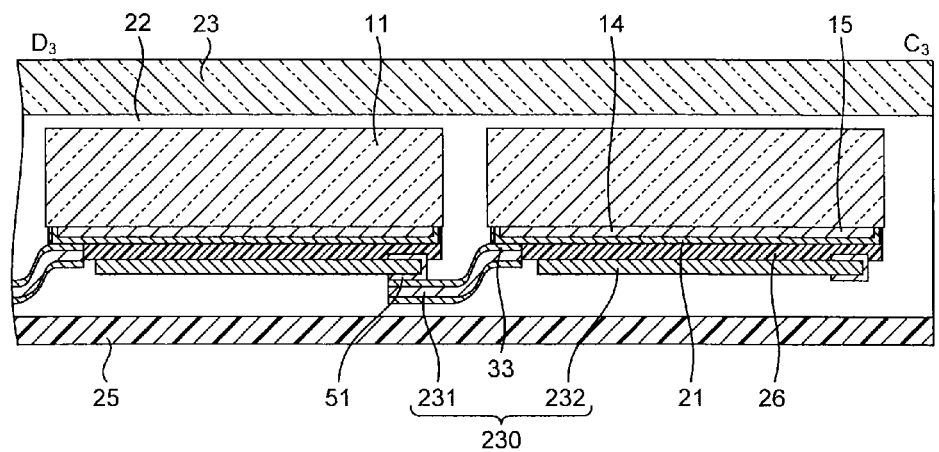
FIG. 30B is a sectional view of the light receiving element module in the third embodiment is a $C_3$-$D_3$ sectional view of FIG. 23.
Figure 31:
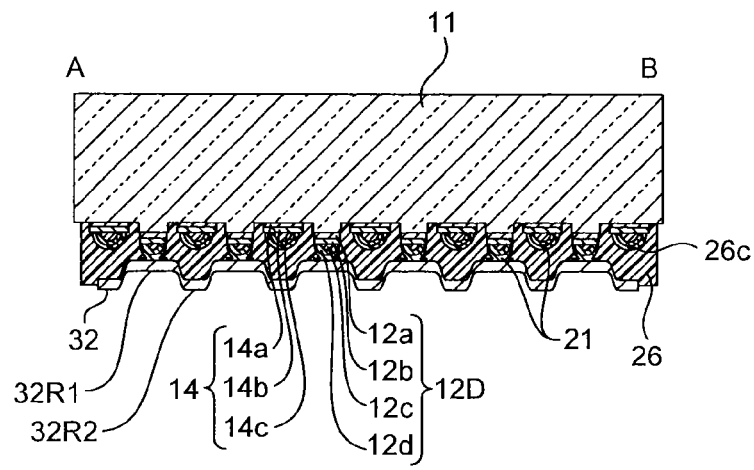
FIG. 31 is a sectional view of the light receiving element with the inter-element connecting body in the third embodiment.
Figure 32:
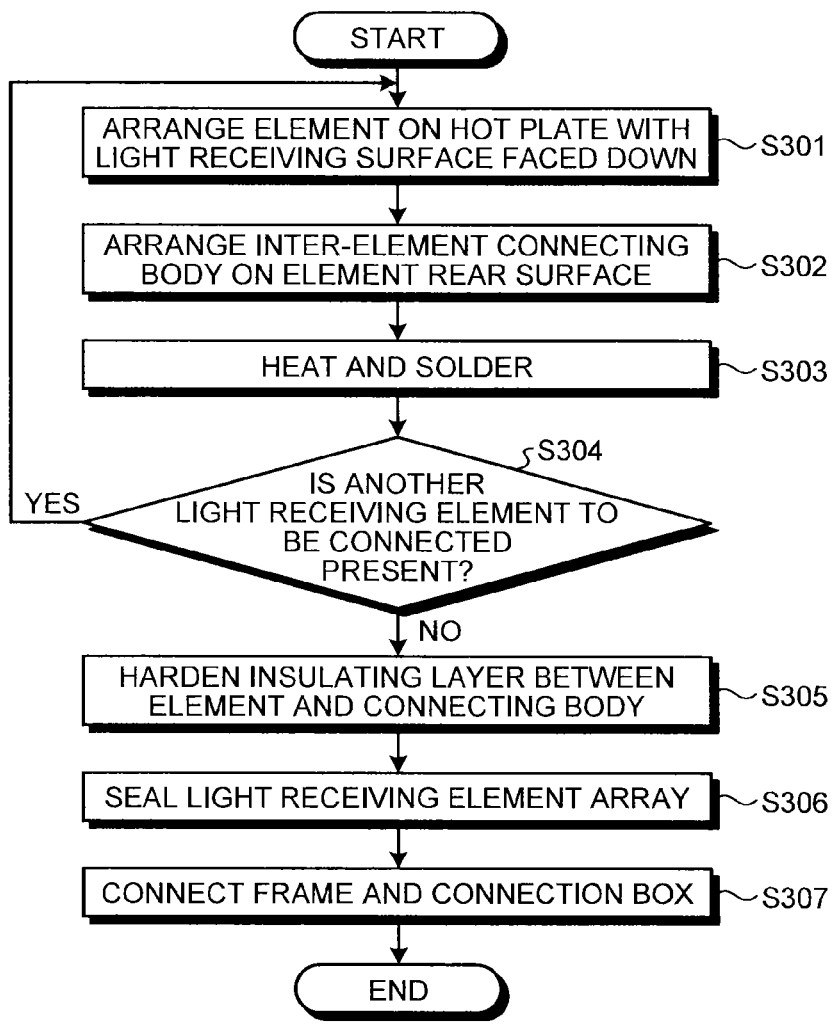
FIG. 32 is a flowchart for explaining an example of a procedure of a manufacturing method for the light receiving element module according to the third embodiment.

FIG. 22 is a plan view of a light receiving element module according to a third embodiment viewed from a light receiving surface side. FIG. 23 is a plan view of the light receiving element module according to the third embodiment viewed from a rear surface side. FIGS. 24A to 24E are diagrams of an inter-element connecting body. FIGS. 24A and 24B are a diagram of the inter-element connecting body in a portion equivalent to a portion other than a string end and a main part enlarged view of the inter-element connecting body. FIG. 24B is an enlarged view of an $O_1$ portion of FIGS. 23 and 24A. FIGS. 24C and 24D are a diagram of the inter-element connecting body in a turning-back section of a string and a main part enlarged view of the inter-element connecting body. FIG. 24D is an enlarged view of an $O_2$ portion of FIGS. 23 and 24C. FIG. 24E is a sectional view of the $O_2$ portion. FIG. 25A is a plan view of a light receiving element used in the third embodiment. FIG. 25B is a diagram of a contact position for forming an electrode of the light receiving element 10. FIG. 26 is a plan view of an example of a contact shape of an electrode and an insulating layer on an element substrate in the third embodiment and is a perspective view of the inter-element connecting body of the light receiving element with a finished connecting body seen through the rear surface (a non-light receiving surface) side. FIG. 27A is a plan view of the inter-element connecting body used in the light receiving element module in the third embodiment. FIG. 27B is a diagram of a state in which a bonding layer is formed on the light receiving element to connect the inter-element connecting body. FIG. 28 is a diagram of a state in which the inter-element connecting body and the element portion of the light receiving element module with the inter-element connecting body are extracted. FIG. 29 is a sectional view of a state of connection of the light receiving element and the inter-element connecting body. FIGS. 30A and 30B are sectional views of the light receiving element module in the third embodiment and are a $C_2$-$D_2$ sectional view and a $C_3$-$D_3$ sectional view of FIG. 23. FIG. 31 is a sectional view of the light receiving element with the inter-element connecting body. FIG. 32 is a flowchart for explaining an example of a procedure of a manufacturing method for the light receiving element module according to the third embodiment. FIGS. 33A to 36B are schematic plan views of an example of the procedure of the manufacturing method for the light receiving element module according to the third embodiment.

A light receiving element in a state in which the inter-element connecting body is mounted on the rear surface side thereof is referred to as a "light receiving element with the inter-element connecting body" in the third embodiment. An element not attached with the inter-element connecting body is referred to as a "light receiving element". A light receiving element 310 is sometimes referred to as 310a to 310f depending on positions on a string. The third embodiment is substantially different from the first and second embodiments in that an inter-element connecting body 230 is configured by a separately-formed inter-element connecting section 231 and a main body section 232 of a single-layer structure having unevenness on the surface and an element electrode of the light receiving element 310 is formed by a plurality of dot-like electrodes. Reference numeral 51 denotes a connecting section of the inter-element connecting section 231 and the main body section 232. Accordingly, reference numeral 26 denotes a bonding layer made of insulative resin.

Structure of the Light Receiving Element Module

First, the structure of the light receiving element module in which light receiving elements are connected by the inter-element connecting body is explained. Then, the structure of the light receiving element is explained, and thereafter the structure of the inter-element connecting body that connects the light receiving elements is explained.

As shown in FIGS. 22 and 23, the light receiving element module 1 in the third embodiment is configured by connecting light receiving elements of a back connection type in series. A light receiving element row is sealed by a sealing material between a front surface side main face material and a rear surface side main face material not shown in FIGS. 22 and 23.

The elements are electrically connected by the inter-element connecting body 230 formed by the inter-element connecting section 231 and the main body section 232 to form a linear element row (a string). One string and another string are electrically connected by the inter-element connecting body 230 (FIG. 24C) rotated 90 degrees with respect to the inter-element connecting body 230 used in the other string portions as shown in light receiving elements 310c and 310d in FIG. 22, 23, or 36B. The inter-element connecting body 230 is used by joining the separately-formed inter-element connecting section 231 and the main body section 232. Therefore, the direction of the inter-element connecting body 230 can be freely selected.

In the third embodiment, as in the first and second embodiments, in the light receiving elements 310a and 310f at the ends of a series element row, the current draw-out lines 38 are connected to the elements and a part of the two current draw-out lines 38 is drawn out to the outside of the sealing material 22 and the rear surface side main face material 25 from hole portions formed in the sealing material 22 and the rear surface side main face material 25 on the rear surface side. The current draw-out line 38 drawn out from the sealing material 22 on the rear surface side can be connected to a lead wire in a junction box and extracted to the outside of the light receiving element module 1 through a cable connected to the junction box. Consequently, the light receiving element module 1 is formed.

As shown in plan views of the element rear surface in FIGS. 25A and 25B, the light receiving element 310 in the third embodiment is configured by the element substrate 11 having pn junction and formed in a thin plate shape having a substantially rectangular shape as a plane shape of the substrate and thickness of, for example, about 0.01 to 0.5 millimeter.

In the third embodiment, as in the first and second embodiments, as shown in FIGS. 25A and 25B, a substrate having a shape obtained by slicing a columnar ingot and cutting off a part of corners is often used. Such a shape is included in the substantially rectangular shape.

As the light receiving element 310, as in the first and second embodiments, a crystalline silicon having pn junction, a compound light receiving element including a compound semiconductor such as gallium arsenide, and the like can be used. The pn junction can be formed by dispersing a dopant on the substrate or can be an element of a hetero junction type formed by, for example, a combination of materials having band gaps different from each other such as a thin film of a crystalline silicon substrate and an amorphous silicon film, crystalline silicon, or the like.

As shown in FIG. 25A, a plurality of dots 12D are formed to collectively configure a dot-like electrode 12D which functions as a negative electrode in a region on the rear surface side of the light receiving element 310. The dot-like electrode 12D directly in contact with the element substrate is desirably formed as a reflection metal layer using a metal material mainly including a material having high light reflectance in a wide wavelength range such as aluminum, silver, gold, tin, rhodium, or palladium for the purpose of reflecting light transmitted through the element. It is preferable to select metal having small contact resistance with the element substrate 11. For example, it is preferable to use aluminum for a p-type semiconductor region of a silicon substrate and use aluminum containing metal having a small work function such as titanium, zirconium, or chrome for an n-type semiconductor region because a Schottky barrier is low and the contact resistance is small.

By laminating, on the reflection metal layer, as a second layer, a barrier layer or the like that suppresses reaction with the metal material and the reflection metal layer and diffusion of metal to a semiconductor substrate, it is possible to prevent the metal from diffusing to the semiconductor and improve electric connectability from the dot-like electrode 12D to the inter-element connecting body 230. As a material for this purpose, nickel, titanium, tungsten, a mixture and an alloy of nickel, titanium, and tungsten, and the like can be used. As an outermost layer of the dot-like electrode 12D, it is desirable to use a material suitable for connection to the inter-element connecting body in modularization. For example, when the element and the inter-element connecting body are connected using solder, it is desirable to use copper, tin, silver, a tin-lead alloy, a tin-silver alloy, and the like. Resin, a glass component, and the like can be included in electrodes formed of the materials.

Besides, for example, in the case of a light receiving element in which hetero junction is formed, a material obtained by laminating a translucent electrode formed of an indium oxide or the like, the metal, and the like can be used. Resin, a glass component, and the like can also be included in electrodes formed of the materials.

The dot-like electrode 12D is an electrode that extracts negative charges having high concentration on the element rear surface side through photo-carrier generation. The dot-like electrode 12D is disposed at an appropriate interval. The negative charges collected by the dot-like electrode 12D are collected by the inter-element connecting body 230 connected later. As a pattern of the dot-like electrode 12D, an optimum arrangement is different not only according to whether the light receiving element is a diffusion-type element formed by doping on the substrate or a hetero junction-type element formed by forming an amorphous thin film or the like on the substrate but also according to, for example, specific resistance of the substrate. For example, circular electrodes having a diameter of about 0.01 to 1 millimeter are linearly arranged in a predetermined direction (in the third embodiment, a Y direction in FIG. 25A) at a period of 0.02 to 2 millimeters to configure an electrode row. Electrode row patterns linearly arranged in this way are arranged to be separated from one another in a direction orthogonal to the extending direction of the electrode row (an X direction in FIG. 25A) at a period of 0.05 to 2.5 millimeters. The electrode intervals are preferably values smaller than a diffusion length of a small number of carriers of the substrate as explained below.

In the third embodiment, as explained below, the dot-like electrode 12D and the inter-element connecting body 230 are directly connected. The inter-element connecting body 230 functions as a current extraction electrode that extracts an electric current to the outside of a light receiving element 310a and functions as a current collecting electrode that collects an electric current extracted from the element to the inter-element connecting section 231 of the inter-element connecting body 230 at the end of the element. For example, when a pitch among the electrodes is about 2 millimeters in the Y direction and the X direction and the size of the element substrate is 156 millimeters, the number of the current collecting electrode 14 and the number of rows in the Y direction of the dot-like electrode 12D are large. The numbers need to be shown in the figures. However, as in the second embodiment, the current collecting electrode 14 and the rows of the dot-like electrode 12D are simplified and shown in small numbers in FIG. 24A and subsequent figures.

As shown in FIG. 25A, in a part of a region on the rear surface side, which is a principal plane, of the light receiving element 310, the current collecting electrode 14 and the current extraction electrode 15 configuring a polarity different from the polarity of the dot-like electrode 12D are formed as rear surface electrodes. The current collecting electrode 14 is provided to cover a wide region on the rear surface side of the element substrate 11 made of a semiconductor substrate and has a function of collecting an electric current to the current extraction electrode 15. The current collecting electrode 14 can be formed of, for example, a material including aluminum, silver, or copper as a main component and a material obtained by laminating aluminum, silver, and copper. All portions of the current collecting electrode 14 do not need to be in direct contact with the element substrate 11. In the light receiving element formed by diffusing the dopant, it is desirable that a part of the current collecting electrode 14 is in point contact with the element substrate 11 configuring the light receiving element. The patterns formed by contact holes 12h and 14h, which are opening sections forming contact portions of the dot-like electrode 12D and the current collecting electrode 14 and the light receiving element substrate, can be formed in, for example, a dot shape as shown in FIG. 25B. The dot-like electrode 12D and the current collecting electrode 14 are formed to be in contact with the light receiving element substrate via the contact holes 12h and 14h. In the case of a light receiving element formed by the hetero junction, the electrodes are not in direct contact with the semiconductor substrate and are conducted to the semiconductor substrate via a translucent conductive film, amorphous silicon, or the like exposed in the contact holes 12h and 14h.

The current extraction electrode 15 is connected to the current collecting electrode 14 configuring one polarity and functions as a current extraction electrode that extracts an electric current collected by the current collecting electrode 14 to the outside of the light receiving element 310. The current extraction electrode 15 is formed of a metal material or an alloy mainly including Ag, Aluminum, or copper and a laminated body of Ag, aluminum, and copper. An electric current collected by the current collecting electrode 14 in this way is extracted to the outside via the inter-element connecting body 230 connected to the current extraction electrode 15. In the light receiving element in the third embodiment in which a region of a conduction type opposite to the conduction type of the element substrate 11 is formed in a wide region including element ends as shown in FIG. 25A, photoelectric conversion efficiency is satisfactory.

Concerning the height of the electrodes, in the third embodiment, as shown in a sectional view of the light receiving element with the inter-element connecting body in FIG. 29, the dot-like electrode 12D is formed higher than the current collecting electrode 14 and the current extraction electrode 15. In this case, although the height is different depending on the size of the light receiving element, the height of the dot-like electrode 12D shown in FIG. 25A is about 1 micrometer to 1 millimeter. The height of the current collecting electrode 14 and the current extraction electrode 15 can be set to about 1 to 500 micrometers lower than the height of the dot-like electrode 12D. As the height of the electrode portions is larger, the electrode portions are more deformed. Therefore, stress due to a difference in a coefficient of thermal expansion between the inter-element connecting body 230 and the element substrate 11 (the semiconductor substrate) can be reduced by the electrode portions. It is possible to improve insulation between a positive electrode and a negative electrode of the element electrodes.

An inter-element pitch depends on a diffusion length of a small number of carriers. Because the diffusion length is about several millimeters, the inter-element pitch is equal to or smaller than about 2 millimeters. When copper is used in the inter-element connecting body, a large resistance loss is eliminated if a sectional area perpendicular to the string extending direction is set to be, for example, equal to or larger than about 1 mm$^2$. Therefore, when an inter-element connecting body having width of 150 millimeters is used, an inter-element connecting body having thickness equal to or larger than about 10 micrometers is necessary.

In the case of such an inter-element pitch of the element electrodes, because the inter-element connecting body is thin and has high flexibility, the inter-element connecting body bends to the element side in the portions of the current collecting electrode 14. Therefore, it is likely that the inter-element connecting body 230 and the current collecting electrode 14 are short-circuited. In general, the element substrate itself has unevenness, waviness, bend, thickness distribution, or the like on the surface and has height fluctuation of the element electrode itself formed by printing or the like. The level difference of about 10 micrometers occurs between element electrodes adjacent to each other within about 2 millimeters because of a manufacturing process of the elements. It is likely that the current collecting elements 14 and the inter-element connecting body 230 are short-circuited. As a level difference between the electrodes that does not cause a short circuit is larger, it is possible to prevent the inter-element connecting body 230 and the current collecting electrode 14 from being short-circuited without performing accurate alignment, although depending on an interval between the element electrodes, the flatness and the rigidity of the inter-element connecting body, and the thickness of the sealing material of the module. To prevent the short circuit between the electrodes, it is necessary to, for example, increase the thickness of the inter-element connecting body, increase the level difference between the dot-like electrode 12D and the current collecting electrode 14, or reduce a gap between the element electrodes. If the thickness of the inter-element connecting body including a supporting body and an electric connection body is equal to or larger than about 100 micrometers, a bend or deflection having a steep angle less likely to occurs in the inter-element connecting body itself. Therefore, a ratio of the level difference between the dot-like electrode 12D and the current collecting electrode 14 and a gap (Y31-V31) between the dots in the dot-like electrode 12D is set as the level difference÷inter-element gap distance≥0.005 to suppress the short circuit of the inter-element connecting body 230 and the current collecting electrode 14.

On the other hand, when the thickness of the inter-element connecting body 230 including the supporting body and the electric connection body is equal to or smaller than about 100 micrometers, a bend or deflection having a steep angle occurs in the inter-element connecting body itself. Therefore, it is preferable to set the ratio of the level difference between the dot-like electrode 12D and the current collecting electrode 14 and the gap (Y31-V31) between the dots in the dot-like electrode 12D as the level difference÷inter-element gap distance≥0.01 to suppress the short circuit of the inter-element connecting body 230 and the current collecting electrode 14. The same applies to the Y direction. It is preferable to set a ratio of a level difference between the dot-like electrode 12D and the element substrate other than the dot-like electrode 12D and the electrode distance between the dots in the dot-like electrode 12D same as the above.

In the third embodiment, the thickness of the inter-element connecting body 230 is set to 30 micrometers, the height of the current collecting electrode 14 from the substrate is set to 10 micrometers, the width of the current collecting electrode 14 is set to 600 micrometers, the height of the dot-like electrode 12D from the substrate is set to 40 micrometers, diameters (X-direction width) U31 and (Y-direction width) V31 of the dot-like electrode 12D are set to 100 micrometers, a gap distance between the dots in the dot-like electrode 12D (Y31-V31) of the electrodes on the element substrate is set to 0.2 millimeter, and an electrode pitch X31 between the adjacent lines of dots in the dot-like electrode 12D is set to 1 millimeter.

On the other hand, even when there is no level difference between the positive electrodes and the negative electrodes of the element electrodes as shown in FIGS. 9A to 9C in the first embodiment and FIG. 20B in the second embodiment, it is possible to prevent the inter-element connecting body 230 and the current collecting electrode 14 from being short-circuited by arranging resin, ceramic, or the like in the current collecting electrode 14 portion and lifting the inter-element connecting body 230 from the element substrate in the portion of the current collecting electrode 14 using an inter-element connecting body having flexibility. Therefore, the level difference does not always need to be formed. It is also possible that the level difference is provided between the element electrodes and the inter-element connecting body 230 is lifted from the element substrate in the portion of the current collecting electrode 14.

As a method of providing the level difference between the electrodes, solder paste can be printed only on an electrode of one polarity side. When a larger level difference is provided, a solder ball can be connected. As the solder ball, for example, a Sn—Ag—Cu solder ball, solder bump, or the like can be formed in the dot-like electrode 12D portion. For example, when a Sn—Ag—Cu solder ball having a diameter of about 300 micrometers is formed in the dot-like electrode 12D portion having a diameter of about 100 micrometers, the dot-like electrode 12D can retain a level difference of about 200 to 300 micrometers with respect to the current collecting electrode 14. Consequently, it is easy to connect the inter-element connecting body to one element electrodes. Beside such a method of melting low-melting point metal, the electrodes having one polarity can be increased to increase the level difference by using conductive resin by, for example, resin containing metal and forming only the electric connection body 21 or the element electrode itself only in the negative electrode by photoelectrolysis plating.

That is, a negative electrode is connected to the first electrodes configuring the dot-like electrode 12D, the light receiving element is immersed in a plating bath, and photoelectrolysis plating is performed. Consequently, a plating layer such as an Sn layer is selectively formed on the dot-like electrode 12D. The first electrode can be formed thicker than the second electrode. With such a configuration, when the positive electrode and the negative electrode (the first and second electrodes) are present on the same plane, it is possible to selectively form only the negative electrode high. Therefore, alignment is unnecessary in connection to the inter-element connecting body.

In FIG. 25A, a conductor containing metal as a main component is formed as the current collecting electrode 14 with the rear surface thereof formed in a thin-line shape. However, in the light receiving element in this embodiment, to improve current extraction efficiency, it is necessary to set the diffusion length of a small number of carriers longer than the distance between the element electrodes. It is preferable that the element surface is inactivated by a passivation film. In such an element structure including the passivation film on the surface, the influence of recombination of the carriers in contact portions of the electrodes such as the dot-like electrode 12D and the current collecting electrode 14 and silicon, which is the element substrate 11, is large. Therefore, it is more preferable to reduce the contact area of the electrode and the silicon as much as possible and increase an area occupied by the passivation film because this leads to improvement of the photoelectric conversion efficiency of the element itself.

Therefore, in the third embodiment, the contact of the element substrate and the electrodes is attained through the contact holes 12h and 14h of the local passivation film formed in patterns shown in FIG. 15B. In this embodiment, electric currents are collectively extracted from the respective contact holes 12h and 14h for extracting electric currents from the light receiving element substrate. Therefore, in the positive electrode, the current collecting electrode 14 and the current extraction electrode 15 are formed as a continuous body to collect electric currents from the current extraction electrode 15 to the end of the element. In the negative electrode, the main body section 232, which is the element rear portion of the inter-element connecting body, is connected to the dot-like electrode 12D formed in the contact holes 12h to perform current collection to the end of the element. Electric currents can flow between the elements through the current extraction electrode 15 and the inter-element connecting body 230.

A contact shape of the element and the electrodes in the third embodiment is not limited to a contact shape shown in FIG. 25B. The contact shape does not always need to be a dot shape. As in the first embodiment, the electrodes can include an electrode group formed by continuously setting the electrodes in contact with each other in a linear shape. Similarly, a pattern of the element electrodes in the third embodiment is not limited to the pattern shown in FIG. 25A. The electrode configuring one side does not always need to be the dot shape, but as in the first embodiment, the electrode can be formed as a group of electrodes continuously in contact with each other in a linear shape and can include the current extraction electrode 13.

In the third embodiment, the light receiving element in which only metal is used as the element electrode is explained. Besides, the light receiving element can be a light receiving element in which the negative electrode and the positive electrode are insulated and a laminated structure of a translucent conductive film and metal electrodes formed over substantially the entire surface is used.

In a light receiving element of a rear surface connection type, rear surface electrodes include a positive electrode and a negative electrode on the same plane of the element. Therefore, it is preferable to insulate the positive and negative electrodes. An insulating layer can be an air gap or the like including gas. However, in the third embodiment, high bonding strength is given between the light receiving element 310a and the main body section 232, which is the element rear portion, of the inter-element connecting body 230. The dot-like electrode 12D and the current collecting electrode 14 are insulated from each other. The main body section 232 of the inter-element connecting body 230 and the current collecting electrode 14 and the current extraction electrode 15 are insulated from each other. Therefore, as shown in FIG. 26, the bonding layer 26 is formed to cover the current collecting electrode 14 and the current extraction electrode 15 excluding only a part of the current extraction electrode 15 and the dot-like electrode 12D portion of the element. To improve insulation, it is preferable to use resin or the like as the insulating layer.

As explained above, in the third embodiment of the present invention, the bonding layer 26 is held between the main body section 232 of the inter-element connecting body 230 and the element substrate 11. Therefore, by setting a coefficient of thermal expansion of the bonding layer 26 to about a coefficient of thermal expansion between the element substrate 11 and the inter-element connecting body 230, it is possible to reduce in the bonding layer 26, stress due to a difference in a coefficient of thermal expansion between the element substrate 11 configuring the light receiving element and the main body section 232 of the inter-element connecting body 230.

Therefore, in the light receiving element 310 in this embodiment, a member thicker than an electrode layer directly formed on the element back can be used as the main body section 232 of the inter-element connecting body 230. Therefore, it is possible to obtain a light receiving element having small current collection resistance.

As explained below, the main body section 232 of the inter-element connecting body 230 is not flat and has unevenness. Therefore, an interface on the inter-element connecting body side of the bonding layer 26 has unevenness. However, the unevenness is not shown in FIG. 26.

In this case, because an electrode area of the dot-like electrode 12D is small, when connection to the inter-element connecting body 230 is hindered, resistance between the light receiving element 310 and the inter-element connecting body 230 increases. Therefore, it is preferable that the bonding layer 26 does not overlap the dot-like electrode 12D. When the bonding layer 26 overlaps the dot-like electrode 12D, it is possible to remove the bonding layer 26 by, for example, polishing convex sections formed by the bonding layer 26 on the dot-like electrode 12D in a later process and expose the dot-like electrode 12D.

When the light receiving element 310 including the bonding layer 26, which is the insulating layer, the dot-like electrode 12D, the current collecting electrode 14, the current extraction electrode 15, and the element substrate 11 shown in FIG. 26 is viewed from the rear surface in a state in which the main body section 232 of the inter-element connecting body 230 shown in FIG. 27A is formed, a structure shown in FIG. 27B is seen. FIG. 27A is the main body section 232 of the inter-element connecting body 230 viewed from a bonding surface (the front side) of the light receiving element substrate and the inter-element connecting body. FIG. 27B is the light-receiving element 310 with the main body section 232 of the inter-element connecting body 230 viewed from the rear side (a non-light receiving surface side of the module). FIG. 28 shows a state in which the inter-element connecting section 231 is mounted.

A sectional view of the light receiving element 310 in a state in which the main body section 232 of the inter-element connecting body 230 is mounted is shown in FIG. 29. As shown in FIG. 29, the dot-like electrode 12D of one polarity side is higher than the current collecting electrode 14 and the current extraction electrode 15 of the other polarity. The dot-like electrode 12D projects further than the current collecting electrode 14 and the current extraction electrode 15. The main body section 232 of the inter-element connecting body 230 can be conducted to the dot-like electrode 12D of one polarity side through the electric connection body 21 and can be insulated from the current collecting electrode 14 of the other polarity with the bonding layer 26. In this case, the bonding layer 26 functions as an insulating layer and functions as a layer that fixes the light receiving element 310 and the main body section 232 of the inter-element connecting body 230.

As the main body section 232 of the inter-element connecting body 230, a flat tabular body can be used. However, the main body section 232 of the inter-element connecting body 230 in the third embodiment includes convex sections denoted by 232R1 and concave sections denoted by 232R2 in FIG. 27A. As the interval between each of the convex sections 232R1 and each of the concave sections 232R2 formed in the main body section 232 of the inter-element connecting body 230, an interval (U32) in the X direction is set to be equal to or smaller than about 2 millimeters to match the width of the element electrodes. Therefore, about eighty convex sections 232R1 and concave sections 232R2 actually need to be shown with respect to a 156 mm substrate. However, in FIG. 27A and subsequent figures, the convex sections 232R1 and the concave sections 232R2 are simplified and shown according to the number of element electrodes as in the second embodiment.

The inter-element connecting body 230 is bonded to the light receiving element 310, whereby the light receiving element with the inter-element connecting body in the third embodiment is formed. A plan view of the light receiving element with the inter-element connecting body viewed from the rear surface side is shown in FIG. 27B. A sectional view of the light receiving element with the inter-element connecting body taken along the X direction and passing the dot-like electrode 12D is shown in FIG. 29. A cross section of the light receiving element has a structure shown in FIG. 29. The main body section 232, which is the element rear portion, of the inter-element connecting body 230 includes the convex sections 232R1 and the concave sections 232R2. The convex sections 232R1 are set in contact with the dot-like electrode 12D, which is the element electrode, to obtain electrical connection. As a result of the structure in the third embodiment, the distance between the main body section 232 of the inter-element connecting body 230 and the current collecting electrode 14 and the current extraction electrode 15 on the element substrate 11 configuring the light receiving element increases. Therefore, insulation between the positive and negative electrodes on the same light receiving element is improved. On the other hand, in the concave sections 232R2, the distance between the element electrodes and the inter-element connecting body 230 can be secured large compared with a planar electrode. Therefore, it is possible to improve insulation between the positive and negative electrodes on the element.

The main body section 232, which is the element rear portion, of the inter-element connecting body 230 includes such unevenness. Therefore, it is possible to easily deform boundary portions between the convex sections 232R1 and the concave sections 232R2 of the main body 232 of the inter-element connecting body 230. Therefore, because the inter-element connecting body 230 can expand and contract in a plane (XY) direction of the inter-element connecting body 230, it is possible to reduce stress caused by a difference in a coefficient of thermal expansion between the light receiving element 310 and the main body section 232 of the inter-element connecting body 230. It is possible to obtain a light receiving element and a light receiving element module excellent in durability and strength. Because contactability between the light receiving element 310 and the inter-element connecting body 230 is also satisfactory, contact resistance is small.

Further, as shown in FIG. 29, it is preferable that the interval U32 in the X direction among the convex sections 232R1 of the main body section 232 of the inter-element connecting body 230 is smaller than the width U31 in the X direction of a plurality of dots in the dot-like electrode 12D and an interval of the concave sections 232R2 is smaller than the width V31 in the Y direction of each dot of the dot-like electrode 12D itself. Because the main body section 232 of the inter-element connecting body 230 has the unevenness structure of such a shape, the dot-like electrode 12D cannot intrude into a region between the convex sections 232R1 adjacent to each other on the main body section 232 of the inter-element connecting body 230. Therefore, it is possible to cause positions of the convex sections 232R1 of the main body section 232 of the inter-element connecting body 230 and the dot-like electrode 12D to coincide with each other without performing alignment. Therefore, it is possible to prevent a problem in that the convex sections 232R1 of the main body section 232 of the inter-element connecting body 230 and the current collecting electrode 14 and the current extraction electrode 15 come into contact with each other, positional deviation occurs from a state shown in FIG. 29, and a short circuit occurs between the positive and negative electrodes on the light receiving element 310. The convex sections 232R1 of the inter-element connecting body 230 and the dot-like electrode 12D do not need to correspond to each other in a one-to-one relation. The dot-like electrode 12D only have to be not connected to the concave portions 232R2. Therefore, the number in the X direction or the Y direction of the convex portions 232R1 and the concave portions 232R2 can be larger than the forked number in the X direction or the Y direction of the linear electrode.

In general, the electrode pitches X31 and Y31 of the dots in the dot-like electrode 12D are narrower in a longitudinal direction (the Y direction in the figure) of the current collecting electrode 14 than in a direction (the X direction) orthogonal to the longitudinal direction of the current collecting electrode 14 (in the figure, X31>Y31). In this way, in the direction orthogonal to the longitudinal direction of the current collecting electrode 14 (parallel to the X direction in the figure), the electrode pitch X31 of the dot-like electrode 12D and the distance U32 between the convex sections 232R1 of the inter-element connecting body 230 are large. Therefore, even if accurate alignment is not performed, if the width in the X direction of the convex portions 232R1 of the main body section 232 of the inter-element connecting body 230 is large, it is possible to connect the dot-like electrode 12D and the convex portions 232R1 of the main body section 232 of the inter-element connecting body 230 by performing rough alignment with the dot-like electrode 12D and the main body section 232 of the inter-element connecting body 230 (at accuracy about a half of accuracy of the width in the X direction of the convex sections 232R1 of the inter-element connecting body 230).

On the other hand, concerning the Y direction, because the distance Y31 between the dots in the dot-like electrode 12D is narrow, it is difficult to align the dot-like electrode 12D and the convex sections 232R1 of the main body section 232 of the inter-element connecting body 230. Therefore, the alignment is more difficult in the Y direction than the X direction, which causes an increase in costs. It is preferable that an interval V32 in the Y direction of the convex sections 232R1 of the main body section 232 of the inter-element connecting body 230 is set smaller than the size V31 in the Y direction of each dot of the dot-like electrode 12D to prevent the dot-like electrode 12D from intruding into the concave sections 232R2.

As a result, as shown in FIG. 27A, the interval U32 in the X direction between the convex sections 232R1 is relatively wide and, on the other hand, the width of the concave sections 232R2, that is, the interval V32 in the Y direction between the convex section 232R1 is narrow. A pitch in the X direction between the convex sections 232R1 of the main body section 232 of the inter-element connecting body 230 is represented as X32 and a pitch in the Y direction between the convex sections 232R1 is represented by Y32.

In this way, the convex sections 232R1 are formed on the element rear portion (the main body section) of the inter-element connecting body 230 such that the interval V32 between the convex sections 232R1 is narrow in the longitudinal direction of the current collecting electrode 14 of the element (a direction parallel to the Y direction). Consequently, it is possible to connect the convex sections 232R1 of the element rear portion (the main body portion) of the inter-element connecting body 230 to the dots in the dot-like electrode 12D of the element simply by performing rough alignment only in the direction orthogonal to the current collecting electrode 14 of the element (the X direction in FIG. 27A). Consequently, an alignment mark or the like is unnecessary in an aligning method between the element and the inter-element connecting body. A method of detecting an end by bringing the element substrate end into contact with the inter-element connecting body can be adopted. Therefore, costs for improving alignment accuracy is unnecessary. In the concave sections 232R2 of the main body section 232 of the inter-element connecting body 230, it is possible to secure a wide interval between the current collecting electrode 14 of the element and the main body section 232 of the inter-element connecting body 230. It is possible to improve insulation between the current collecting electrode 14 and the main body section 232 of the inter-element connecting body 230.

The pitches X32 and Y32 in the X direction and the Y direction of rows of unevenness of the main body section 232 of the inter-element connecting body 230 are adjusted to the electrode pitches X31 and Y31 in the X direction and the Y direction of the dots in the dot-like electrode 12D of the element. For example, the pitch X32 needs to be set to about 0.05 to 2.5 millimeters. On the other hand, when the element electrode on the negative electrode side is connected in series, the electrode pitch Y32 in the Y direction can be set arbitrarily. However, for a reduction in current collection resistance on the element electrode, it is preferable that the element electrode and the inter-element connecting body are connected at a period of a distance at which the current collection resistance does not increase on the element electrodes. Therefore, it is preferable to set the pitch Y32 to be equal to or smaller than 0.02 to 10 millimeters such that the connection distance between the element electrode and the inter-element connecting body decreases. The level difference of the unevenness can be set to, for example, about 10 micrometer to 5 millimeters. With the interval of the rows of the unevenness, as in the third embodiment, the main body section 232 of the inter-element connecting body 230 includes uneven sections or includes an inclined surface between the uneven sections near a connection point of the light receiving element 310 and the inter-element connecting body 230. Consequently, the inter-element connecting body 230 is deformed in the uneven sections. It is possible to reduce stress caused by a difference in a coefficient of thermal expansion between the light receiving element 310 and the inter-element connecting body 230. Therefore, the number of the uneven sections is preferably large. The width of the convex sections is preferably set to be equal to or smaller than about 10 millimeters.

When the electrodes on the negative electrode side have the shape of dot-like electrode and are not continuously connected, the interval U32 of the convex sections 232R1 of the main body section of the inter-element connecting body in the Y direction is reduced to be equal to or smaller than the width (size) U31 of the dot-like electrode 12D themselves. Consequently, it is possible to prevent the dot-like electrode 12D from intruding into the concave sections 232R2 to be short-circuited. The interval U32 of the convex sections 232R1 to be reduced needs to be smaller than the size U31 of the dots in the dot-like electrode 12D and equal to or smaller than about 0.01 to 0.1 millimeter. The same applies in the Y direction. However, when the light receiving element 310 and the main body section 232 of the inter-element connecting body 230 are connected after being accurately aligned, the interval can be increased. The width U31 of each dot of the dot-like electrode 12D in the X direction, which should be fit among the convex portions 232R1, can be set to be smaller than the interval U32 between the convex sections 232R1 in the X direction and equal to or smaller than about 1 millimeter. In this way, as the size of the concave sections 232R2, the size in the X direction and that of the Y direction in the plane of the concave sections 232R2 are set smaller than the electrode intervals U31 and V31 in the respective directions of the dots in the dot-like electrode 12D. Consequently, structurally, it is possible to allow the convex sections 232R1 to easily come into contact with the dot-like electrode 12D portion and separate the convex sections 232R1 from and disallow the convex sections 232R1 to easily come into contact with the other portion of the current collecting electrode 14 and the current extraction electrode 15. A surface on which the convex sections 232R1 are formed can be a curved surface or a flat surface. However, the surface is preferably flat.

The inter-element connecting section 231 of the inter-element connecting body 230, which connects the elements, is connected to the main body section 232 of the inter-element connecting body 230. Therefore, the main body section 232 includes the connecting section 51 of the main body section 232 and the inter-element connecting section 231 of the inter-element connecting body 230 as a portion to which the inter-element connecting section 231 of the inter-element connecting body 230, which connects the elements, is connected. As a specific material of the connecting section 51, for example, metal having high solderability such as tin can be formed using electroplating or the like. As the material of a base body of the inter-element connecting body, copper, aluminum, and the like can be used. For example, when the material of the main body section 232 of the inter-element connecting body is copper, wettability of solder between the main body section 232 and the inter-element connecting section 231 is improved, and thus the connecting section 51 is not always necessary. In this case, the connecting section 51 to the inter-element connecting section 231 of the inter-element connecting body 230 does not have to be formed from the main body section 232 of the inter-element connecting body 230 unlike FIGS. 27A and 27B. Concerning the pattern of the element electrodes, the electrode formed as the convex sections do not always need to be the dot-like electrode. The electrode can be grid-like as in FIGS. 4A and 4B or can include the current extraction electrode 13. The bonding layer does not always need to be present over the entire rear surface. The bonding layer can be formed in only the portion of the end of the element rear portion (the main body section) 232 of the inter-element connecting body 230 or does not have to be formed on the element rear surface side.

The dot-like electrode 12D on the element rear side shown in FIG. 26 is connected to the main body section 232 of the inter-element connecting body 230 shown in FIG. 27A through the electric connection body 21. The current extraction electrode 15 on the light receiving element back and the main body section 232 of the inter-element connecting body 230 shown in FIG. 27B are exposed as the positive and negative electrodes on the element rear surface. Consequently, an electric connection portion between the elements is formed. In this case, by connecting the main body section 232 of the inter-element connecting body 230 and the dot-like electrode 12D on the element, the main body section 232 of the inter-element connecting body 230 acts as a conductor and can collect electric currents generated in the element. By adopting a structure in which the light receiving element and the main body section 232 of the inter-element connecting body 230 are integrated, it is possible to reflect light transmitted through the element. Further, because the main body section 232 of the inter-element connecting body 230 supports the element substrate 11 configuring the light receiving element, it is possible to increase strength and prevent an element crack. In the third embodiment, a structural portion from the silicon substrate to the portion to which the main body section 232 of the inter-element connecting body 230 is connected is referred to as light receiving element with a connecting body.

In order to connect the connected main body section 232 of the inter-element connecting body 230 to the current extraction electrode 15 of a light receiving element adjacent to the light receiving element, one end of the inter-element connecting section 231 is connected to the connecting section 51 on the main body section 232 of the inter-element connecting body 230 by the electric connection bodies 21 and 33. A module including the inter-element connecting body 230, the light receiving element, the bonding layer 26, a sealing material, a light receiving surface side main face material, and a rear surface side main face material have a shape indicated by a sectional view of the light receiving element module 1 shown in FIGS. 30A and 30B. A diagram of the rear side of the light receiving element, to which the inter-element connecting body is connected, seen through the inter-element connecting body is FIG. 26. The shape of the light receiving element with the inter-element connecting body including the inter-element connecting section is shown in FIG. 28. This configuration is one unit of repetition. One side of the inter-element connecting section 231 of the inter-element connecting body 230 is connected to the main body section 232 of the inter-element connecting body 230 by the electric connection body 33. The other side of the inter-element connecting section 231 is connected to the current extraction electrode 15 of the adjacent element by the electric connection body 33. The connection is repeated to form a string in which the light receiving elements are connected in series. In a turning-back portion of the string, the main body section 232 of the inter-element connecting body 230 and the inter-element connecting section 231 of the inter-element connecting body 230 are connected as shown in FIGS. 24C and 24D. The elements are connected in this way, whereby a light receiving element module in which the light receiving elements are electrically connected shown in FIGS. 22, 23, 30A, and 30B is formed.

The inter-element connecting section 231 of the inter-element connecting body 230 can be seen from the light receiving surface side, together with the light receiving element 310 and the rear surface side main face material 25. Therefore, the inter-element connecting section 231 affects an external appearance. To blacken the external appearance of the entire module viewed from the light receiving surface side, a portion of the inter-element connecting section 231 of the inter-element connecting body 230 seen from the surface can be covered with an insulator, which absorbs light having a wavelength of 500 to 600 nanometers, to look black. As a material for the blackening, resin or a tape containing a perylene pigment or copper oxide or the like formed by oxidizing the surface of the inter-element connecting section 231 of the inter-element connecting body 230 using copper can be used. When the main body section 232 of the inter-element connecting body 230 larger than the light receiving element 310 is used, a part of the main body section 232 is seen from the light receiving surface side. Therefore, the same treatment can be applied to at least the portion seen from the light receiving surface side.

In the light receiving element with the inter-element connecting body in the third embodiment, as indicated by a relation between the light receiving element and the bonding layer shown in FIG. 26 and a plan view in FIG. 28, the dot-like electrode 12D and the current collecting electrode 14 of the element are hidden by the main body section 232 of an element connecting body 230 and the bonding layer 26 and is not exposed to the surface of the light receiving element with the inter-element connecting body. In this case, because the element electrode is covered with the metal or the resin, for example, intrusion of moisture from the outside decreases and reliability and durability are improved.

As another form, the main body section 232, which is the element rear portion, of the inter-element connecting body 230 can be entirely or locally bonded to the light receiving element via the bonding layer 26. The bonding layer 26 does not always need to be provided.

The electric connection body 33 can be the same as or different from the electric connection body 21. However, it is preferable that the electric connection body 33 can be connected at temperature lower than the temperature for connection of the electric connection body 21. For example, the electric connection body 21 can be tin/silver solder and the electric connection body 33 can be tin/bismuth solder. Other than the solder, as the electric connection bodies 21 and 33, a conductive polymer, conductive resin paste including metal particles, a conductive tape, and the like can be used.

When a plurality of light receiving elements are not connected and only one light receiving element is modularized, the current extraction electrode 15 and the inter-element connecting section 231 of the inter-element connecting body 230 shown in FIG. 31 only have to be sealed by a sealing material, which is translucent to light in an absorption wavelength region of the light receiving element, in a state in which the current extraction electrode 15 and the inter-element connecting section 231 are respectively connected to different conductors and the conductors are drawn out from the sealing material. When the light receiving element is connected to a printed board or the like, the light receiving element can connected to the printed board or the like using the inter-element conductor.

To give high bonding strength between the light receiving elements 310a to 310f (hereinafter also referred to as light receiving element 310) and the inter-element connecting body 230 and insulate the current collecting electrode 14 on the light receiving element 310 and the inter-element connecting body 230, a portion other than a soldered portion between the inter-element connecting body 230 and the light receiving element 310 is bonded by the bonding layer 26. Specifically, resin such as ethylene vinyl acetate, polyimide, or epoxy containing a filler can be used. The filler can be contained for the purpose of bringing a coefficient of thermal expansion of the bonding layer 26 close to the coefficient of thermal expansion of the light receiving element. Glass can be used as the material of the bonding layer 26.

As the bonding layer 26, a material not absorbing light as much as possible is desirably used to reflect light, which is transmitted through the light receiving element 310, on the inter-element connecting body 230 or the bonding layer 26 and make the light incident on the element again. The bonding layer 26 can have a light reflection or light scattering function to make the light incident on the light receiving element 310 again. As the bonding layer 26, ethylene vinyl acetate or the like containing titanium dioxide particles of about several hundred nanometers at high concentration can be used. The size of the filler or the light-scattering inorganic particles used here is preferably smaller than about a half compared with the distance between the element and the inter-element connecting body 230. To give light scattering property, it is preferable to set the size to a particle diameter about a half of a wavelength of light desired to be scattered.

In the formation of the bonding layer 26, first, a solder layer is formed on the dot-like electrode 12D. Then, the solder layer is heated and cooled while sticking together the main body section 232 of the inter-element connecting body 230 and the rear side of the light receiving element 310. Consequently, the solder is once melted to electrically connect the main body section 232 equivalent to the element rear portion of the inter-element connecting body 230 and the dot-like electrode 12D on the light receiving element. Thereafter, an epoxy precursor is supplied to between the main body section 232 of the inter-element connecting body 230 and the element rear surface, which are stuck together, using the capillary phenomenon. Thereafter, the solder layer is heated again and an epoxy monomer is polymerized and hardened. Consequently, the main body section 232 of the inter-element connecting body 230 and the light receiving element 310 can be bonded.

In this case, the melting point of the electric connection body 21 is preferably substantially the same as or higher than the melting temperature of the bonding layer 26. As the epoxy precursor, an epoxy precursor having low viscosity and high fluidity is preferable. Besides, an epoxy resin precursor is applied to the portion excluding the dot-like electrode 12D as shown in FIG. 26 on the rear surface side of the light receiving element, in which a solder layer is formed on the dot-like electrode 12D in advance. The epoxy resin precursor is heated and cooled while being stuck together with the main body section 232 of the inter-element connecting body 230, whereby the solder is once melted to electrically connect the main body section 232 of the inter-element connecting body 230 and the dot-like electrode 12D on the element and polymerize and harden epoxy resin serving as the bonding layer 26. Consequently, it is possible to bond the main body section 232 of the inter-element connecting body 230 and the light receiving element 310. In this case, the melting temperature of the bonding layer 26 is preferably substantially equal to or higher than the melting point of the electric connection body 21. The epoxy resin precursor is preferably an epoxy resin precursor having viscosity and low fluidity.

The bonding layer 26 is formed to be left in a line shape as shown in FIG. 26. Consequently, electrical connection of the dot-like electrode 12D and the main body 232 of the inter-element connecting body 230 is not hindered. On the other hand, it is possible to keep insulation between the current collecting electrode 14 and the main body section 232 of the inter-element connecting body 230.

One end of the inter-element connecting section 231 of the inter-element connecting body 230 is connected to the current extraction electrode 15 formed on the rear surface of the light receiving element 310. The other end is connected to the main body section 232 of the inter-element connecting body 230. The main body section 232 is connected to the dot-like electrode 12D on the element formed on the rear surface side of the light receiving element 310b different from the light receiving element 310. Consequently, electrical connection between the adjacent two light receiving elements 310 is attained. The inter-element connecting body 230, the current extraction electrode 15 of the light receiving element 310, and the dot-like electrode 12D of another light receiving element 310 are connected by the electric connection bodies 21 and 33.

In this way, the light receiving elements 310 are connected by the inter-element connecting body 230. Consequently, as shown in FIGS. 22 and 23, a string in which the light receiving elements 310a, 310b, and 310c are linearly connected is formed. In the elements at turning-back points of the string corresponding to 310c and 310d in FIGS. 22 and 23, as shown in FIG. 24C, the inter-element connecting section 231 of the inter-element connecting body 230 is connected at 90 degrees with respect to a direction in which the string extends. Consequently, it is possible to turn back the direction of the string. In this way, the linear string formed by the light receiving elements 310a, 310b, and 310c and the linear string formed by the light receiving elements 310d, 310e, and 310f are connected by the inter-element connecting section 231 of the inter-element connecting body 230. Consequently, an element array of the light receiving element module 1 in which the two string rows shown in FIGS. 22 and 23 are connected in series is formed.

The light receiving elements 310a and 310f at the terminal ends of the light receiving element module 1 are connected to the current draw-out lines 38 for extracting an electric current from the light receiving element module 1. At the terminal ends of the elements configuring the module, the current draw-out lines 38 are directly connected to the main body section 232 of the inter-element connecting body 230. Therefore, the shape of the inter-element connecting body 230 of the light receiving element 310f is different from the shape of the other light receiving elements 310b to 310e and is the shape of only the main body section 232 of the inter-element connecting body 230.

In the light receiving element 310a, the current draw-out line 38 is connected to the current extraction electrode 15 portion through the electric connection body 21. In the light receiving element 310f, the current draw-out line 38 is connected to the main body section 232 portion of the inter-element connecting body 230 through the electric connection body 21.

The sealing materials 22 such as sheet-like ethylene vinyl acetate resin sheets are formed on the front surface side and the rear surface side of the light receiving element array including the two rows of strings shown in FIGS. 22 and 23. The front surface side main face material 23 such as glass is bonded to the front surface side via the sealing material 22. The rear surface side main face material 25 such as a weather resistant polyethylene terephthalate resin sheet is bonded to the rear surface side.

Although not shown in FIGS. 22 and 23, the structure held between the light receiving surface side main face material 23 and the rear surface side main face material 25 is supported by the frame made. The current draw-out line 38 is drawn out to the rear surface via the connection box from the gap between the sealing material 22 and the rear surface side main face material 25. The light receiving element module 1 is configured.

Manufacturing Method

Figure 33A:
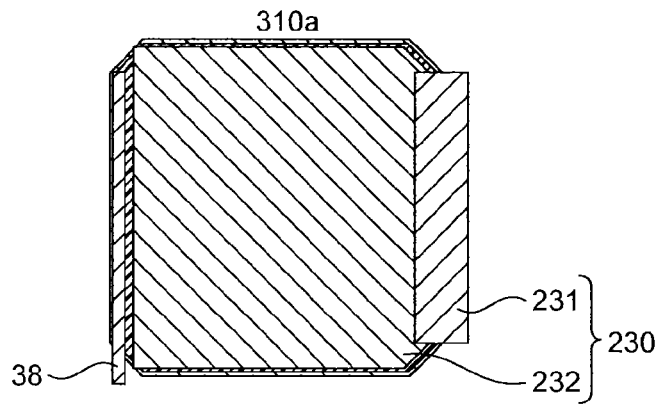
FIG. 33A is a schematic plan view of the example of the procedure of the manufacturing method for the light receiving element module according to the third embodiment.
Figure 33B:
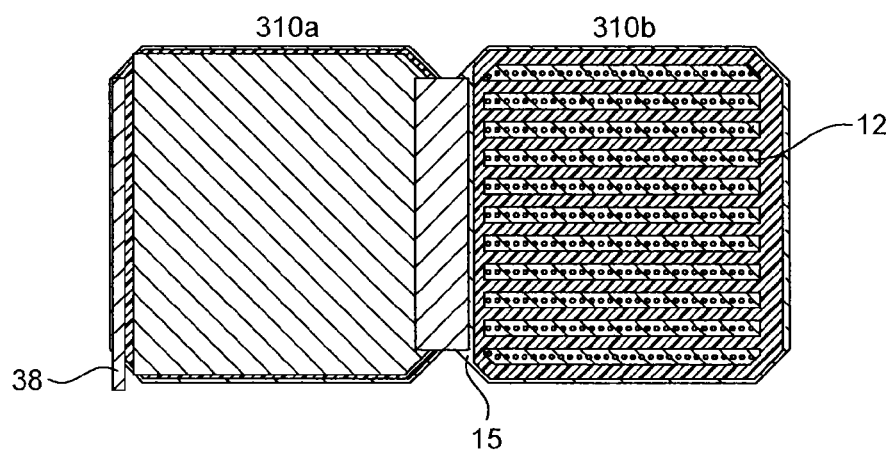
FIG. 33B is a schematic plan view of the example of the procedure of the manufacturing method for the light receiving element module according to the third embodiment.

A manufacturing method for the light receiving element module 1 according to the third embodiment is explained with reference to an example in which a single crystal silicon solar battery is used. FIG. 32 is a flowchart for explaining an example of a procedure of the manufacturing method for the light receiving element module according to the third embodiment. FIGS. 33A and 33B are schematic plan views of the example of the procedure of the manufacturing method for the light receiving element module according to the third embodiment. In this example, the light receiving element module 1 shown in FIGS. 22 and 23 is manufactured using, as the light receiving element, a single crystal silicon solar battery having a substantially square shape 156 millimeter lengthwise and breadthwise including silver electrodes of a pattern such as the dot-like electrode 12D, the current extraction electrode 15, and the current collecting electrode 14 shown in FIG. 25A on the rear surface.

Manufacturing Method for the Light Receiving Element

A more detailed sectional view of the light receiving element with the main body section 232 of the inter-element connecting body 230 after completion is shown in FIG. 31. A manufacturing method for the light receiving element is briefly explained with reference to FIG. 31. First, an n-type single crystal silicon substrate is prepared as the element substrate 11 sliced on 100 plane. The surface of the element substrate 11 is dissolved about 10 micrometers in an alkali solution such as a KOH water solution. Then, the element substrate 11 is immersed and cleaned in a mixed solution of sulfuric acid and hydrogen peroxide and then in a mixed solution of hydrochloric acid and hydrogen peroxide. Thereafter, the substrate is heated to about 800° C. to 900° C. in a $POCl_3$ atmosphere to diffuse phosphorus on the surface of the element substrate 11. Phosphorus glass formed on the surface is removed in a hydrofluoric acid solution. Subsequently, a silicon oxide film is formed on one surface of the substrate by a chemical vapor deposition (CVD) method. As the material of the silicon oxide film, silane, TEOS (Tetra Ethyl Ortho Silicate), and the like can be used. Subsequently, a silicon nitride film is deposited on the silicon oxide film by a plasma-assisted CVD method.

On the surface of the element substrate 11 on which the silicon nitride film and the silicon oxide film are formed (hereinafter referred to as rear surface), an acid-resistant resist is applied to be the same pattern as that of the contact holes 12h of the dot-like electrode 12D shown in FIGS. 25A and 26 and the element substrate 11 shown in FIG. 25B. Thereafter, the element substrate 11 immersed in a hydrofluoric acid water solution to remove the silicon nitride film and the silicon oxide film other than resist applied sections. The element substrate 11 is immersed in a mixed water solution of hydrofluoric acid and nitric acid to etch the silicon substrate in portions other than the resist applied sections and remove a phosphorus diffused layer on the substrate surface. The solution used for the etching can include acetic acid to prevent micro unevenness from being formed on the silicon surface in the etching. Alternatively, for example, a solution in which hydrofluoric acid, nitric acid, and acetic acid are mixed called $CP_4A$ can be used. Subsequently, the substrate is immersed in an organic solvent or an alkali water solution to remove the acid-resistant resist.

After a silicon oxide film is formed on the rear surface side by the CVD method again, gasses such as chloride ($Cl_2$), sulfur hexafluoride ($SF_6$), and oxygen ($O_2$) are introduced between electrodes in a chamber, a high-frequency voltage is applied to the gasses to change the gasses to a plasma state. The silicon oxide film is etched in the atmosphere. In this case, by setting the temperature of the substrate to a low temperature, etching conditions are selected to perform the etching as anisotropic etching. Consequently, the etching mainly progresses in a horizontal section other than a silicon sidewall on the element substrate 11. In this way, the silicon oxide film of the horizontal section in concave sections on the substrate rear surface is mainly removed to expose the silicon substrate only the horizontal section of the concave sections on the substrate rear surface. Thereafter, the element substrate 11 is immersed in the hydrofluoric acid water solution and then immersed in a potassium hydroxide water solution at about 80° C. to remove silicon including plasma damage. In this case, the height of convex sections with respect to the concave sections on the substrate is determined by the etching amount in a vapor phase and in alkali. The height of the dot-like electrode 12D with respect to the element substrate 11 can be set higher compared with the current collecting electrode 14 and the current extraction electrode 15 to be formed later. In this way, the height of the negative electrode and that of the positive electrode on the element electrodes are set different. Consequently, it is possible to use more easily inexpensive planar metal as the main body section 232 of the inter-element connecting body 230. For example, in the first embodiment, because the level difference between the positive electrode and the negative electrode on the element is small, the main body section 232 of the inter-element connecting body 230 needs to project to the element side in the positive electrode portion of the element. However, in this embodiment, it is possible to reduce or eliminate the projection.

The element substrate 11 is immersed in the hydrofluoric acid water solution in a short time to remove the natural oxide film on the substrate surface while leaving the oxide film formed near the semiconductor substrate convex sections with the CVD method. Thereafter, the substrate is heated to 900° C. to 1000° C. in a nitrogen gas atmosphere through $BBr_3$ to diffuse boron on the substrate surface. During the time in which a silicon oxide film formed by the CVD method is not removed, the substrate is immersed in the hydrofluoric acid water solution to remove boron glass formed on the substrate surface and, at the same time, expose, on the surface, a silicon nitride film partially formed in the preceding step.

After the silicon nitride film is removed by immersing the semiconductor substrate in heated phosphoric acid, a silicon oxide film is formed on the substrate rear surface by the CVD method and a silicon nitride film is formed on the silicon oxide film. Thereafter, the substrate is immersed in the hydrofluoric acid water solution for a short time and, then, immersed in a potassium hydroxide water solution at about 80° C. to 90° C. including about 1 to 5% of isopropanol, whereby a pyramid-type structure mainly formed by silicon 111 plane is formed on the surface as a texture. The substrate is heated to about 800° C. to 900° C. in a $POCl_3$ atmosphere to diffuse phosphorus on the silicon surface on the front side of the substrate. Phosphorus glass formed on the surface is removed in a hydrofluoric acid solution.

Subsequently, the substrate is heated to about 800° C. to 1100° C. in an oxygen atmosphere to oxidize the substrate surface about 20 to 30 nanometers. Thereafter, a silicon nitride film is formed on the front surface side to form a reflection prevention film. An acid-resistant resist is applied to portions other than the portions where the dot-like electrode 12D, the current collecting electrode 14, and the current extraction electrode 15 are formed on the rear surface shown in FIG. 25A or portions other than portions equivalent to the contact holes 12h and 14h shown in FIG. 25B. Thereafter, the substrate is immersed in hydrofluoric acid to remove the oxide film in electrode forming portions and expose the silicon surface. The remaining oxide film becomes a passivation film.

Manufacturing Method for Element Electrodes

Thereafter, after aluminum (Al) and nickel are vapor-deposited on the rear surface of the substrate, the resist and the aluminum on the resist are removed in an organic solvent such as acetone. The silicon substrate serving as the element substrate 11 is heated at about 150° C. to 400° C., whereby the electors and the substrate surface are made fit with each other to reduce contact resistance and connect the silicon substrate and the aluminum. As shown in FIG. 31, first layers 12a and 14a and second layers 12b and 14b of the dot-like electrode 12D and the current collecting electrode 14 are formed. As metal forming the electrode first layers, silver, nickel, and the like can be used besides aluminum. As metal used for the electrode second layers, chrome, titanium, titanium tungsten, palladium, and the like can be used besides nickel. An insulating layer can be formed on the current collecting electrode 14 to improve insulation between the element electrodes and between the element electrode and the main body section 232 of the inter-element connecting body 230. A cross section of the light receiving element with the inter-element connecting body in this case is a structure shown in FIG. 31. In such a structure, because an insulating layer 26c is present, even if the main body section 232 of the inter-element connecting body 230 warps, the main body section 232 does not come into direct contact with the current collecting electrode 14. Therefore, it is possible to keep insulation. As a paste forming such an insulating layer, for example, there is HP-300 manufactured by Hitachi Chemical Co., Ltd.

In the light receiving element according to the third embodiment, to improve the current extraction efficiency, it is necessary to set the diffusion length of a small number of carriers larger than the distance between the element electrodes. Therefore, the element surface is inactivated (passivated). Therefore, in the above explanation, the silicon oxide film is used as the passivation film. Recombination of carriers tends to occur in contact portion of the electrodes on the element rear surface and silicon. Therefore, a contact area of the electrodes and the silicon is reduced as much as possible to increase an area occupied by the passivation film. This leads to improvement of the photoelectric on conversion efficiency. Therefore, in the third embodiment, the contact of the electrode and the silicon is performed only in the electrode pattern portions shown in FIG. 25A or 25B by the process explained above.

Thereafter, for example, a paste containing silver particles equal to or smaller than several hundred nanometers and capable of forming a conductor by heating at about 200° C. is applied in the shape of the dot-like electrode 12D, the current collecting electrode 14, and of the current extraction electrode 15 using the screen printing method. Thereafter, third layers 12c and 14c of the negative electrode and the positive electrode are formed by heating the paste at about 200°. The thickness of the electrodes is increased to reduce current collection resistance in the current collecting electrode 14. It is preferable to use, as such a conductor, a conductor having a low Young's modulus such as epoxy containing silver in, in particular, a fourth layer 12d from the viewpoint that it is possible to reduce stress due to a difference in a coefficient of thermal expansion between the light receiving element substrate and the inter-element connecting body. When unevenness on the rear surface of the light receiving element substrate is large and printing by the screen printing is difficult, sputtering or the like can be used. It is also possible to increase the height of only the negative electrode side by adding an electrode layer only on the negative electrode side by the screen printing. In this way, it is possible to form a back connected element in which the dot-like electrode 12D portion of the substrate and the dot-like electrode 12D itself project on the rear surface compared with the other portions.

In the third embodiment, to form the dot-like electrode 12D higher than the other electrode portions, selective plating is used for the formation of the fourth layer 12d. For example, in a solution including tin ions or silver ions, by applying electrolytic plating for supplying electricity from the current collecting electrode 14 and the current extraction electrode 15 on the positive electrode side while irradiating light having a wavelength equal to or smaller than 1300 nanometers and equal to or larger than 300 nanometers, which is absorbed by silicon, from the front side of the light receiving element, electroplating is applied to only the negative electrode side and the electrode height of only the dot-like electrode 12D portion is increased in a self-aligning manner. As a result, the fourth layer 12d of the negative electrode is formed only on the negative electrode side. It is possible to increase a difference in height between the positive electrode and the negative electrode of the element. It is possible to improve insulation between the positive electrode and the negative electrode of the element when modularized. By applying such electrolytic plating, it is possible to form metal having high wettability to melted solder on the surface. By setting the height of the negative electrode and the positive electrode on the element electrodes to be different in this way, it is possible to easily use inexpensive planar metal as the element rear portion (the main body section) 32A of the inter-element connecting body. Besides, such photoelectric plating can be applied in a solution including, for example, tin, lead, and copper.

As explained above, according to this embodiment, in the process for forming the light receiving element, the first and second electrodes are energized while light is irradiated on the light receiving element to generate a photoelectromotive force. Consequently, by immersing the light receiving element in a plating bath containing metal ions, metal is selectively deposited in the first electrode on the negative electrode side. A plating layer is formed such that the first electrode, which configures the negative electrode, is higher than the second electrode, which configures the positive electrode.

In this case, if necessary, silver electrode is not formed on the current collecting electrode 14 and the current extraction electrode 15 by the screen printing and aluminum is used as the material of metal used on the surface. Consequently, solder less easily adheres to the positive electrode on the rear surface of the light receiving element. Therefore, when the light receiving element is immersed in the melted solder bath, the solder can be selectively deposited on the portion of the dot-like electrode 12D. As a result, it is possible to connect, with the solder, only the dot-like electrode 12D on the rear surface of the light receiving element and the main body section 232 of the inter-element connecting body 230 and, on the other hand, not to connect the current collecting electrode 14 on the rear surface of the light receiving element and the main body section 232. It is possible to improve insulation between the electrodes and easily perform soldering. For the material forming the dot-like electrode 12D and the electric connection body 21, soft metal or a conductor is selected and the height of the material is set high. Consequently, it is possible to reduce stress due to a difference in a coefficient of thermal expansion between the light receiving element and the element rear portion (the main body section) of the inter-element connecting body because the dot-like electrode 12D and electric connection body 21 portions are distorted.

Thereafter, to form the electric connection body 21 only in the element electrode portion, the element is immersed in a heated and melted tin/silver solder bath, whereby only the element electrode portion is coated with the electric connection body 21 (tin/silver solder). As such tin/silver solder, for example, solder containing 3.5% of silver can be used.

In a state in which a region excluding the joining section of the first and second electrodes of the light receiving element is coated with the insulating layer, a solder layer can be formed in the joining section by immersing a part of all of the light receiving element in a solder bath. Consequently, it is easy to perform alignment in connecting the light receiving element and the inter-element connecting body.

After a level difference is formed between the first and second electrodes by photoelectrolysis plating or the like, in a state in which the region excluding the joining section of the first and second electrodes is coated with the insulating layer, a solder layer can be formed in the joining section by immersing a part or all of the light receiving element in the solder bath. Consequently, it is easier to perform alignment in connecting the light receiving element and the inter-element connecting body.

Structure of the Inter-Element Connecting Body

Subsequently, the main body section 232 of the inter-element connecting body shown in FIG. 27A is connected to the light receiving element manufactured as explained above. In the third embodiment, a sheet of aluminum cut in a shape shown in FIG. 27A is used as the main body section 232 of the inter-element connecting body. In the third embodiment, because the aluminum sheet is used, even if the surface is oxidized, the aluminum changes to alumina having high light transmissivity. Light is reflected by the aluminum inside the aluminum sheet base material. Therefore, it is possible to keep high reflectance and obtain excellent durability. In this embodiment, an aluminum oxide film having uniform thickness is formed on the aluminum sheet surface in advance by anodic oxidation or the like. Consequently, it is possible to cause interference of light using the aluminum oxide film and increase reflectance for the light transmitted through the light receiving element to be higher than the reflectance of aluminum alone. For soldering with the light receiving element in a later process, metal other than aluminum is connected to the surface of the inter-element connection body of a portion corresponding to the portion connected to the element electrode such that solder can easily adhere to the surface.

In this embodiment, as shown in FIG. 24A, nickel is formed by electrolytic plating or electroless plating in a pattern indicated by the convex sections 232R1 portion of the main body section 232 as shown in FIG. 24E. A film of nickel or tin is also formed by the electrolytic plating or the electroless plating in a portion equivalent to the connecting portion with the inter-element connecting section 231 of the inter-element connecting body 230 on a surface on the opposite side of the convex sections 232R1 portion. As such metal, metal such as tin and silver can be used. In the plating, if necessary, zincate treatment for immersing aluminum in a zinc solution can be performed. In this process, when nickel is used as the plating material, for the purpose of improving adhesion of melted solder after this process, copper or tin can be further plated on the nickel film. To form a metal pattern on an aluminum foil by plating in this way, the aluminum foil is cut in a desired pattern using a masking film or the like, the aluminum foil is stuck to an inter-element connecting body sheet, the aluminum foil is immersed in a phosphoric acid water solution to remove an aluminum oxide film on the surface and, then, plating is applied to the aluminum foil, and thereafter peel the masking film.

For the main body section 232 of the inter-element connecting body having high light reflectance, a copper foil, a silver foil, an alloy of aluminum and copper, and the like can be used besides aluminum. The copper foil can be used as it is. However, aluminum can be formed by electroplating, thermal spraying, vapor deposition, or the like in the portion other than the connecting portion of the copper foil and the dot-like electrode 12D of the element, for example, portions other than the convex sections 232R1 shown in FIG. 27A. By using the aluminum in a surface reflecting layer in this way, even if the surface is oxidized, the aluminum simply changes to alumina having high light transmissivity. Therefore, it is possible to keep high reflectance. Besides, for example, a copper foil to which an antioxidant such as benzotriazole is applied as a layer for preventing oxidation of the surface of copper (anti-oxidation film), a copper plate to which a coated cloth including an aluminum reflector such as Platinite R (manufactured by Kansai Paint Co., Ltd.) is applied, a copper foil partially stuck with an aluminum film by foil stamping, copper partially coated with polymer such as polyamide or fluorocarbon resin in a vacuum can be used. By immersing the main body section 232 of the inter-element connecting body, most of the surface of which on the side of the element electrode of the light receiving element is coated, in a solder bath, it is possible to selectively form a solder layer in un-coated portions. Therefore, by coating a reflector in a pattern of a reflection region in advance, it is possible to form a solder layer mainly in connecting portion with the element electrode on the inter-element connecting body. It is possible to improve solderability of the inter-element connecting body to the element electrode. A surface side (the rear surface side), which is not the connecting surface to the element, of the main body section 232 can be covered with resin such as polyimide excluding the connecting portion to the inter-element connecting section 231 of the inter-element connecting body. In such a case, an insulating layer is further added as an insulator on the rear surface side of the light receiving element module besides the sealing material 22 and the rear surface side main face material 25. Therefore, insulation of the light receiving element module is improved. In this case, it is possible to improve adhesion of the sealing material 22 and the element rear portion (the main body section) 232 of the inter-element connecting body 230.

In this way, it is possible to form an inter-element connecting body in which wettability to solder is high in the connecting portion of the inter-element connecting body and the element electrode and on the other hand, copper or aluminum is exposed to the surface in portions other than the connecting portion. The inter-element connecting body has high electric connectivity to the element electrode, high collection performance for an electric current from the element electrode, and is excellent in reflectivity of light transmitted through the element.

In the third embodiment, the main body section 232 is formed in size substantially the same as the light receiving element (the element substrate 11 for the light receiving element configuring the single crystal silicon solar battery) and in a shape substantially similar to the light receiving element. Desirably, as shown in FIGS. 25A and 25B, the main body section 232 is formed in a size and a shape slightly larger than a region where the dot-like electrode 12D and the current extraction electrode 13 having one polarity of the element and smaller than an outermost section of all of the current collecting electrode 14 and the current extraction electrode 15 having the other polarity. The main body section 232 of the inter-element connecting body can be, specifically, for example, a pseudo rectangle having a long side of 152 millimeters and a short side of 150 millimeters. Two corners forming one long side can be arcs formed at a radius of 98 millimeters. The thickness of the main body section 232 can be set to about 0.01 to 1 millimeter.

Separately from the main body section 232, the inter-element connecting section 231 of the inter-element connecting body that connects the light receiving elements forming the light receiving element module 1 is formed by a copper foil having, for example, width of about 3 to 10 millimeters, length of about 130 millimeters, and thickness of about 0.01 to 1 millimeter. The current draw-out line 38 made of a belt-like copper foil having, for example, width of about 3 millimeters, thickness of about 0.2 millimeters, and length of about 160 millimeters is formed in advance. At least connecting portion of these conductors with the element rear portion (the main body section) 232 of the inter-element connecting body is coated with tin/silver solder.

As the electric connection body 21, tin/bismuth solder, conductive resin, and the like can be used besides the tin/silver solder. The material of the electric connection body 21 has an effect that, when temperature necessary in forming the electric connection body 21 portion is lower, response to the light receiving element and the main body section 232 of the inter-element connecting body decreases when the temperature is lowered to the normal temperature after the joining of the connection body and it is possible to obtain a light receiving module having less bend of the light receiving element and excellent in strength and long-term reliability. Most of the surface side (the rear surface side), which is not the connection surface to the element, of the main body section 232 of the inter-element connection body and the inter-element connection body (e.g., 230e in FIG. 23) other than the electric connection section can be covered with resin such as polyimide or polyamide. For example, a film or a plate obtained by sticking together polyimide and copper can be used.

Connection Method Between the Inter-Element Connecting Body and the Element Electrode As a procedure for directly connecting the bonding layer 26 and the inter-element connecting body 230 on the semiconductor substrate on which the light receiving element is formed, in the third embodiment, the inter-element connecting body 230 is electrically connected to the light receiving element 310 and then the bonding layer 26 is formed. When the bonding layer 26 is formed in such order, as a precursor of the bonding layer 26, a precursor having low viscosity is used. The precursor of the bonding layer 26 is injected between the inter-element connecting body 230 and the element substrate 11, which are connected earlier by the capillary phenomenon, and then hardened. In this case, for the purpose of injecting precursor liquid of the bonding layer 26, one or a plurality of small holes can be opened in a part of the main body section 232 of the inter-element connecting body. Although depending on the thickness of the semiconductor substrate, when a silicon substrate is used as the semiconductor substrate, the bonding layer 26 desirably has high light transmissivity to light of about 900 to 1300 nanometers transmitted thorough silicon.

A connection method among light receiving elements is explained below with reference to an example in which six light receiving elements are connected in three sets and two rows. The light receiving element 310a, on the rear surface of which the element electrodes having the shape shown in FIG. 22 are formed, is set with the light receiving surface directed to the hot plate side heated to about 100° C. to 140° C. (step S301). Thereafter, the main body section 232 of the inter-element connecting body is arranged to be superimposed on the element rear portion on the non-light receiving surface side of the light receiving element 310a. The inter-element connecting section 231 of the inter-element connecting body, the connecting portion of which to the current draw-out line 38 and the main body section 232 of the inter-element connecting body coated with tin/silver solder is coated with the tin/silver solder, is set on the element main body 232 (step S302, FIG. 33A).

Subsequently, the temperature of the hot plate is raised to a connection temperature of the electric connection body 21 (step S303). In the case of the third embodiment, the temperature of the hot plate is set to temperature equal to or higher than the melting point of the tin/silver solder, for example, 230° C. The main body section 232 of the inter-element connecting body is pressurized toward the hot plate using diaphragm, foaming silicone rubber, or the like while being heated by the hot plate. In this case, if a loading jig (a stamper) in use has flexibility, when the main body section 232 is pressurized, in a portion without the electrode and the portion corresponding to the current collecting electrode 14 and the current extraction electrode 15 portion having small height, the stamper projects to the light receiving element side. In the dot-like electrode 12D portion, the stamper recesses. Therefore, the inter-element connecting body 230 easily comes into contact with the current collecting electrode 14 and the current extraction electrode 15. In order to prevent the contact, the insulative bonding layer 26 formed of zirconium particles, polyimide, polyamide, or the like is formed in the current collecting electrode 14 and current extraction electrode 15 portions in advance by the screen printing or the like to form a structure shown in FIG. 26. For example, to prevent the end of the inter-element connecting body from coming into direct contact with the outermost electrode of the current collecting electrode 14 of the element, an insulator of a thin sheet or tape made of PFA or the like can be held between the main body section 232 of the inter-element connecting body 230 in the outermost electrode portion of the current collecting electrode 14 and the light receiving element 310.

After the tin/silver solder adhering to the light receiving element, the inter-element connecting body 230, the inter-element-connecting section 231 of the inter-element connecting body, and the current draw-out line 38 is melted in advance by applying heat, the hot plate temperature is lowered to about 100° C. to 140° C. again, the melted solder is returned to a solid state. Consequently, the current draw-out line 38 from the module and the main body section 232 of the inter-element connecting body 230 are connected. The main body section 232 of the inter-element connecting body and the inter-element connecting section 231 are connected. The light receiving element is fixed in a state shown in FIG. 33A.

The connection is sequentially performed in this way. In this embodiment, as in the embodiment explained above, a connection process is divided into three. When another light receiving element to be connected is present (Yes at step S304), the processing returns to step S301. That is, the connection of the next light receiving element is divided into the following three cases: (1) the next light receiving element 310 is connected along the extending direction of the element string; (2) the next light receiving element 310 is connected in a direction different from the extending direction of the element string; and (3) the light receiving element 310f at the other end of the light receiving element module 1 is connected. The respective cases are briefly explained with reference to an example in which six light receiving elements are connected in three sets and two rows.

Connection Process 1

Figure 33C:
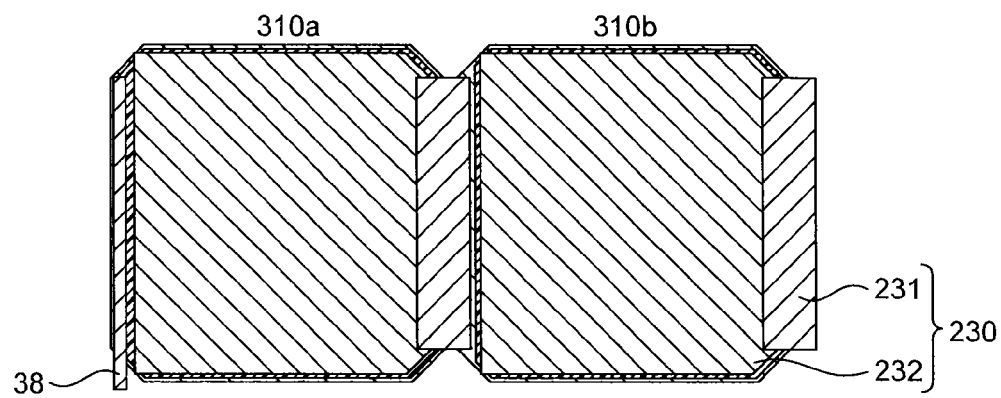
FIG. 33C is a schematic plan view of the example of the procedure of the manufacturing method for the light receiving element module according to the third embodiment.

In a connection process 1, the next light receiving element 310 is connected along the extending direction of the element string. The light receiving element 310a with the inter-element connecting body 230 having a structure shown in FIG. 33A, to which the main body section 232 of the inter-element connecting body 230 is connected, is removed from the hot plate and placed beside the hot plate. The light receiving element 310b is arranged on the hot plate. The inter-element connecting section 231 connected to the main body section 232 of the inter-element connecting body 230 on the light receiving element 310a is arranged to overlap the current extraction electrode 15 of the light receiving element 310b (FIG. 33B). The main body section 232 and the inter-element connecting section 231 of a new inter-element connecting body 230 is arranged on the rear surface of the light receiving element 310b not to overlap the inter-element connecting section 231. The temperature of the hot plate is raised to about 230° C. again while applying downward pressure to the light receiving element 310b on the hot plate (step S303) and then lowered to about 100° C. again, whereby the solder covering the inter-element connecting section 231 and a part of the main body section 232 of the inter-element connecting body 230 and the dot-like electrode 12D of the light receiving element is fused among the conductors. The inter-element connecting section 231 of the inter-element connecting body and the main body section 232 of the inter-element connecting body are connected, and the main body section 232 of the inter-element connecting body and the dot-like electrode 12D of the light receiving element are connected by the solder (the electric connection body 21) (FIG. 33C, a state at step S304). When the last light receiving element 310a is allowed to escape from the hot plate in this way, even if a new light receiving element 310b is heated together with the hot plate, the solder of the light receiving element 310a does not peel. In this case, the light receiving element 310a can be cooled by, for example, blowing cooling air to the light receiving element 310a or closely attaching an object having a large heat capacity on to the inter-element connecting body 230 on the light receiving element. In the above explanation, the pressure is applied using rubber or the like under the atmospheric pressure. However, a heating vacuum laminator can be used.

When an element is further connected, the processing returns to step S301. By repeating the procedure and repeating the process a desired number of times, string rows of the light receiving elements 310 can be formed.

Connection Process 2

Figure 34A:
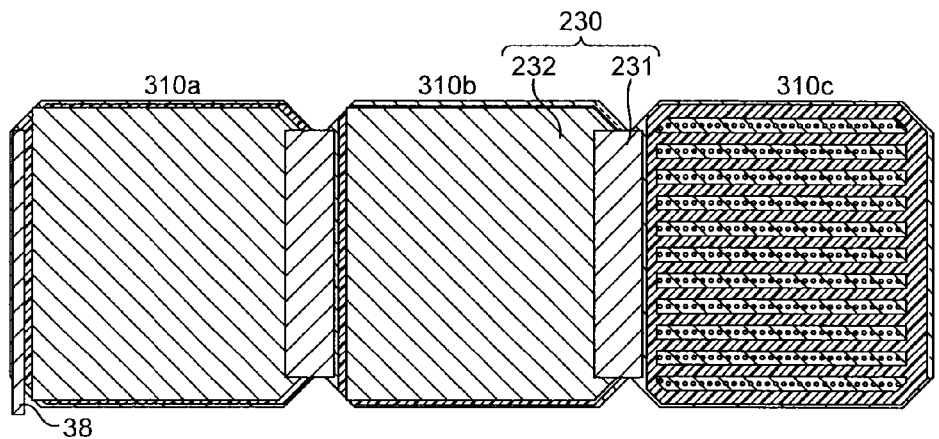
FIG. 34A is a schematic plan view of the example of the procedure of the manufacturing method for the light receiving element module according to the third embodiment.
Figure 34B:
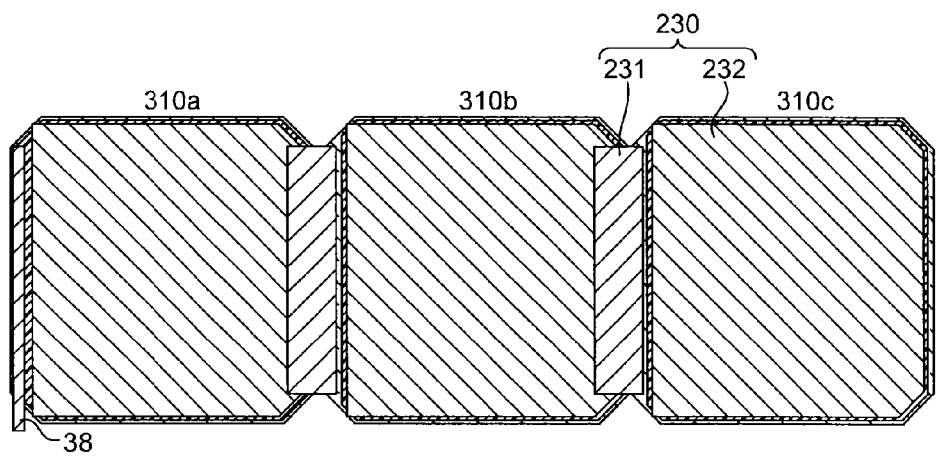
FIG. 34B is a schematic plan view of the example of the procedure of the manufacturing method for the light receiving element module according to the third embodiment.
Figure 34C:
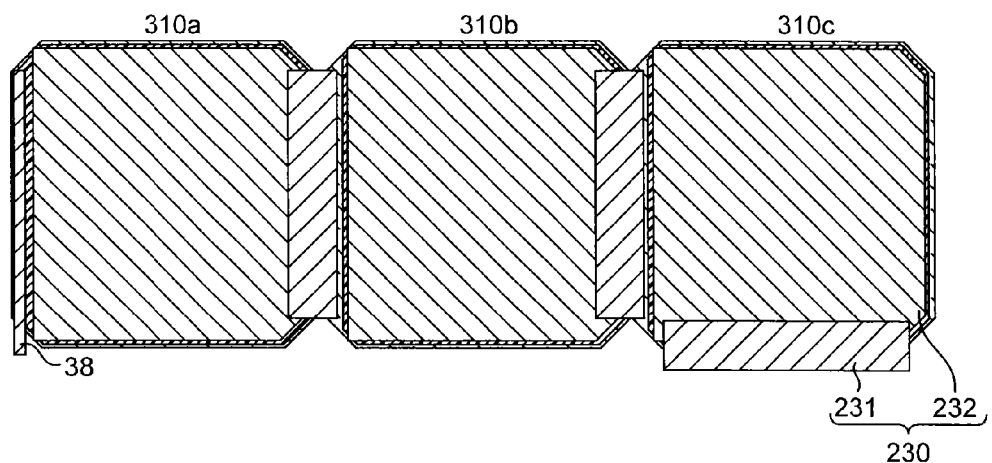
FIG. 34C is a schematic plan view of the example of the procedure of the manufacturing method for the light receiving element module according to the third embodiment.

In a connection process 2, the light receiving element 310 is connected in a direction different from the extending direction of the element string. In this case, after the light receiving element 310c at the turning-back point of the string is placed on the hot plate (step S301), at step S302, the inter-element connecting section 231 of the inter-element connecting body 230 connected to the main body section 232 of the inter-element connecting body 230 on the light receiving element 310b adjacent to the light receiving element 310c is arranged to overlap the current extraction electrode 15 of the light receiving element 310c (FIG. 34A). The main body section 232 of a new inter-element connecting body 230 is arranged on the light receiving element 310c (FIG. 34B). The above procedure is performed in the same manner as (1). When the inter-element connecting section 231 of the new inter-element connecting body 230 is arranged on the rear surface of the light receiving element 310c, as shown in FIG. 34C, the inter-element connecting section 231 is arranged in a direction rotated 90 degrees with respect to the arrangement of the inter-element connecting section 231 of the inter-element connecting body 230 in (1). The temperature of the hot plate, on which the light receiving element 310c is placed, is raised to about 230° C. again while applying downward pressure to the light receiving element 310c portion on the hot plate (step S303) and then lowered to about 100° C., whereby the solder covering the inter-element connecting section 231 and a part of the main body section 232 of the inter-element connecting body 230 and the dot-like electrode 12D of the light receiving element is fused among the conductors. The inter-element connecting section 231 and a part of the main body section 232 of the inter-element connecting body are connected and the main body section 232 of the inter-element connecting body 230 and the dot-like electrode 12D of the light receiving element are connected by the solder (the electric connection body 21) (fixed in a state shown in FIG. 34C and change to the state at step S304). In this way, the light receiving elements 310c and 310b are connected by the inter-element connecting body 230. In the light receiving element 310c, the inter-element connecting section 231 of the inter-element connecting body is connected in a state in which the inter-element connecting section 231 is turned-back 90° with respect to the string row.

Figure 35A:
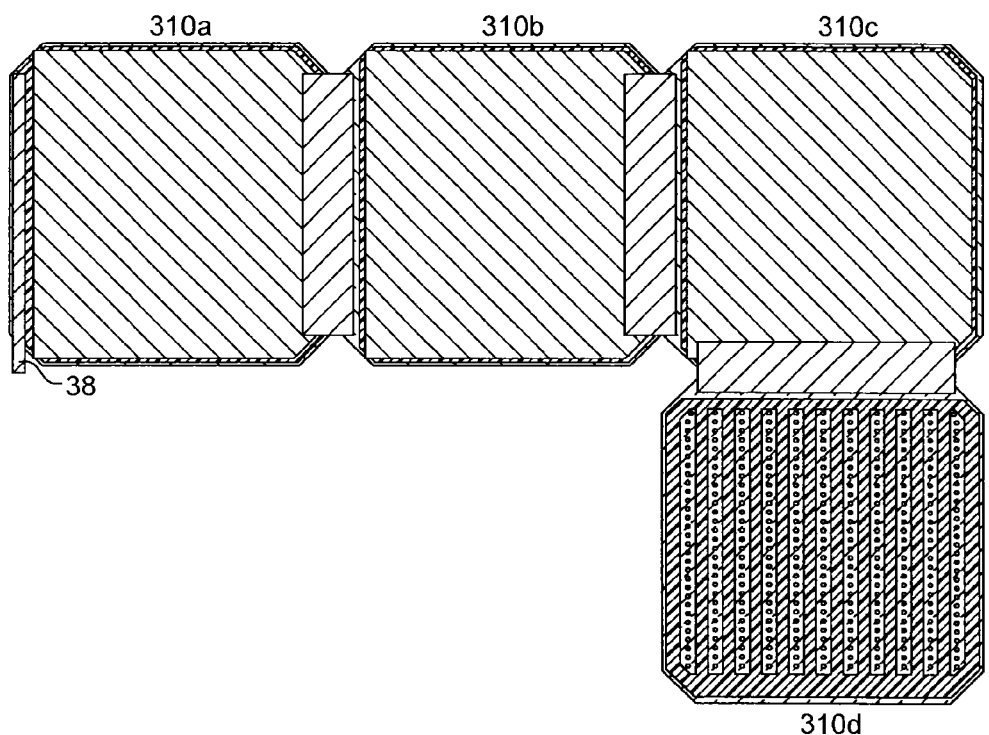
FIG. 35A is a schematic plan view of the example of the procedure of the manufacturing method for the light receiving element module according to the third embodiment.
Figure 35B:
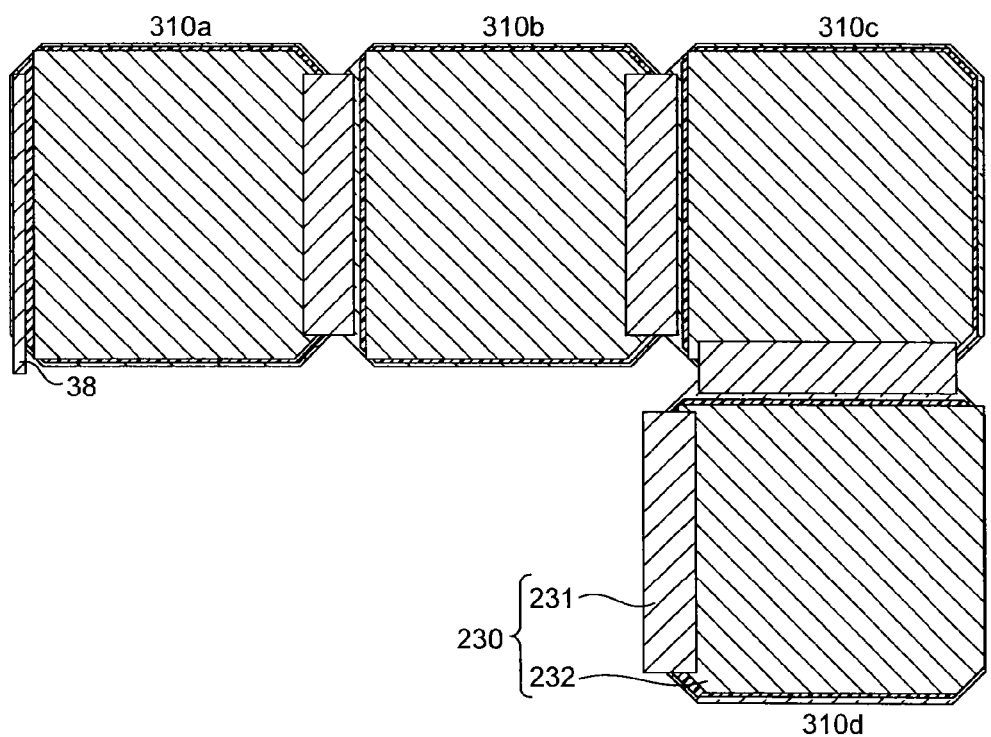
FIG. 35B is a schematic plan view of the example of the procedure of the manufacturing method for the light receiving element module according to the third embodiment.

Thereafter, the light receiving element 310c connected to the formed string row is dismounted from the hot plate and placed adjacent to the hot plate. The light receiving element 310d is arranged on the hot plate to be placed under the inter-element connecting section 231 of the light receiving element 310c (FIG. 35A, step S301). The inter-element connecting section 231 and the main body section 232 of a new inter-element connecting body 230 are arranged such that a part of the current extraction electrode 15 portion of the light receiving element 310d and the dot-like electrode 12D overlap (FIG. 35B, step S302). The hot plate is heated to about 230° C. and the inter-element connecting body 230 is pressurized toward the hot plate using a diaphragm, foaming silicone rubber, or the like, whereby the main body section 232 and the inter-element connecting section 231 of the inter-element connecting body 230 are connected, the current extraction electrode 15 of the light receiving element 310d and the inter-element connecting section 231 of the inter-element connecting body 230 are connected, and the dot-like electrode 12D of the light receiving element 310d and the main body section 232 of the inter-element connecting body 230 are connected (step S303). In the connection, the positions of the materials of the light receiving element 310d and the inter-element connecting body 230 are prevented from deviating. In this case, an insulating sheet can be inserted into the current collecting electrode 14 portion to prevent the end of the main body section 232 of the inter-element connecting body 230 from coming into direct contact with the current collecting electrode 14. The hot plate temperature is lowered to about 100° C. and the connection of one element is completed. The string row is turned back 90°.

At step S304, when elements are further connected to linearly extend the string, the elements only have to be connected by the inter-element connecting body in a procedure same as the connection process 1.

Connection Process 3

Figure 36A:
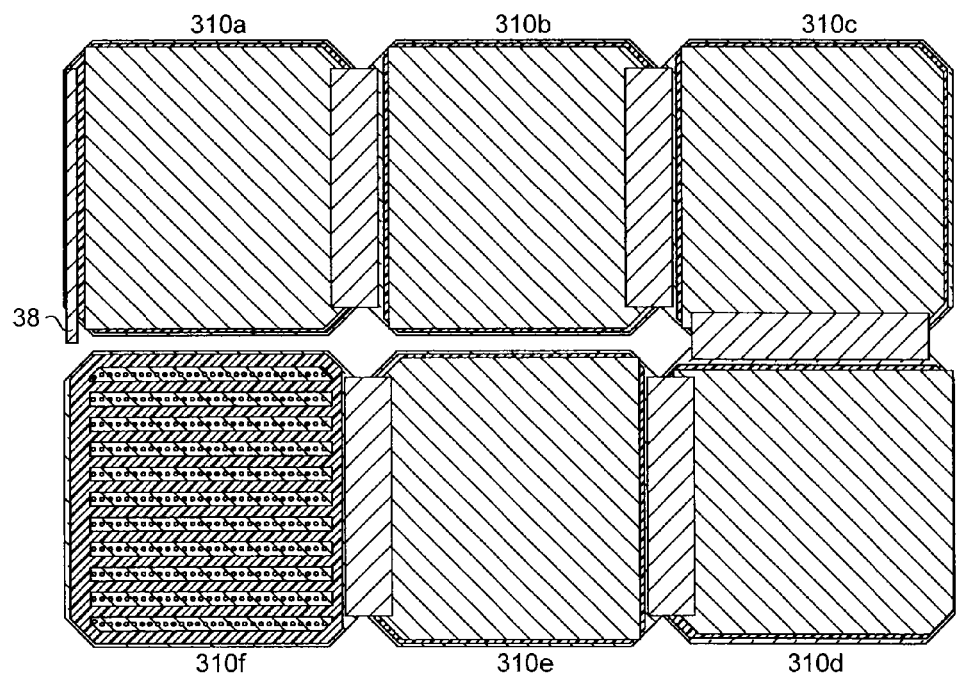
FIG. 36A is a schematic plan view of the example of the procedure of the manufacturing method for the light receiving element module according to the third embodiment.
Figure 36B:
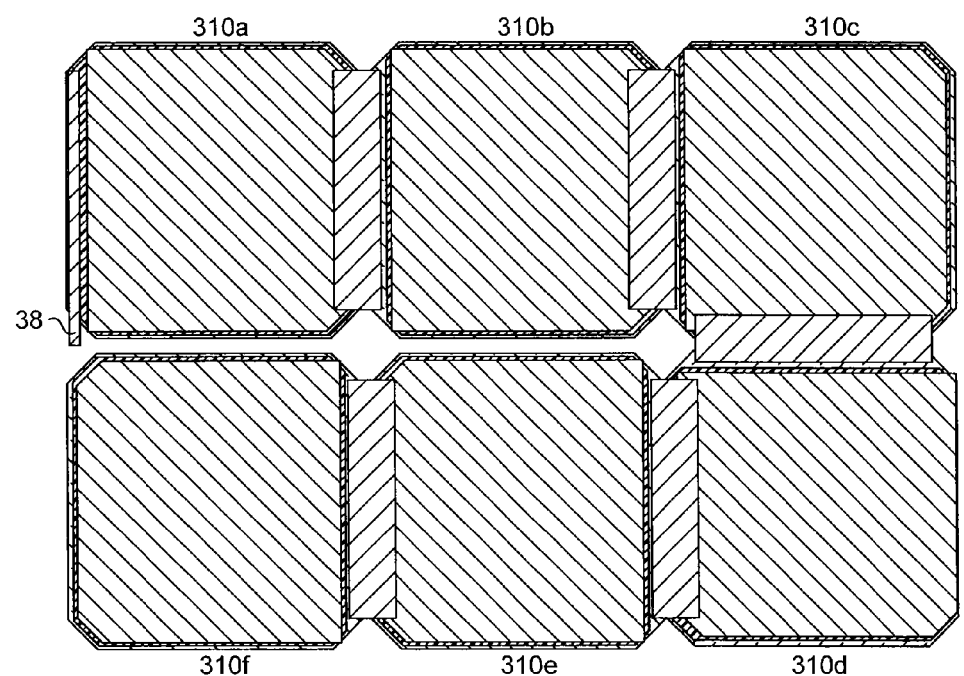
FIG. 36B is a schematic plan view of the example of the procedure of the manufacturing method for the light receiving element module according to the third embodiment.

In a connection process 3, the light receiving element 310f at the other end of the light receiving element module 1 is connected. In this case, the light receiving element (in the present case, the light receiving element 310e) at the end of the formed string row is dismounted from the hot plate and placed adjacent to the hot plate. The light receiving element 310f, to which the main body section 232 of the inter-element connecting body is connected in advance, is arranged on the hot plate with the light receiving surface directed to the hot plate side (step S301). The light receiving element 310f is arranged on the hot plate. The inter-element connecting section 231 of the inter-element connecting body 230 connected to the main body section 232 of the inter-element connecting body 230 on the light receiving element 310e is arranged to overlap the current extraction electrode 15 of the light receiving element 310f (FIG. 36A). The main body section 232 of a new inter-element connecting body 230 and the current draw-out line 38 are arranged on the rear surface of the light receiving element 310f in such a manner as not to overlap the inter-element connecting section 231 connected to the light receiving element 310e. The temperature of the hot plate is raised to about 230° C. again while applying downward pressure to the light receiving element 310f on the hot plate and the current draw-out line 38 portion (step S303) and then lowered to about 100° C. again, whereby the solder covering a part of the main body section 232 of the inter-element connecting body 230, the current draw-out line 38, and the dot-like electrode 12D of the light receiving element is fused among the conductors. The current draw-out line 38 and the main body section 232 of the inter-element connecting body are connected, the inter-element connecting section 231 of the inter-element connecting body and the main body 232 of the inter-element connecting body 230 are connected, and the main body section 232 of the inter-element connecting body 230 and the dot-like electrode 12D of the light receiving element are connected by the solder (the electric connection body 21) (FIG. 36B, the state at step S304). In this case, the light receiving element 310e can be cooled by, for example, blowing cooling air to the light receiving element 310e or closely attaching an object having a large heat capacity to the main body section 232 of the inter-element connecting body 230 on the light receiving element 310e. In the above explanation, the pressure is applied using rubber or the like under the atmospheric pressure. However, a heating vacuum laminator can be used.

The processes are repeatedly executed while being combined. When another light receiving element to be connected is absent at step S304 in FIG. 32 (No at step S304), the light receiving element array shown in FIGS. 22 and 23 is obtained. A larger light receiving element module can be formed by combining the processes explained above.

In the above explanation, the light receiving surface side of the light receiving element is set on the hot plate side and the inter-element connecting body is set on the light receiving element to connect the light receiving element. Conversely, it is also possible that the inter-element connecting body is set on the hot plate and the light receiving element is connected on the inter-element connecting body with the element rear surface directed toward the hot plate side. In particular, when the main body section 232 of the inter-element connecting body 230 is larger than the light receiving element, a positional relation between the light receiving element and the main body section 232 of the inter-element connecting body is easily seen. Therefore, it is better to arrange the main body section 232 of the inter-element connecting body on the hot plate side and connected.

Forming Method for the Boning Layer

Thereafter, an epoxy resin precursor including a silica filler as the bonding layer 26 is supplied to between each of the elements in the string row and the main body section 232 of each of the inter-element connecting bodies. As such a method, specifically, it is possible to use a method for supplying epoxy resin precursor containing liquid to each of the elements and the peripheral edge section of the main body section 232 of each of the inter-element connecting bodies 230 and then decompressing the entire element row in a chamber or the like. Consequently, the space between each of the elements and the main body section 232 of each of the inter-element connecting bodies are degassed. The epoxy resin precursor containing liquid intrudes into between each of the elements and the main body section 232 of each of the inter-element connecting bodies according to the capillary phenomenon. Thereafter, polymerization reaction of epoxy resin is advanced by heating the entire light receiving element row to about 100° C. to 150° C. to form the bonding layer 26. The viscosity of the precursor containing liquid is preferably low.

In this way, as shown in FIG. 26, it is possible to obtain the light receiving element module 1 including an element row including a light receiving element structure in which the bonding layer 26 covers the entire rear surface of the light receiving element and the main body section 232 (not shown in the figure) of the inter-element connecting body 230 and the current collecting electrode 14 (not shown in the figure) and the current extraction electrode 15 are insulated from each other. The bonding layer 26, which is such an insulating layer, mainly covers the current collecting electrode 14 and the current extraction electrode 15 excluding only a part of the current extraction electrode 15 of the element. The bonding layer 26 is not formed on the upper surfaces of the convex sections of the dot-like electrode 12D and does not hinder electrical connection between the main body section 232 of the inter-element connecting body and the dot-like electrode 12D. On the other hand, the bonding layer 26 insulates the main body section 232 of the inter-element connecting body and the current extraction electrode 15 and the current collecting electrode 14, which are the positive electrodes, of the light receiving element. For the bonding layer 26, a polymer such as epoxy resin is used that includes a filler such as silica, a polymerization initiator, and the like and a coefficient of thermal expansion of which is brought close to the coefficient of thermal expansion of the element substrate after polymerization. Consequently, it is possible to reduce contraction stress due to the main body section 232 of the inter-element connecting body, reduce a bend of the element, and manufacture a light receiving element module excellent in long life of the module. It is also possible to adopt a light receiving element module manufacturing method having an advantage of reducing an element crack during module formation. AlN or the like can be included in the bonding layer 26 as a filler to improve thermal conductivity. The main body section 232 of the inter-element connecting body can be used as a radiator plate. In this case, it is desirable that the surface area on the module rear surface side of the main body 232 of the inter-element connecting body is large.

In the third embodiment, the bonding layer 26 is formed after the light receiving elements and the main body sections 232 of each of the inter-element connecting bodies 230 are connected by the electric connection body 21 earlier. However, as in the first embodiment, the boning layer 26 can be formed before the elements are connected. As another forming method for the boning layer 26, it is also possible that resin or a resin precursor is arranged in advance in the shape shown in FIG. 26 of the rear surface side of the light receiving element, then, the inter-element connecting section 231 of the inter-element connecting body and the light receiving element are connected by the electric connection body 21, and then the elements are connected. In this case, when the inter-element connecting section 231 of the inter-element connecting body and the main body 232 of the inter-element connecting body and the light receiving element are connected, to avoid thermal decomposition of the resin of the bonding layer 26 and re-melting of the electric connection body 21, it is preferable to electrically connect them at lower temperature using an electric connection body having lower temperature. As such an electric connection body, for example, solder including silver, tin, bismuth, or indium, resin including silver particles, or a conductive bonding film can be used. Alternatively, it is preferable to use a material having high heat resistance as the resin of the bonding layer 26. As the bonding layer 26 used in such a process, ethylene vinyl acetate can be used. As the resin precursor, a polyimide monomer solution, an epoxy monomer solution, and the like can be used. Besides, as the bonding layer 26, polysulfone, polyimide, polyamide, polyether amide, polyamide imide, and the like that can resist high temperature can be used. An air gap can be formed without using the bonding layer 26.

By applying heat and pressure to the bonding layer 26 and the precursor of the bonding layer 26, the bonding layer 26 expands from the shape shown in FIG. 31 and fills a space between the light receiving element and the main body section 232 of the inter-element connecting body as shown in FIG. 31. In this way, when the electric connection body 21 is melted, to form the bonding layer 26, it is preferable to apply fixed temperature. However, it is preferable not to excessively raise the temperature and to reduce a heating time so that the resin is not excessively heated and decomposed. Thereafter, the light receiving elements, to each of which the main body section 232 of the inter-element connecting body is connected, are connected using the inter-element connecting section 231 of the inter-element connecting body. Consequently, it is possible to form the light receiving element module shown in FIGS. 22 and 23. When the bonding layer and the element rear portion (the main body section) of the inter-element connecting body are formed in such order, if necessary, electric characteristics of the element are evaluated in a state of a single element before the elements are connected. In such a manufacturing method, it is possible to evaluate electric characteristics including an effect of actual light reflection by the inter-element connecting body in the element back. Therefore, when an element module in which elements are connected in series is manufactured, it is possible to select elements having the same electric current in an actual environment and manufacture one module. It is possible to obtain a light receiving element module excellent in the photoelectric conversion efficiency. When the bonding layer 26 and the main body section 232 of the inter-element connecting body are formed in such order, it is possible to carry out the process up to the modularization of the elements in a state in which the main body section 232 of the inter-element connecting body is connected to the element rear surface. Therefore, it is possible to reduce the likelihood of occurrence of an element crack in a manufacturing process such as conveyance and lamination. In particular, when the element substrate 11 configuring the light receiving element 310 decreases in thickness to be equal to or smaller than about 150 micrometers, the strength of the element itself decreases and the likelihood of occurrence of an element crack increases. Therefore, the method is useful in a light receiving element including a thin light receiving element substrate. To support the light receiving element substrate, the thickness of the main body section 232 of the inter-element connecting body can be increased to be, for example, equal to or larger than 0.5 millimeter.

Besides these methods, before the bonding layer 26 is formed, the light receiving element and the main body section 232 of the inter-element connecting body can be connected. For example, it is also possible that the main body section 232 of the inter-element connecting body and the light receiving element 310 are heated to a degree at which the solder is not melted, pressure is applied to the resin or the resin precursor in a heated and fluidized state to feed the bonding layer 26 into between the light receiving element and the main body section 232 of the inter-element connecting body, and thereafter the temperature is lowered. Thereafter, the light receiving elements, to each of which the main body section 232 of the inter-element connecting body is connected, can be connected using the inter-element connecting section 231 of the inter-element connecting body to form the light receiving element module 1 shown in FIGS. 22 and 23.

Laminating Process

Thereafter, a laminated body is configured in which the sealing material 22 such as sheet-like ethylene vinyl acetate resin having size slightly larger than the light receiving element array and the front surface side main face material 23 such as glass are arranged on the front surface side of a light receiving element array configured by two rows of strings and the rear surface side main face material 25 (the back sheet) formed by the sealing material 22 such as sheet-like ethylene vinyl acetate resin having size slightly larger than the size of the light receiving element array, a sheet obtained by sticking together weather resistant polyethylene terephthalate resin and aluminum, and the like is arranged on the rear surface side of the light receiving element array. The laminated body is heated for about 20 minutes at temperature of 100° C. to 150° C. under decompression by a heating vacuum laminator, whereby the light receiving element array is sealed by the front surface side main face material 23 and the rear surface side main face material 25 (step S306).

In this case, holes are opened in the rear surface side main face material 25 and the sealing material 22 on the rear surface side. The two current draw-out lines 38 of the light receiving element module 1 are sealed in a state in which the current draw-out lines 38 are drawn out from the portions of the holes formed on the rear side of the light receiving element array. The current draw-out lines 38 can be drawn out from the hole portions of the rear surface side main face material 25. The current draw-out lines 38 are connected to the lead wires in the junction box (the connection box) and drawn out to the outside of the light receiving element module 1 through the cable connected to the junction box.

In particular, when the element substrate 11 configuring the light receiving element 310 decreases in thickness to be equal to or smaller than about 150 micrometers, the strength of the element itself decreases and the likelihood of occurrence of an element crack in a manufacturing process such as conveyance and lamination increases. In this case, the thickness of the main body section 232 of the inter-element connecting body is increased to be equal to or larger than, for example, about 0.5 millimeters. The element substrate 11 is supported by the main body section 232. Consequently, in the light receiving element in the third embodiment, it is possible to prevent an element crack and improve yield. In particular, even if an element crack during lamination is a crack of one element, the entire module becomes defective. Therefore, the structure of the present invention that can suppress the element crack is useful.

Modularization Process

Thereafter, a frame is bonded to the end of the sealed tabular light receiving element array and the junction box (the connection box) is bonded to the current draw-out line 38 portion using silicone resin or the like (step S307). In this way, the light receiving element module 1 can be obtained.

In the embodiment explained above, the inter-element connecting body having high reflectance of the surface is used. However, when necessity of increasing light reflectance of the inter-element connecting body is low, a conductive adhesive can be applied to the entire surface of the conductor having unevenness as shown in FIG. 27A or to only the convex sections 232R1 and pressed against the electrodes on the light receiving element to bond and connect the light receiving element.

As explained above, in the light receiving element module 1 according to the third embodiment, the dots in the dot-like electrode 12D, which configure the negative electrode having high conduction resistance compared with the positive electrode, and the inter-element connecting body 230 is directly electrically connected in the element rear portion. On the other hand, the inter-element connecting body 230 is insulated from the positive electrode (the current collecting electrode 14 and the current extraction electrode 15) having relatively small conduction resistance by the bonding layer 26. The current collection in the negative electrode is performed through the inter-element connecting body 230 having high electric conductivity formed to cover not only the dot-like electrode 12D but also the entire rear surface of the light receiving element. Therefore, it is possible to greatly reduce current collection resistance compared with not only when the current collection is performed through only the linear electrode but also Japanese Patent Application Laid-Open No. 2009-206366 in which the element electrode is formed over the entire rear surface. It is possible to improve the photoelectric conversion efficiency compared with the related art. Consequently, compared with performing the current collection in the element electrodes, it is possible to use elements having large size in the module. It is possible to obtain a light receiving element module excellent in the photoelectric conversion efficiency.

Similarly, in the third embodiment, thermal conductivity in the thickness direction and the plane direction of the light receiving element module is high and thermal resistance in radiating heat from the light receiving element is low.

Therefore, it is possible to keep the element temperature lower than the element temperature of the element disclosed in Japanese Translation of International Application No. 2010-521811. As a result, it is possible to obtain a light receiving element module excellent in the photoelectric conversion efficiency.

In the third embodiment, to connect the inter-element connecting body to the element in performing modularization, the inter-element connecting body only has to be bonded to fit the rear surface of the light receiving element substrate. Highly accurate alignment is unnecessary. It is possible to reduce the number of times of alignment. As a result, it is possible to improve alignment accuracy. It is possible to obtain a light receiving element module having a narrower electrode pitch and excellent in the photoelectric conversion efficiency. When the bonding layer 26 is formed before the main body section 232 of the inter-element connecting body and the element electrode of the light receiving element substrate are connected by the electric connection body 21, alignment is necessary. However, because the bonding layer 26 only has to be capable of covering most of one electrode of the positive and negative electrodes and expose a part of the other electrode as shown in FIG. 29, the alignment does not need to be highly accurate.

In the light receiving element module 1 according to the third embodiment, the dot-like electrode 12D, which configures one element electrode, projects further than the element electrode in the other polarity. Therefore, it is possible to connect the aluminum foil, which is the main body section 232 of the inter-element connecting body to only the dot-like electrode 12D without performing highly accurate alignment during modularization. Because the bonding layer 26 is formed after the main body section 232 of the inter-element connecting body is connected to the light receiving element 310, alignment is unnecessary. Because the bonding layer 26 functions as an insulating layer, it is possible to obtain a light receiving element with an inter-element connecting body and a light receiving element module excellent in insulation between the electrodes. Consequently, fine alignment between the inter-element connecting body and the element substrate, which is necessary in the light receiving element module disclosed in Japanese Patent Application Laid-Open No. 2001-189475, is unnecessary. It is possible to narrow the electrode pitch of the element electrode without depending on alignment accuracy. Therefore, it is possible to obtain a light receiving element with a connecting body and a light receiving element module having small internal resistance, having high carrier collection efficiency, and excellent in the photoelectric conversion efficiency.

In the light receiving element module 1 according to the third embodiment, as shown in FIGS. 29 and 30A and 30B, light transmitted through the element substrate 11 configuring the light receiving element, transmitted through the element electrodes (the dot-like electrode 12D, the current collecting electrode 14, and the current extraction electrode 15), and escaping to the outside of the substrate is reflected by the inter-element connecting body 230 and made incident on the element substrate. Consequently, it is possible to reduce a light transmission loss. It is possible to manufacture the light receiving element module 1 excellent in the photoelectric conversion efficiency. In this embodiment, the aluminum foil is provided on the rear surface side of the silicon substrate, which configures the light receiving element, as the main body section 232 of the inter-element connecting body 230. Only the bonding layer 26 having high translucency is present between the element substrate and the inter-element connecting body 230. The aluminum foil (the main body section 232 of the inter-element connecting body 230) has high reflectance to light having a part of wavelengths transmitted because the light absorption coefficient of the silicon substrate is small. Therefore, for example, even if light having a wavelength of about 900 to 1300 nanometers is transmitted to the rear surface of the silicon substrate, it is possible to make the light incident on the element again by the reflection by the inter-element connecting body 230. It is possible to greatly reduce a loss of the light.

In the light receiving element with the connecting body and the light receiving element module 1 according to the third embodiment, as shown in FIGS. 30A and 30B, the element electrodes (the dot-like electrode 12D, the current collecting electrode 14, and the current extraction electrode 15) can be covered with the metal (the main body section 232 of the inter-element connecting body) and the resin (the bonding layer 26 and the sealing material 22). Therefore, it is possible to reduce moisture reaching from the ambient environment of the light receiving element to the element electrode portions. Therefore, it is possible to prevent a short circuit due to migration of the element electrodes and a resistance increase due to electrochemical reaction. It is possible to provide a light receiving element with a connecting body and a light receiving element module excellent in long-term stability of the photoelectric conversion efficiency. This is important, in particular, in the case of a light receiving element having a small inter-element distance between the positive electrode and the negative electrode and having high photoelectric conversion efficiency.

In particular, in a light receiving element used outdoors, it is likely that moisture intrudes into sealing resin because of high humidity of the outdoor air, causes corrosion of electrode metal due to electrochemical reaction, and the resistance of electrode section increases. On the other hand, in the third embodiment, the element electrode is surrounded by the main body section 232 of the inter-element connecting body 230 mainly made of metal and the bonding layer 26. Moisture less easily reaches the element electrodes. Therefore, the receiving element with the connecting body and the light receiving element module are excellent in long-term photoelectric conversion efficiency.

In the third embodiment, as shown in FIGS. 22 and 23, the light receiving element can be rotated 90° and connected at the end of the string. It is possible to electrically connect strings using the inter-element connecting section 231 of the inter-element connecting body. Therefore, it is possible to reduce a non-power generation region that occurs when the inter-string connecting body 34 (FIG. 2) is provided at the outer edge portion of the light receiving element in the first embodiment and the like. It is possible to obtain a light receiving element module excellent in the photoelectric conversion efficiency.

In the third embodiment, the inter-element connecting body 230 is not formed in contact with the light receiving element 310, but the bonding layer 26 is present. Therefore, the bonding layer 26 reduces stress between the light receiving element 310 and the inter-element connecting body 230. It is possible to obtain a light receiving element and a light receiving element module reduced in a bend and excellent in strength. Therefore, a film stress crack and peeling do not occur in the element electrode.

In the third embodiment, the bonding layer 26 having a coefficient of thermal expansion close to the coefficient of thermal expansion of the element substrate 11 is provided between the main body section 232 of the inter-element connecting body and the light receiving element. Therefore, it is possible to reduce stress of the light receiving element and reduce a bend of the light receiving element. In the third embodiment, because the main body section 232 of the inter-element connecting body has the uneven structure, the main body section 232 can be relatively greatly deformed in boundaries of the unevenness, so that it is possible to reduce the stress and reduce the bend. The stress is reduced in this way and the main body section 232 of the inter-element connecting body can be present as an independent supporting body rather than a film on the substrate. Therefore, the thickness of the main body section 232 of the inter-element connecting body can be easily increased. Consequently, it is possible to obtain a light receiving element module structure having small current collection resistance and excellent in the photoelectric conversion efficiency. In particular, even when the light receiving element is thin, the main body section 232 of the inter-element connecting body reduces a bend of the element substrate 11, functions as a supporting body of the element substrate 11, and can suppress an element crack.

When the inter-element connecting body is formed thick and current collection resistance is reduced, stress applied to the light receiving element in the extending direction of the element electrode increases. In the third embodiment, it is possible to increase an electrode area used for current collection. As a result, it is possible to reduce the thickness of the inter-element connecting body. It is possible to reduce the stress applied to the element. It is possible to manufacture a light receiving element with a connecting body and a light receiving element module excellent in strength.

In the third embodiment, the main body section 232 of the inter-element connecting body 230 that contributes to current collection in the element is provided. The main body section 232 of the inter-element connecting body 230 has the surface that can reflect light transmitted through the element substrate. Therefore, it is possible to manufacture a light receiving element module in a smaller number of assembly processes for the inter-element connecting body that connects the elements. It is possible to obtain a method of manufacturing a light receiving element module excellent in the photoelectric conversion efficiency with a smaller number of processes.

In general, in the use of a solar battery, when electric currents are different among elements in the same light receiving element module, the photoelectric conversion efficiency of the entire module is deteriorated. Therefore, power generation characteristics are measured beforehand in a state of the element without the inter-element connecting body. Elements are selected to have the same electric current among the elements to manufacture a light receiving element module. When a reflector is present on the element rear surface, a photocurrent amount changes according to a gain obtained when light transmitted through the portion without the element electrode is reflected by the reflector on the element rear surface and made incident on the substrate. On the other hand, by using the solar battery module in the third embodiment, it is possible to evaluate the photoelectric current amount after connecting the main body section 232 of the inter-element connecting body to the element substrate 11 (the semiconductor substrate) and combine the elements having the same photocurrent amount to manufacture a module. Therefore, it is possible to bring power generation current value of each of the light receiving elements with inter-element connecting body closer to one another. As a result, with the manufacturing method in the third embodiment, a light receiving element having an extremely low power generation current value compared with the other light receiving elements does not exist in the string. Therefore, it is possible to improve the power generation efficiency of the light receiving element module 1 compared with the related art. Therefore, with the manufacturing method for the light receiving element module in the third embodiment, it is possible to reduce a difference in an electric current among the light receiving elements and increase the life of the light receiving elements.

If the method in this embodiment is used, the inter-element connecting body is connected for each of the light receiving elements. Therefore, it is unnecessary to perform alignment in modularization. An element in which the positive electrode and the negative electrode are short-circuited because of positional deviation can be reduced as the element alone. Therefore, it is possible to reduce wastes of the light receiving elements.

In the light receiving element module 1 according to the third embodiment, as shown in FIG. 27A, the tabular inter-element connecting body having unevenness is used. However, the inter-element connecting body 230 having a plane shape can be used. In the case of the inter-element connecting body having unevenness on the surface as in this embodiment, the negative electrode, which has the convex sections on the element substrate 11 for the light receiving element having unevenness on the element electrode on the back, and the inter-element connecting body are connected. On the other hand, the positive electrode, which has the concave sections, and the inter-element connecting body are spatially separated from each other and, in a final light receiving element structure, insulated by the bonding layer 26. Therefore, it is unnecessary to perform alignment between the element substrate and the inter-element connecting body. It is possible to narrow an interval between the positive electrode and the negative electrode of the element electrode. It is possible to obtain a light receiving element excellent in the photoelectric conversion efficiency. In the manufacturing method according to the third embodiment, after the connection of each of the element electrodes and the inter-element connecting body, the resin, the resin precursor, or the like in the fluidized state is fed into between each of the element electrodes and the inter-element connecting body, whereby the bonding layer 26, which is the insulating layer, is formed in a self-aligning manner. Therefore, alignment is unnecessary in forming the bonding layer 26.

In the manufacturing method in the third embodiment, only the negative electrode is projected in a self-aligning manner by photoelectrolytic plating. Therefore, it is possible to form only one electrode of the back connection-type light receiving element as the convex sections without performing alignment. In the light receiving element, the light receiving element with the connecting body, and the light receiving element module in the third embodiment, only the negative electrodes are projected in a self-aligning manner by the photoelectrolytic plating. Therefore, it is possible to form only one electrode of the back connection-type light receiving element as the convex sections without performing alignment. Therefore, it is possible to obtain a light receiving element module excellent in insulation, having high alignment accuracy, having a short inter electrode distance between positive and negative electrodes, and excellent in the photoelectric conversion efficiency.

According to the third embodiment, the main body section 232 of the planar inter-element connecting body is formed on the back of the element substrate. The inter-element connecting section 231 of another inter-element connecting body can be freely connected to the main body section 232. Therefore, the degree of freedom of a positional relation between the light receiving elements adjacent to each other is high. As a result, for example, as shown in FIGS. 22 and 23, it is possible to linearly connect the elements. It is possible to form one string with only one row of the light receiving elements. It is possible to manufacture a light receiving element module in which strings are turned back in an arbitrary number of rows and at arbitrary points.

In the first to third embodiments, the single crystal silicon substrate is used as the light receiving element. However, a polycrystal silicon substrate can be used. Even when a compound semiconductor substrate of gallium arsenide is used, the same effect is obtained. In the first to third embodiments, the elements are connected in series. However, the elements can be connected in parallel.

In the first to third embodiments, the element without a through-hole in the element substrate is used as the back connection-type element. However, a light receiving element of the back connection type in which a re-arrayed wire is formed on the back via, for example, a through-hole generally called emitter wrap through or metal wrap through can be used.

Modifications

Materials and structures in the first to third embodiments and modifications of the embodiments are specifically explained below in a practical manner.

Each of the inter-element connecting bodies 30, 130, and 230 is preferably made of a conductive foil or a conductive plate. At least material of the surface of each of the element rear portion (the main body section) 32A, the outer side portion 32B, and the main body sections 132 and 232 has preferably high reflectance in a wavelength region in which light absorptance of the light receiving element is low. On the other hand, on the surface of the connecting portion to the element electrode, it is preferable that wettability, adhesion, connectability, and the like to the electric connection body 21 is high. The material of the base material preferably has high electric conductivity and is soft metal for the purpose of a reduction of stress with the element. On the other hand, when the light receiving element substrate is thin, the material is preferably a material having strength for retaining the light receiving element substrate. To satisfy these different characteristics in different regions, the element rear portion (the main body section) 32A, 132, and 232 of each of the inter-element connecting bodies can be formed using different materials in respective sections of the base material of the main body section of the inter-element connecting body or the element rear portion, the connecting section to the light receiving element, and the surface portion of the inter-element connecting body other than the connecting section.

When the light receiving element is formed of silicon, as the base material of the main body section of the inter-element connecting body or the conductor of the element rear portion, a foil or a plate formed of iron, an iron nickel alloy, aluminum, copper, silver, gold, tin, or a combination of these kinds of metal is used. The surface of the base material is preferably a material having high reflectance to light in a wavelength region of 800 to 1300 nanometers depending on the thickness of the silicon. When the light receiving element and the main body section (the element rear portion) of the inter-element connecting body are electrically connected by solder, in a connecting portion of the light receiving element and the main body section, it is preferable to use a material having high wettability to solder.

When metal having high reflectance and having low wettability to solder is used as a base material 50 of the main body section of the inter-element connecting body, it is possible to use the base material itself as a light reflector. On the other hand, it is difficult to electrically connect the base material to the light receiving element. Therefore, it is desirable that metal that is easily electrically connected or has high solderability such as tin, copper, or silver is formed at least on the surface of the connecting portion to the light receiving element. As such metal, there is aluminum. Aluminum is a material having high light reflectance from visible to infrared regions. On the other hand, aluminum is easily oxidized and has low wettability to solder. Therefore, when aluminum is used as a material of the base material of the main body section (the element rear portion) of the inter-element connecting body, it is preferable to interpose a material having high connectability such as solder in the connecting portion to the element electrodes.

Modification 1

Figure 37:
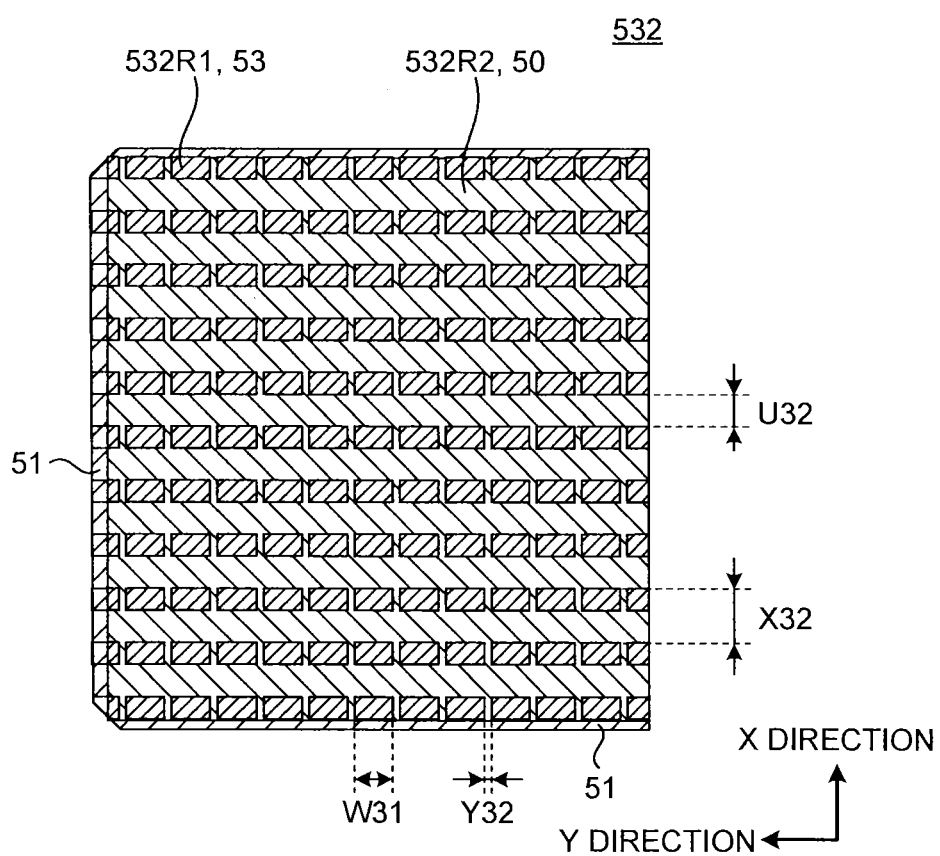
FIG. 37 is a plan view of a light receiving element with an inter-element connecting body in a modification 1 of the light receiving element module according to the third embodiment.
Figure 38:
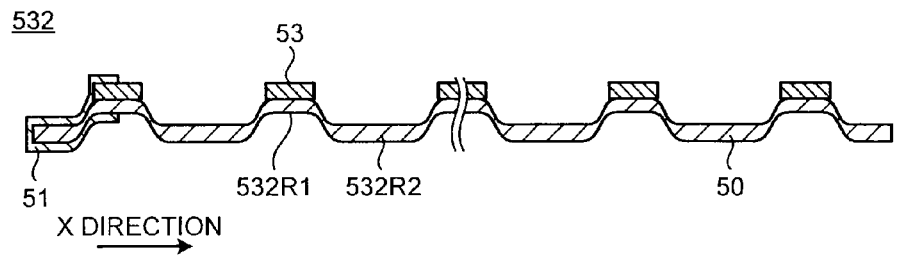
FIG. 38 is a sectional view of the light receiving element with the inter-element connecting body of the modification 1 of the light receiving element module according to the third embodiment.

A modification of the inter-element connecting body in the third embodiment having such an electric connection layer is shown in FIGS. 37 and 38. FIG. 38 is a sectional view taken along a surface including convex sections in the Y direction in FIG. 37.

A main body section 532, which is the element rear portion of the inter-element connecting body, shown in FIG. 37 includes, on the surfaces of each of the convex sections 532R1 on the base material 50 equivalent to the connecting portion to each of the element electrodes, as the electric connection body 21, an electric connection region 53 as a metal layer having high adhesiveness to solder on an aluminum surface along the arrangement of the dot-like electrode 12D of the element to connect the main body section 532 using solder. Consequently, it is possible to satisfactorily connect the main body section 532 to each of the element electrodes on the light receiving element even if aluminum having low solderability is used as the base material. On the other hand, aluminum has high reflectance. Even if aluminum is oxidized, deterioration in the reflectance less easily occurs. Therefore, a surface reflecting layer does not have to be formed. As such an electric connection region 53, specifically, a laminated body of nickel and tin can be used. The photoelectric conversion efficiency can be increased when a region where a reflector layer is formed is wider. Therefore, a region where the electric connection region 53 is formed is preferably narrower. The electric connection region 53 does not always have to be formed by breadth same as the convex sections 532R1 and can be formed in a region narrower than the convex sections 532R1. Reference numeral 51 is a plating layer configuring a connecting section for connecting the main body section 532 to the inter-element connecting section (not shown in the figure).

According to the modification 1, the electric connection region 53 is selectively formed in only connecting points to the element electrodes such as the dot-like electrode 12D of the light receiving element. Therefore, it is possible to secure a reflecting section and improve the photoelectric conversion efficiency.

Modification 2

Figure 39:
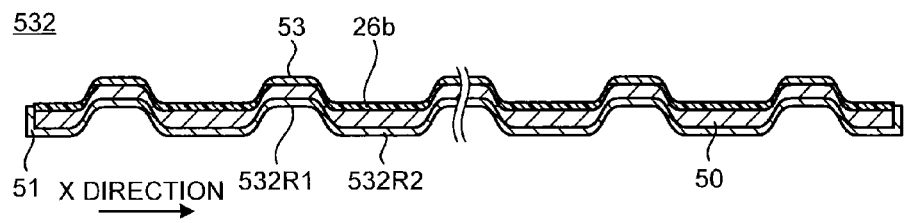
FIG. 39 is a sectional view of a light receiving element with an inter-element connecting body in a modification 2 of the light receiving element module according to the third embodiment.

As a modification of the element rear portion (the main body section) 532 of the inter-element connecting body including the base having high light reflectivity, an element rear portion having structure shown in FIG. 39 can be used. The element rear portion (the main body section) 532 of the inter-element connecting body shown in FIG. 39 includes an insulating layer 26b having high light transmissivity in portions not connected to the element electrodes of the light receiving element on the element rear portion (the main body section) 532 of the inter-element connecting body. The other portions are covered with tin having high connectability by solder or the like. Such a structure can be formed by forming the insulating layer 26b in portions other than the electric connection region 53 to the element electrodes shown in FIG. 37 by resin or the like on the aluminum, which is the base material 50, in advance and, then, selectively forming nickel and tin in portions other than the insulating film by electrolytic plating or the like, and forming an uneven structure by pressing or the like. By using such an inter-element connecting body, it is possible to form the light receiving element with the inter-element connecting body shown as the sectional view in FIG. 31.

Figure 40:
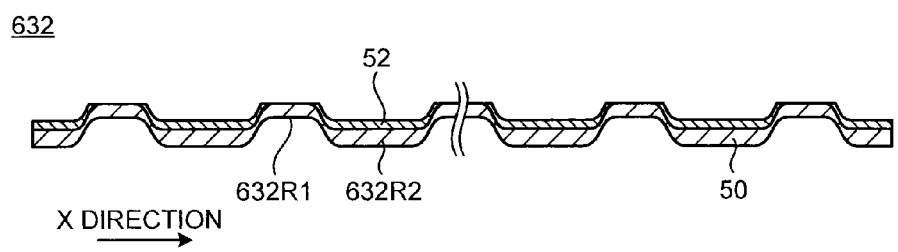
FIG. 40 is a sectional view of a light receiving element with an inter-element connecting body in a modification 3 of the light receiving element module according to the third embodiment.

In the formation of the uneven sections, when the base material is a foil or the like and has low rigidity and it is difficult to retain a pressed shape of concave sections 532R2, the connection of the light receiving element and the inter-element connecting body can be formed in a state in which the uneven sections are retained using a jig or the like having a shape of the unevenness in connecting the light receiving element and the inter-element connecting body in a later process. It is possible to form the main body section 532, which is the element rear portion of the inter-element connecting body shown in FIG. 39 in the same manner as the process for forming the structure of the inter-element connecting body shown in FIG. 38. Specifically, when a structure shown in FIG. 40 is formed, the main body section 532 of the inter-element connecting body shown in FIG. 39 can be formed by, instead of immersing the entire base material in a plating bath, immersing only the portions of the projecting convex sections 532R1 in the plating bath, thereafter, removing the insulating layer 26b with an organic solvent or the like, and tin-plating the surface of only the end of the base material to form the connecting section 51.

Modification 3

A modification 3 is explained with reference to FIG. 40. In the modification 3, metal having high wettability and high reflectance to light is used as the base material 50 of a main body section 632, which is the element rear portion of the inter-element connecting body. Examples of the material of the base material 50 include copper and tin. In the following explanation, copper having higher reflectance and smaller resistance is used as the material. When copper is used as the base material 50 of the main body section 632 of the inter-element connecting body, because copper has high wettability to solder and high reflectance at a wavelength equal to or longer than 800 nanometers, a surface reflecting layer does not have to be formed. Therefore, the main body section 632 does not have to be formed in a multilayer structure shown in FIGS. 37 and 38. The main body section 632, which is the element rear portion of the inter-element connecting body, can be formed by only a copper foil having thickness of about 30 micrometers, which is the base material 50, as explained in the second embodiment. The main body section 632 includes convex sections 632R1 and concave sections 632R2.

However, the reflectance of copper is deteriorated by oxidation. To prevent the deterioration in the reflectance, thiazole, benzotriazole, or the like can be used as a surface protection material. However, when an environment in which the light receiving element is hot and humid, it is likely that the surface of copper is oxidized even after modularization. Therefore, as shown in a sectional view in FIG. 40, aluminum can be vapor-deposited by about 50 nanometers in a region connected to the dot-like electrode 12D of the light receiving element on the main body section 632 of the inter-element connecting body. By forming a reflecting layer 52 of aluminum or the like in this way, it is also possible to suppress the deterioration in the reflectance due to the surface oxidation of the copper.

Modification 4

Figure 41:
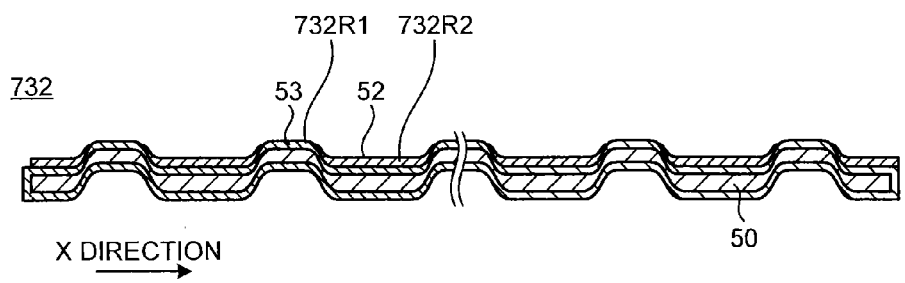
FIG. 41 is a sectional view of a light receiving element with an inter-element connecting body in a modification 4 of the light receiving element module according to the third embodiment.

Between the aluminum and the copper, a tin or tin/silver solder layer can be formed on a copper foil surface by hot-dip plating, electroplating, or the like for the purpose of suppressing diffusion and oxidation of the copper. A main body section 732 formed by a single layer, which is the element rear portion (the main body section) of the inter-element connecting body, can be formed as shown in FIG. 41 using a copper foil having a layer of tin on such a surface as the base material 50. When the base material 50 is a tin foil or a tin plate, the element rear portion (the main body section) 732 of the inter-element connecting body can be formed by tin alone. A structure shown in FIG. 41 can be used by forming aluminum as the reflecting layer 52 like copper. The main body section 732, which is the element rear portion of the inter-element connecting body, can be formed by forming, with vacuum evaporation or the like, an aluminum layer having thickness of 30 to 40 nanometers on a copper foil in portions other than the connecting portions to the element electrodes through a metal mask or the like and, after the formation, forming convex sections 732R1 and concave sections 732R2 with pressing. Concerning the formation of the uneven sections, when a base material is a foil or the like, rigidity is low, and it is difficult to retain the shape of the uneven sections, the light receiving element and the inter-element connecting body can be connected and formed in a state in which the uneven sections are retained using a jig or the like having a shape of the unevenness in connecting the light receiving element and the inter-element connecting body in a later process. When metal having high wettability to solder is used as the base material, because solderability is high, a coating layer such as a solder layer does not have to be formed in the inter-element connecting section of the inter-element connecting body. The reflecting layer formed of aluminum can be formed by not only vapor deposition but also hot-dip plating or the like. The thickness of the reflecting layer can be thicker.

Metal having low wettability and having relatively low reflectance to light can be used as the base material 50 of a main body section 832, which is the element rear portion of the inter-element connecting body. In this case, when a material having low reflectance and having low adhesion to solder or the like such as stainless steel other than aluminum, gold, silver, copper, rhodium, platinum, and the like is used as a base material, as shown in FIG. 42A, it is preferable to form both of the reflecting layer 52 and the electric connection region 53.

Modification 5

Figure 42A:
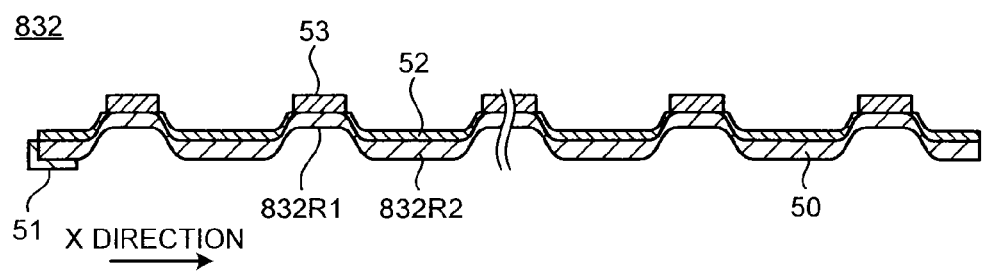
FIG. 42A is a sectional view of a light receiving element with an inter-element connecting body in a modification 5 of the light receiving element module according to the third embodiment.

As shown in FIG. 42A, a structure without the electric connection region 53 under the reflecting layer 52 is also effective. With this configuration, it is possible to more surely maintain unevenness. In manufacturing, as in the manufacturing using the copper foil, for example, iron, stainless steel, or kovar is used as a material of the base material, the base material is coated with metal having high solderability by hot-dip plating or the like, and, then, a resin mask is formed on the base material to be the same patterns as the connection region 53 shown in FIG. 38. Aluminum having thickness of about 30 to 50 nanometers is vapor-deposited to form the reflecting layer 52. The resin mask is removed by an organic solvent. The main body section 832 of the inter-element connecting body, in which the reflecting layer 52 and the electric connection region 53 are locally formed as shown in FIG. 42A, can be formed as explained below.

For example, iron, stainless steel, kovar, or the like can be used as the material of the base material. The base material metal can be used as the reflecting layer 52. To further improve reflectance, aluminum can be used as the reflecting layer 52. In this case, first, a resin mask is formed to be the same patterns as the connection region 53 shown in FIG. 37 on a metal foil or plate cut in size substantially the same as the size of the light receiving element in advance. Aluminum having thickness of about 30 to 50 nanometers is vapor-deposited on the resin mask to form the reflecting layer 52. Thereafter, the resin mask is removed by an organic solvent or the like to form the reflecting layer 52. The end of the metal foil in which the reflecting layer 52 is formed or the connecting section 51 is immersed in a plating bath containing metal ions of nickel or the like to form a nickel layer on the surface with electroplating, electroless plating, or the like. Thereafter, the end of the metal foil or the connecting section 51 is immersed in a bath, in which tin ions are dissolved, and electroplated, whereby a tin layer is formed on the surface of the metal base material. A metal film having high solderability is formed in the connecting section 51 to the inter-element connecting section (not shown in the figure) of the inter-element connecting body. Thereafter, each of convex sections 832R1 is pressed according to necessity to project with respect to each of concave portions 832R2 to form the convex sections 832R1 in the main body section 832, which is the element rear portion of the inter-element connecting body. In this state, after the surface on the convex section side is immersed in a plating bath and electrolytic plating or electroless plating is performed, the surface is further plated in a plating bath including tin ions. Consequently, the connection region 53 to the light receiving element can be formed on the convex sections 832R1. Similarly, the connecting section 51 to the inter-element connecting section (not shown in the figure) of the inter-element connecting body can be formed by immersing only the end of the main body section 832, which is the element rear portion of the inter-element connecting body, in the plating layer.

Figure 42B:
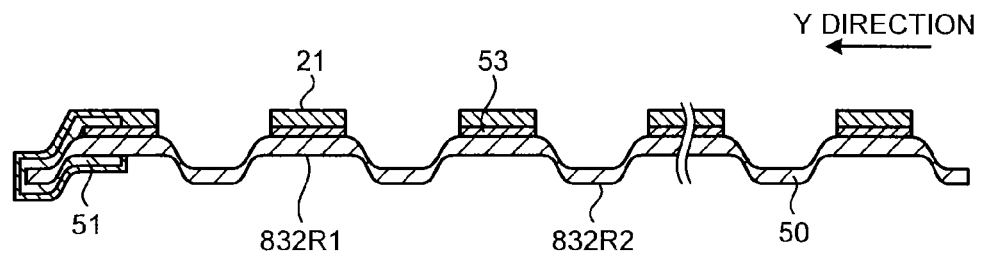
FIG. 42B is a sectional view of the light receiving element with the inter-element connecting body in the modification 5 of the light receiving element module according to the third embodiment.

In a modification of the third embodiment, the main body section 832 of the inter-element connecting body is formed in the shape shown in FIG. 42A, an aluminum foil is used as the material of the main body section 832, and a metal film of chrome or nickel is formed on the surface of the element rear surface side by plating and a metal film of tin or the like is further formed on the metal film to make it easy to perform soldering in a later process. In this case, to solder a portion to be connected to the element electrode as the electric connection body 21, the portion is formed in a shape in which tin is exposed on the patterns of the electric connection region 53 along the arrangement of the rows of the doe-like electrode 12D of the element as shown in FIG. 42A. Further, the inter-element connecting body can be immersed in a melted solder tank to form solder layers in the connecting section 51 to the inter-element connecting section of the inter-element connecting body and the electric connection region 53 to the electrodes of the light receiving element in the electric connection body 21 as shown in FIG. 42B. FIG. 42B is a sectional view in the Y direction of FIG. 37. Y32 is narrow compared with W31 to prevent the dot-like electrode 12D from entering the concave sections 832R2.

In these kinds of plating, because aluminum is oxidized in advance, plating metal is less easily formed on an aluminum vapor-deposited film forming portion. Therefore, it is possible to coat, with the plating metal, only a portion (the connection region 53 for electrical connection) where the resin mask is formed of the element rear portion (the main body section) 832 of the inter-element connecting body. In the formation of the uneven sections, when a base material is a foil or the like, rigidity is low, and it is difficult to retain the shape of the convex sections 832R1 and the concave sections 832R2, the light receiving element and the inter-element connecting body can be connected and formed in a state in which the uneven section is retained using a jig or the like having the shape of the unevenness in connecting the light receiving element and the inter-element connecting body in a later process. As explained above, the main body section 832, which is the element rear portion of the inter-element connecting body, shown in FIG. 42 can be formed.

Modification 6

Figure 43A:
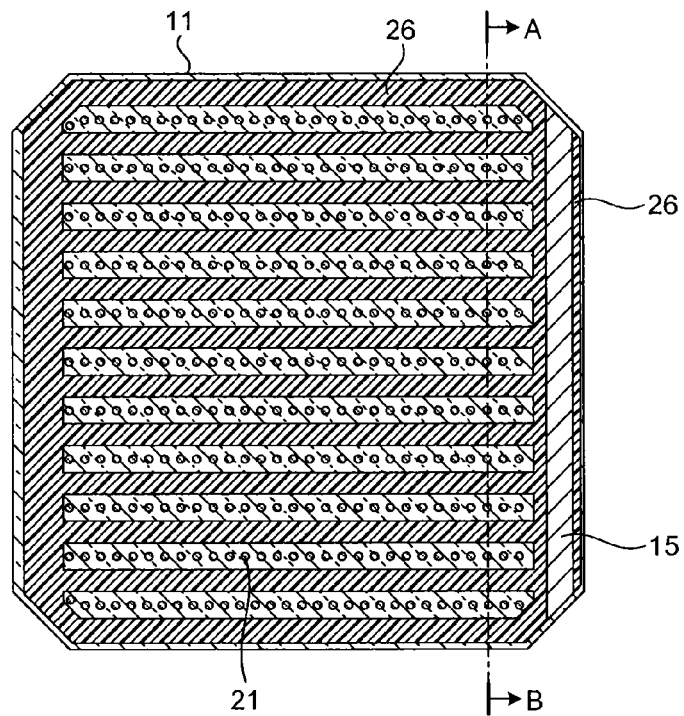
FIG. 43A is a plan view of a light receiving element with an inter-element connecting body in a modification 6 of the light receiving element module according to the third embodiment.
Figure 43B:
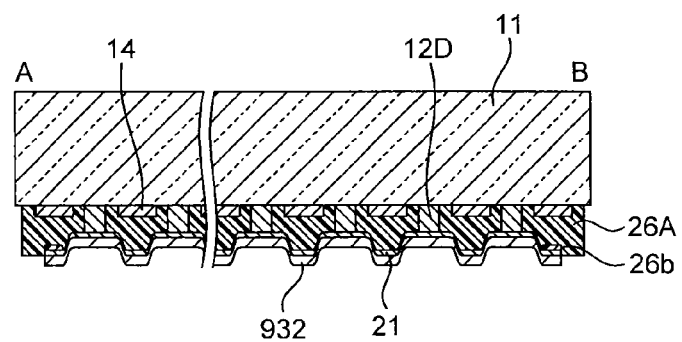
FIG. 43B is a sectional view of the light receiving element with the inter-element connecting body in the modification 6 of the light receiving element module according to the third embodiment.
Figure 44:
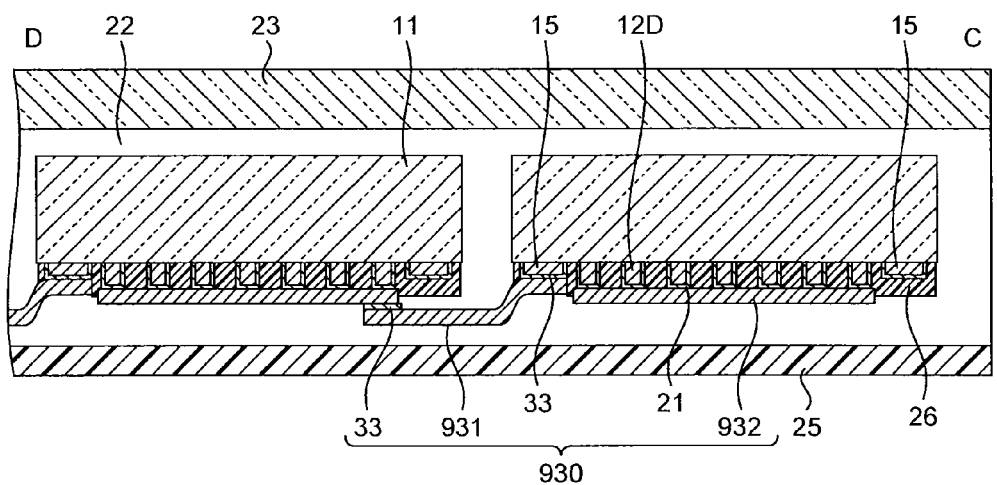
FIG. 44 is a sectional view of the light receiving element with the inter-element connecting body in the modification 6 of the light receiving element module according to the third embodiment.

In this example, a light reflector such as titanium dioxide particles is contained in a bonding layer 26A arranged between the light receiving element and a main body section 932 of an inter-element connecting body. A plan view is shown in FIG. 43A, an A-B sectional view of FIG. 43A is shown in FIG. 43B, and a sectional view of a light receiving element module is shown in FIG. 44. FIG. 44 shows a cross section orthogonal to FIG. 43B. The electric connection body 21, which electrically connects the dot-like electrode 12D and an inter-element connecting body 930, formed only on the portion where a main body section 932 of the inter-element connecting body 930 and the current extraction electrode 15 and the dot-like electrode 12D are connected. An insulating layer 26b is formed on the other surfaces. The electric connection body 21 can widely cover the surface on the element side of the inter-element connecting body 930. However, even when the electric connection body 21 covers the surface on the element side of the main body 932 of the inter-element connecting body and the light reflectance of the electric connection body 21 is not always high in a region where a light absorption coefficient of the light receiving element is small, because the light reflector such as titanium dioxide particles is included in the bonding layer 26A, it is possible to perform sufficient light condensing. The region where the light absorption coefficient of the light receiving element is small can be, for example, a wavelength region that has a penetration length enough for 1% or more of light to be transmitted through the light receiving element in portions excluding the electrodes and in which 1% or more of the light transmitted through the light receiving element is absorbed. When the light receiving element includes a silicon substrate, depending on the thickness of the substrate, the region is a wavelength region of 800 to 1300 nanometers.

An inter-element connecting section 931 passes between two adjacent light receiving elements connected by the inter-element connecting body 930. Therefore, the two light receiving elements are arranged a slight space apart from each other. The inter-element connecting section 931 passes through a gap portion between the elements. Therefore, the gap portion has high light reflectivity and sometimes has different external appearance. In such a case, if necessary, for example, paint is applied or a light blocking tape is applied to only the gap portion to make the external appearance of the gap portion substantially the same as the other portions.

In the third embodiment, the unevenness is present on the rear surface of the element substrate 11 configuring the light receiving element 310. However, the substrate itself does not have to have such unevenness. A level difference only has to be provided in the height of the electrodes. A cross section of a light receiving element module in which the element substrate in portions where the dot-like electrode 12D is formed is not convex compared with the other portions is as shown in FIG. 44. Insulation between the positive electrode of the light receiving element and the inter-element connecting body can be improved by forming the main body section 932, which is the element rear portion, of the inter-element connecting body 930 in a size not overlapping the electrodes on the outermost periphery of the current collecting electrode 14. Therefore, in FIG. 44, the size of the main body section 932 of the inter-element connecting body 930 is set smaller than the size of the structure of the inter-element connecting body in the third embodiment shown in FIGS. 30A and 30B and is a size for covering the dot-like electrode 12D without overlapping the current extraction electrode 15. The inter-element connecting body itself does not have to have unevenness as shown in FIG. 44. On the other hand, when the element electrode on the side connected to the inter-element connecting body 930 is convex, it is easy to connect the inter-element connecting body to the negative electrode. Further, because the other positive electrode and the inter-element connecting body are apart from each other, insulation is improved.

Modification 7

Figure 45A:
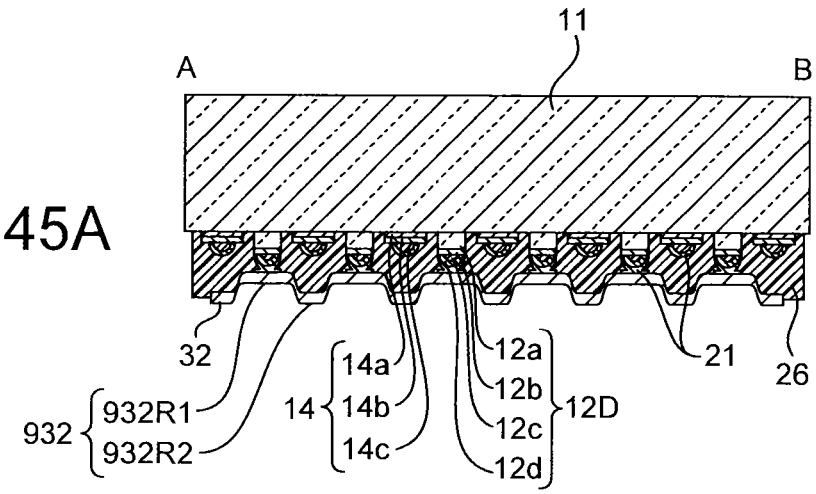
FIG. 45A is a sectional view of a light receiving element with an inter-element connecting body in a modification 7 of the light receiving element module according to the third embodiment.
Figure 45B:
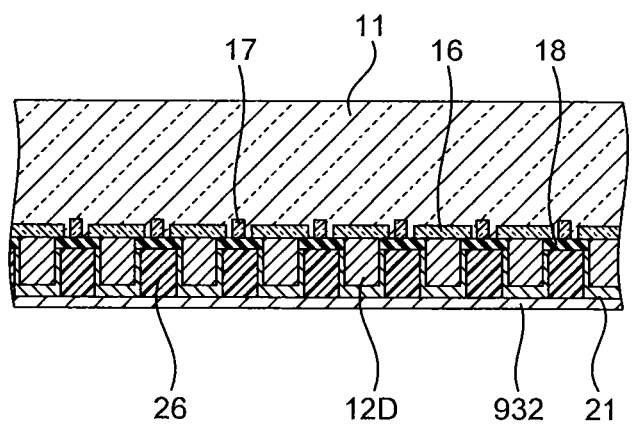
FIG. 45B is a diagram of a positional relation between the position of a conductive layer formed in a substrate and the inter-element connecting body and is a diagram of a surface including dot-like electrode orthogonal to a cross section of FIG. 45A.

In the third embodiment, the light receiving element includes the uneven substrate. However, as shown in FIG. 45A, the substrate can have a flat surface, the electrodes can be formed on the same surface, and the dot-like electrode 12D can be formed on a surface projecting from the surface. FIG. 45B is a diagram of a positional relation between the position of a conductive layer mainly formed in the substrate and the inter-element connecting body. FIG. 45B is a sectional view of a surface including the dot-like electrode 12D orthogonal to a cross section of FIG. 45A. In the figure, a part of the string in which the elements are connected by the inter-element connecting body is shown. The passivation film, the sealing member, and the like on the light receiving surface side are not shown. The other sections are the same as the sections of the light receiving element in the third embodiment shown in FIG. 31. Therefore, explanation of the sections is omitted. The same sections are denoted by the same reference numerals and signs.

In general, a photoelectric conversion element makes use of a photoelectric effect of a semiconductor. However, because the semiconductor has low electrical conductivity, a resistance loss increases when an electric current flows in a long distance in a semiconductor substrate. A decrease in the electric current occurs because of deactivation of light generation carriers when a small number of carriers move in a long distance. Therefore, in the general photoelectric conversion element, electrical conductivity in an in-plane direction is secured by forming metal or a translucent conductive film on the semiconductor substrate. Therefore, a metal electrode is widely distributed over the entire surface of the semiconductor substrate while being separated from each other at a certain interval not to cover the entire semiconductor substrate taking into account a light loss due to electrode shadows.

As an element structure of a photoelectric conversion element of a back connection type among photoelectric conversion elements, in general, there are a MWT (Metal Wrap Through) cell, an EWT (Emitter Wrap Through) cell, and an IBC (Inter-digit Back-contact) cell. In the IBC cell and the EWT cell, grid electrode is not present on a light receiving surface. Therefore, as explained above, positive and negative electrodes need to be widely distributed while being separated from each other. On the other hand, in the MWT cell, a grid electrode is present on the light receiving surface. Therefore, although electrode shadow is formed, only one of the positive and negative electrodes have to be widely distributed on the rear surface side. Therefore, an element electrode structure on the rear surface side is relatively simple. Therefore, although this embodiment is mainly applied to an element structure not including element electrodes on a light receiving surface, this embodiment can be applied to an element including element electrodes on a light receiving surface.

When the electrodes having the different two polarities need to be widely distributed on only one surface while being separated from each other, wirings for the electrodes are complicated. Therefore, the structure in which comb teeth-like electrodes are opposed to each other and current collection is performed by element electrodes as disclosed in Japanese Translation of International Application No. 2010-521811 and the method of forming element electrodes in multiple layers as disclosed in Japanese Patent Application Laid-Open No. 2001-189475 have been devised. However, to form the element electrodes to have small resistance to the semiconductor substrate, high-temperature heat treatment for performing, for example, heating at about 200° C. to 400° C. for 5 to 30 minutes after metal is vapor-deposited or heating at about 500° C. to 900° C. after printing paste containing glass flit is necessary. In this case, in the semiconductor element including the metal electrodes directly on the element substrate via the passivation film or the like described in Patent Literatures 1 and 2, the metal material reaches the semiconductor element substrate piercing through the passivation film or through pinholes or the like accidentally formed in the passivation film. Then, the metal acts as a recombination center. The influence of recombination in the semiconductor increases as electric conductivity in the semiconductor in a region where the metal is present is smaller. The photoelectric conversion efficiency of the photoelectric conversion element is deteriorated. When a region having a certain degree of or higher electric conductivity is present in the semiconductor, this causes Auger recombination and the like. The photoelectric conversion efficiency of the element is deteriorated. Therefore, when an area of a region having high electric conductivity is limited, as explained above, the metal strongly acts as the recombination center.

In such an element structure in which the element electrodes are in direct contact with the element via the insulating layer or the passivation film, it is likely that the metal of the element electrodes diffuses in the insulating layer by, for example, high-temperature treatment for reducing the contact resistance, and conducts with the substrate. In addition, when the electrode having the other polarity is in direct contact with the semiconductor layer having one polarity via an inorganic insulating layer formed on the semiconductor substrate, the metal diffusing from the electrode short-circuit the semiconductor layer and the metal. Therefore, the deterioration in the photoelectric conversion efficiency is conspicuous. This problem occurs because the semiconductor substrate and the electrode metal adhere to each other in a wide area, although via the insulating layer, and are further heated. The problem more conspicuously occurs when the element area is larger (see, for example, "Decoupling charge carrier collection and metallization geometry of back-contacted back-junction silicon solar cells by using insulating thin films," c. Reichel, M. Reusch, F. Granek, M. Hermle, S. W. Glunz, 35th IEEE Photovoltaic Specialists Conference, International Conference, Minutes, July 2010; pages 1034 to 1038). On the other hand, in each of these embodiments, areas of the element semiconductor substrate in direct contact with metals like the element electrodes are enabled to be limited on the low-resistive semiconductor sections with relatively high dopant concentrations on the power generation element. The element electrodes and the inter-element connecting body are conducted by solder or the like at relatively low temperature. The inter-element connecting body is not in direct contact with the element substrate. Therefore, it is possible to obtain high insulation between metals and element substrate. Further, it is possible to improve insulation by forming, using resin or the like, the insulating layer 26b having sufficient thickness in which pin holes are less easily formed. On the other hand, when a conductor is directly formed on an insulating film such as a silicon oxide film by vapor deposition or the like, the conductor is in direct contact with the element substrate in a wide area via the insulating film. Therefore, some portion is short-circuited by contact anneal or thermal polymerization of insulating resin or the like performed thereafter, in particular, via pinholes or the like of the insulating film. In particular, when an inexpensive good conductor like copper is used, because the copper easily diffuses into silicon, a short circuit extremely easily occurs.

In this embodiment, as shown in FIG. 45B, the main body section 932 of the inter-element connecting body is isolated from an n-type diffusion layer of a semiconductor region 17. The main body section 932 of the inter-element connecting body 930 and the dot-like electrode 12D in the element electrode are connected at low temperature by the electric connection body 21 such as solder or conductive resin. On the other hand, because the insulating layer 26 is interposed, the dot-like electrode 12D connected to a p-type diffusion layer, which is the semiconductor region 16, is separated from the semiconductor region 17, which is the n-type diffusion layer. The surface of the semiconductor region 17 is coated with a passivation film 18. As the passivation film 18, a laminated body of a silicon oxide film and an amorphous silicon nitride film is used. Therefore, deterioration in the photoelectric conversion efficiency due to the diffusion of the metal into the semiconductor substrate and a short circuit between the positive electrode (the inter-element connecting body 930 shown in FIG. 45B) and the negative electrode (the semiconductor region 17 shown in FIG. 45B) less easily occurs. Therefore, it is possible to easily manufacture a light receiving element module excellent in the photoelectric conversion efficiency. In particular, when copper is used as the electrode, because the copper has a large diffusion coefficient with respect to silicon, a short circuit and recombination of carriers extremely easily occur in diffusing portions of the copper.

In the present embodiment, contact areas between the element substrate and the element electrodes are enabled to be present only within the low-resistive electric conduction section with relatively high dopant concentration on the power generation element. The inter-element connecting body is not in direct contact with the element substrate. Therefore, it is possible to obtain high insulation. Therefore, it is possible to use copper, which is a good conductor having high solderability, as an electrode material for easily reducing resistance in the element. It is possible to reduce an amount of use of silver, which is a scarce resource, used for element electrodes in general.

Note that the metal is in contact with the semiconductor substrate via the p-type diffusion layer, which is the semiconductor region 16. However, when a relatively high-concentration dopant is present as in this embodiment, the influence of the recombination by the metal is small. Therefore, the contact of the metal with the semiconductor substrate via the semiconductor region 16 in this embodiment does not pose a serious problem compared with the case in which the metal is present in the other portions.

Besides the above, in the structure in which the element electrodes perform current collection disclosed in Patent Literatures 1 and 2, the element electrodes themselves need to be thick to reduce current collection resistance in the element surface. Therefore, a process for increasing the thickness of the element electrode through vacuum vapor deposition, plating, or the like is necessary. On the other hand, according to this embodiment, the element electrode in one polarity does not need to be thick. The resistance in the element substrate surface can be reduced simultaneously with the connection of the elements. Therefore, it is possible to reduce the number of processes.

In the combination of the polyimide insulating layer and the metal vapor deposition film in Patent Literature 2, depending on an environment of use of the module, the metal vapor deposition film is formed discontinuously in an island shape or peels off from the insulating film because of a crack and a shape change involved in a volume change due to swelling or the like of the resin insulating film. Therefore, it is likely that the conductivity in the element in-plane direction of the metal film is deteriorated. On the other hand, for the inter-element connecting body used in the embodiments, a self-supported continuous body of thick-film metal is used. Therefore, the inter-element connecting body is less easily fractured, so that there is an advantage that the conductivity of the inter-element connecting body on the element rear surface can be kept high.

In the photoelectric elements of the back connection type in which inter-element connecting body is connected to the element electrodes over a wide range of the surface of the element substrate disclosed in Patent Literatures 3 and 4, alignment is necessary when the elements are connected. An interval between the positive electrodes and the negative electrodes cannot be narrower than alignment accuracy. However, according to this embodiment, alignment accuracy is unnecessary. It is possible to narrow the electrode pitch of the element electrode without depending on the alignment accuracy, and is also possible to narrow the interval between the positive and negative electrodes. It is possible to manufacture a photoelectric conversion element module excellent in the photoelectric conversion efficiency with a simple structure and a simple method.

When the element substrate and the inter-element connecting body are directly joined by a laser as in WO2012/171968, there is a problem in that the inter-element connecting body is limited to metal that acts as a dopant in the semiconductor substrate. However, according to this embodiment, a wide variety of metals can be combined by using solder or a conductive adhesive and used as the inter-element connecting body and the element electrode, resulting in an advantage that it is possible to manufacture a module excellent in durability, productivity, and resource conservation.

The inter-element connecting body and the light receiving element explained above can be applied not only to the first to third embodiments but also fourth and fifth embodiments explained below. In any of the main body sections 932, which configures the element rear portion of the inter-element connecting body, the portions other than the connecting portion to the inter-element connecting section of the inter-element connecting body are covered with resin or the like. Therefore, it is possible to improve a withstand voltage.

Fourth Embodiment

The light receiving element module 1 in a fourth embodiment is different from the light receiving element module 1 in the third embodiment in the configuration and the shape of a main body section 1032, which is an element rear portion of an inter-element connecting body, and a method of connection between the element electrode and the main body section 1032. Therefore, the difference is mainly explained below. The other sections are the same as the sections explained in the third embodiment. Therefore, explanation of the sections is omitted.

Figure 46A:
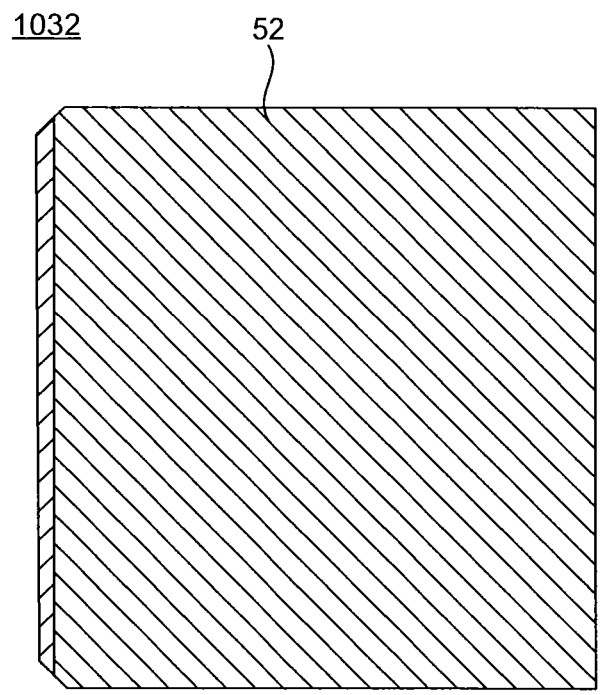
FIG. 46A is a plan view of a main body section of an inter-element connecting body according to a fourth embodiment viewed from a front surface (a surface connected to element electrodes) side.
Figure 46B:
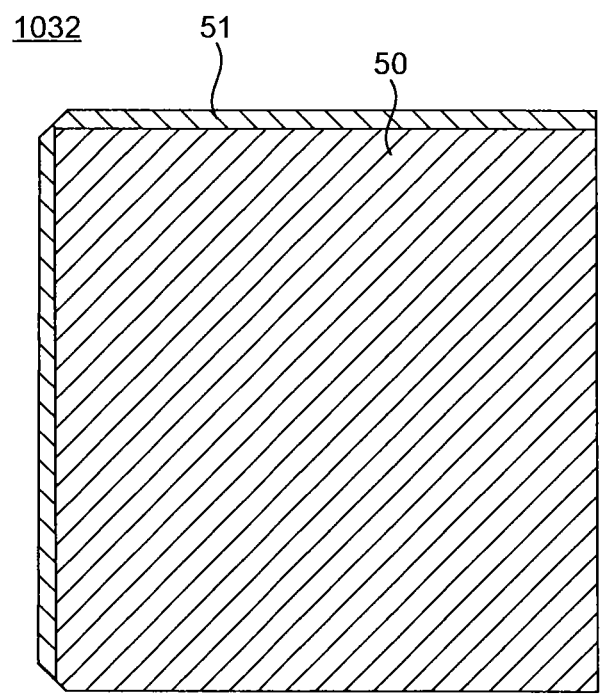
FIG. 46B is a plan view of the main body section of the inter-element connecting body according to the fourth embodiment viewed from a rear surface side.
Figure 47:
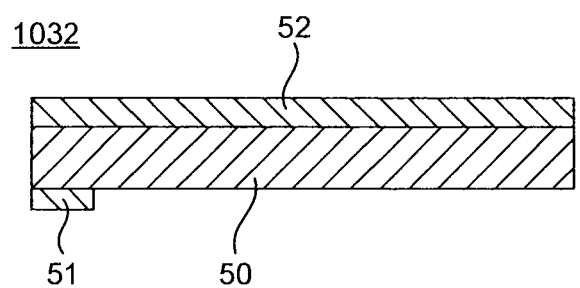
FIG. 47 is a sectional view of the inter-element connecting body.
Figure 48:
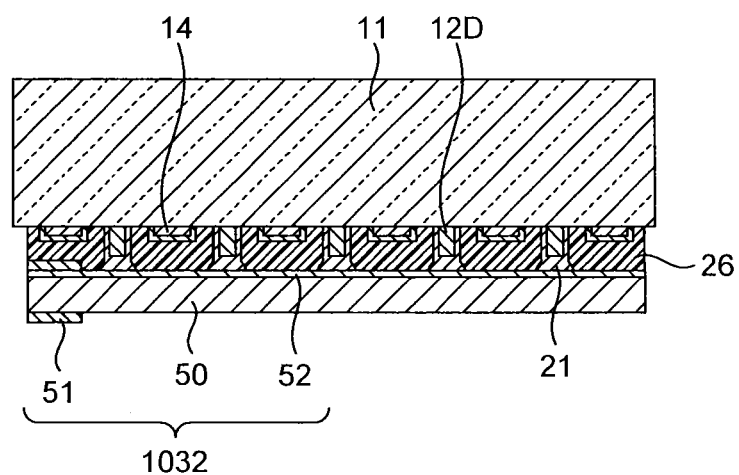
FIG. 48 is a sectional view of a light receiving element with an inter-element connecting body in the fourth embodiment.
Figure 49A:
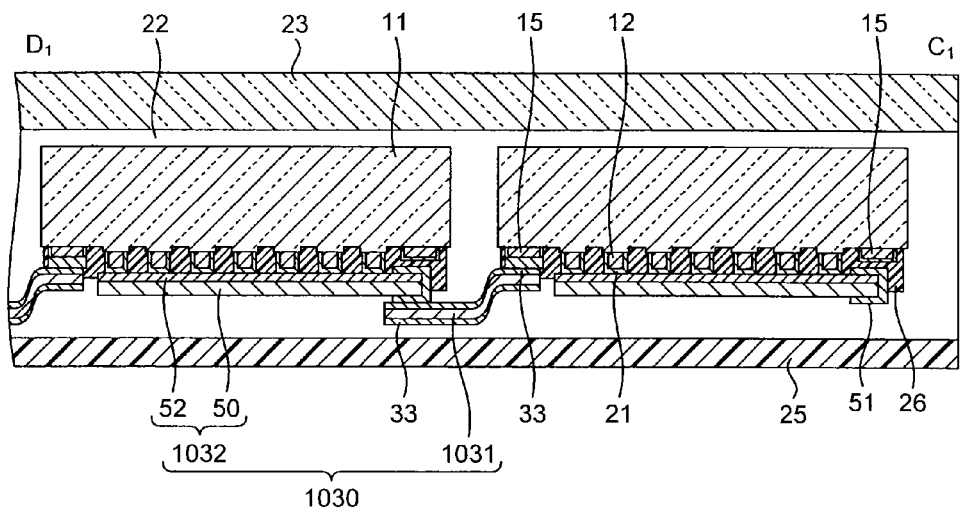
FIG. 49A is a sectional view of a light receiving element module according to the fourth embodiment taken along a portion passing dot-like electrode connected to the inter-element connecting body.
Figure 49B:
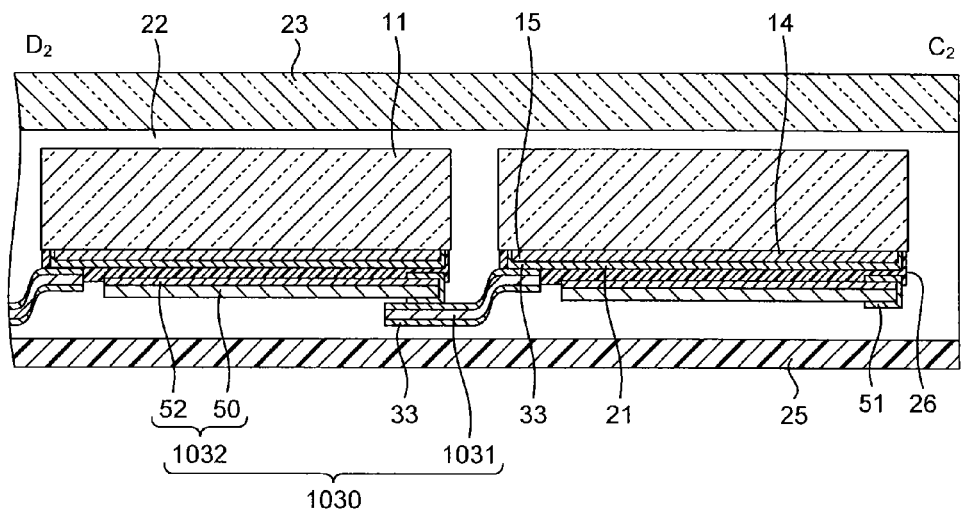
FIG. 49B is a sectional view of the light receiving element module according to the fourth embodiment taken along a portion passing element electrodes having the other polarity.
Figure 50A:
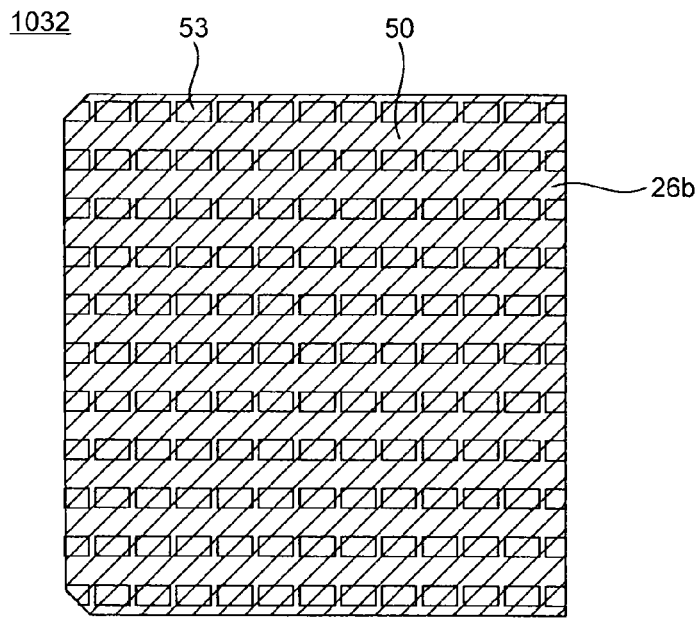
FIG. 50A is a plan view of the inter-element connecting body according to the fourth embodiment after an electric connection body is formed.
Figure 50B:
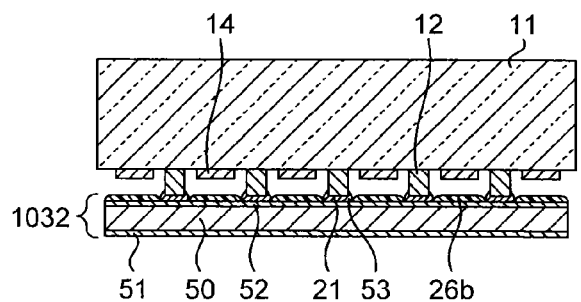
FIG. 50B is a sectional view of the light receiving element with the inter-element connecting body according to the fourth embodiment.
Figure 50C:
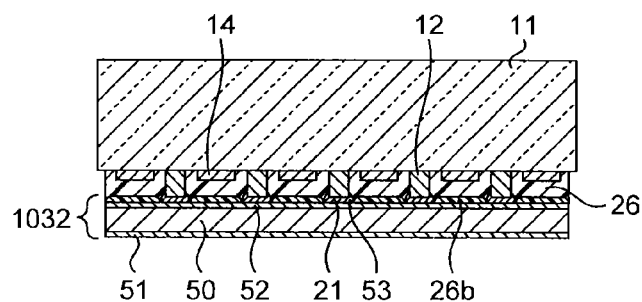
FIG. 50C is a sectional view of the light receiving element with the inter-element connecting body according to the fourth embodiment.

FIG. 46A is a plan view of the main body section 1032 of an inter-element connecting body 1030 according to the fourth embodiment viewed from a front surface (a surface connected to the element electrodes) side. FIG. 46B is a plan view of the main body section 1032 of the inter-element connecting body 1030 according to the fourth embodiment viewed from a rear surface side. FIG. 47 is a sectional view of the inter-element connecting body 1030. FIG. 48 is a sectional view of a light receiving element with an inter-element connecting body in the fourth embodiment. FIG. 49A is a sectional view of a light receiving element module according to the fourth embodiment taken along a portion passing the dot-like electrode 12D connected to the main body section 1032 of the inter-element connecting body 1030. FIG. 49B is a sectional view of the light receiving element module according to the fourth embodiment taken along a portion passing element electrode having the other polarity. FIG. 50A is a plan view of the inter-element connecting body according to the fourth embodiment after an electric connection body is formed. FIGS. 50B and 50C are sectional views of the light receiving element with the inter-element connecting body according to the fourth embodiment.

In the fourth embodiment, the base material 50 portion of the inter-element connecting body 1030 has thickness of about 0.2 millimeter. An iron nickel alloy (an invar) including about 30 to 50 weight percent of nickel is used. By selecting a content ratio of nickel, it is possible bring a coefficient of thermal expansion adjusted to the element side surface layer 52 of the inter-element connecting body 1030 explained later close to a coefficient of thermal expansion of a substrate of the light receiving element such as a silicon substrate. As a result, it is possible to reduce stress to the element and a bend of the element due to a difference in a coefficient of thermal expansion between the element substrate 11 and the main body section 1032 of the inter-element connecting body 1030. Therefore, in the fourth embodiment, the main body section 1032 of the inter-element connecting body 1030 does not have to have flexibility. It is possible to increase the thickness of the main body section 1032 of the inter-element connecting body 1030. Even if a thin element substrate is used, the main body section 1032 of the inter-element connecting body 1030 can support the element substrate itself. It is possible to increase the strength of the entire element with the inter-element connecting body. As a result, even if a thinner element substrate is used, it is possible to prevent an element crack or the like during lamination and conveyance. Because the main body 1032 of the inter-element connecting body 1030 is a substrate that supports the element substrate 11, it is possible to reduce a semiconductor substrate in use.

The light reflectance of such an iron nickel alloy in a visible region, which is a wavelength region relatively often used in the light receiving element, to an infrared region is not so high. The electric conductivity of the iron nickel alloy is low compared with the electric conductivity of copper and the like. Therefore, for the purpose of improving the reflectance and the electric conductivity, in the fourth embodiment, for example, metal having high light reflectivity is connected to the surface of the invar as the element side surface layer 52 of the inter-element connecting body. In the fourth embodiment, a copper foil having thickness of about 10 micrometers bonded to the entire surface of the invar is used as the main body section 1032 of the inter-element connecting body 1030. As an example of the invar, on the surface of which copper is formed, a laminated body of copper and the invar, a copper/invar/copper clad plate, and the like can be used.

In the above explanation, the iron nickel alloy is used as the base material 50 of the main body section 1032 of the inter-element connecting body. Besides, metal having a coefficient of thermal expansion relatively close to the coefficient of thermal expansion of the semiconductor substrate such as titanium, tungsten, and molybdenum can be used. The selection of the metal is particularly important in a solar battery having a large area and a large influence of a coefficient of thermal expansion, in particular, a back connection-type light receiving element including electrodes only on one principal plane. Further, when a copper foil or the like is absent on the side of the element electrodes and a material, to which solder less easily adheres, such as an iron nickel alloy is used for the main body section 1032 of the inter-element connecting body, as in the third embodiment, as the electric connection region 53 to the light receiving element, tin or the like can be formed by plating in generally connected portions of the main body section 1032 of the inter-element connecting body and the element electrodes to improve solderability.

The main body section 1032 of the inter-element connecting body 1030 only has to be a conductor as a whole. Therefore, the base material 50 of the inter-element connecting body does not have to be metal. For example, when the light receiving element is made of an inorganic substrate, a copper foil stuck to a glass epoxy substrate and silver or copper formed by vapor-deposition or sticking on a base material of $Al_2O_3$, AlN, $SiO_2$, BN, or the like can be used.

The invar itself is less easily connected to melted solder. Therefore, an electrode layer is formed in the connecting section 51 to an inter-element connecting section 1031 of the inter-element connecting body to easily join the connecting section 51 by soldering. In the fourth embodiment, as shown in FIG. 50A, nickel is formed at the end on the rear side of the main body 1032 of the inter-element connecting body and tin is formed on the nickel by plating or the like. The formed nickel and tin are formed as the connecting section 51 for the inter-element connecting section 1031 of the inter-element connecting body and the main body section 1032 of the inter-element connecting body. The inter-element connecting body 1030 can be formed by immersing the end of the invar plate base material 50, which includes a copper foil on one surface cut in the same shape as the element in advance, in a nickel plating bath and forming a nickel layer in the connecting section 51 to the inter-element connecting section 1031 of the inter-element connecting body 1030 with electrolytic plating or the like and, then, applying tin plating to the nickel layer to form the connecting section 51 to the inter-element connecting section 1031 of the inter-element connecting body.

The connection of the inter-element connecting body and the light receiving element can be performed by a method same as the self-align process explained in the third embodiment. Specifically, light receiving element with connecting body is formed by bonding a substrate with electrodes and the main body section 1032 of the inter-element connecting body 1030 while heating the substrate and the main body section 1032 using a light receiving element substrate with electrodes in which a solder layer (the electric connection body 21) is formed only on substrate electrodes. The light receiving element module in the fourth embodiment can be manufactured by connecting the light receiving elements with the connecting bodies sing the inter-element connecting section 1031 of the inter-element connecting body 1030 as in the third embodiment. A plan view of the light receiving element module manufactured in this way is substantially the same as FIGS. 22 and 23 except that unevenness is absent ion the main body section 1032 of the inter-element connecting body 1030. Therefore, the plan view is omitted. The light receiving element with the inter-element connecting body in the fourth embodiment is shown in FIG. 48. Sectional views of the light receiving element module are shown in FIGS. 49A and 49B.

By using such a structure, the electric connection body 21 having low light reflectance is not present in portions other than the element electrode portion. Therefore, it is possible to reflect, on a copper foil on the surface of the inter-element connecting body having high reflectance, light transmitted through the substrate from the portions without the element electrode. It is possible to electrically connect the element electrode and the main body section 1032 of the inter-element connecting body to the element electrode with solder. It is possible to reduce current collection resistance on the substrate electrode.

Besides, as the electric connection body 21, silver epoxy resin including silver particles in epoxy resin, indium/tin solder, and the like can be used. The silver epoxy resin has a low Young's modulus. Therefore, by using the silver epoxy resin in the electric connection body 21, because the electric connection body 21 is deformed, it is possible to reduce stress between the element substrate and the main body section 1032 of the inter-element connecting body. When a further reduction in stress is necessary, a lead frame made of soft metal can be introduced into between the electrodes of the light receiving element and the main body section 1032 of the inter-element connecting body or the bonding layer 26 can be removed. In particular, in the fourth embodiment, the flatness of the main body section 1032 of the inter-element connecting body is high. Therefore, the main body section 1032 of the inter-element connecting body comes into contact with the element electrodes on a projecting side. On the other hand, the main body section 1032 of the inter-element connecting body less easily comes into contact with the element electrodes on a recessing side.

As the inter-element connecting section 1031 of the inter-element connecting body, a copper foil coated with tin/silver solder is used. As in the third embodiment, when the inter-element connecting section 1031 is connected to the light receiving element and the main body section 1032 of the inter-element connecting body 1030, the inter-element connecting section 1031 is brought into contact with the contact region 53 on the main body section 1032 of the inter-element connecting body. At the same time, the inter-element connecting section 1031 is brought into contact with the current extraction electrode 15 and heated. Consequently, the dot-like electrode 12D on the substrate and the main body section 1032 of the inter-element connecting body can be connected, the inter-element connecting section 1031 of the inter-element connecting body 1030 and the current extraction electrode 15 on the substrate can be connected, and the inter-element connecting section 1031 of the inter-element connecting body 1030 and the main body section 1032 of the inter-element connecting body 1030 can be connected. By repeating the connection, it is possible to manufacture a light-receiving element module same as the plan views of FIGS. 22 and 23 in the third embodiment except that the light receiving element module does not have uneven sections.

The light receiving element substrate after electrode formation is sometimes heated at high temperature to, for example, connect the light receiving element substrate and the inter-element connecting body. However, a bend occurs in the element or a crack or the like occurs in the element electrodes because of a difference in a coefficient of thermal expansion between the element and the inter-element connecting body. As a result, the strength of the element decreases or the resistance of the element electrodes increases. When the bend is large, the element is cracked when being laminated by the sealing material. Therefore, a problem occurs in the manufacturing of a solar battery having high efficiency and high reliability because of an increase in electrode peeling and an increase in a bend of the substrate due to an increase in the thickness of the metal electrodes. These problems are particularly significant when the thickness of the substrate is thin in the light receiving element of the back connection type in which the electrodes are formed only on one surface of the principal planes of the semiconductor substrate.

On the other hand, in the light receiving element and the light receiving element module in the fourth embodiment, the inter-element connecting body having a coefficient of thermal expansion close to the coefficient of thermal expansion of the element substrate is used. Therefore, it is possible to manufacture a light receiving element with the connecting body and the light receiving element module 1 in which a decrease in a power generation output less easily occurs. In the fourth embodiment, the copper foil is formed on the surface of the inter-element connecting body. The solder formed on the element electrode is melted and connected to the copper foil on the surface of the inter-element connecting body. Therefore, the solder region having low light reflectance is formed in a self-aligning manner only in the portion corresponding to the position of element electrode of the inter-element connecting body 1030. It is possible to increase light reflectance in the other portions. Consequently, according to the fourth embodiment, in light made incident on the light receiving element, light reaching the portions other than the element electrodes (the dot-like electrode 12D, the current collecting electrode 14, and the current extraction electrode 15) on the rear surface of the light receiving substrate and transmitted through the substrate is reflected by the inter-element connecting body 1030 and made incident on the light receiving element substrate again. Therefore, it is possible to reduce a light transmission loss. It is possible to manufacture the light receiving element module 1 excellent in the photoelectric conversion efficiency.

In the fourth embodiment, as shown in FIG. 29 and the like in the third embodiment, the insulating layer 26b can be provided on the main body section 1032 side of the inter-element connecting body. A plan view of the main body section 1032 of the inter-element connecting body 1030 is shown in FIG. 50A. A sectional view of the light receiving element with the inter-element connecting body in which the bonding layer 26 is not used is shown in FIG. 50B. A sectional view of the light receiving element with the inter-element connecting body in which the boning layer 26 is used is shown in FIG. 50C.

The light receiving element with the inter-element connecting body can be formed as explained below. An invar, both surfaces of which are sandwiched by copper and bonded, is used in the main body section 1032 of the inter-element connecting body. A polyimide adhesive tape cut in the shape of the portion other than the connecting portion to the light receiving element in FIG. 50A is bonded to the main body section 1032 of the inter-element connecting body 1030 to form the insulating layer 26b. In the connection region 53 to the element electrodes, the insulating layer 26b is not formed and the copper on the base material surface is exposed to the surface. Therefore, by immersing the surface, on which the insulating layer 26b is formed, in a melted solder bath, it is possible to form the electric connection body 21 by solder in the electric connection region 53 to the element electrodes and form the main body section 1032 of the inter-element connecting body 1030 shown in FIG. 50B.

When the inter-element connecting body 1030 in which the electric connection body 21 is formed on the main body section 1032 of the inter-element connecting body is used, when the element electrode to which the inter-element connecting body 1030 connects is a dot-like electrode, alignment needs to be accurately performed. Therefore, as in the first and second embodiments, the light receiving element used in this case is preferably a light receiving element including a current collecting electrode, the element electrode of which connected to the main body section 1032 of the inter-element connecting body is linear. As in the third embodiment, the electric connection body 21 formed in the connection region 53 on the main body section 1032 of the inter-element connecting body and the element electrodes on the light receiving element are brought into contact with each other using the main body section 1032 of the inter-element connecting body. At the same time, the inter-element connecting section 1031 of the inter-element connecting body made of solder-coated copper and the current extraction electrode 15 on the light receiving element substrate are brought into contact with each other and heated. Consequently, the linear electrode 12 on the element substrate 11 and the main body section 1032 of the inter-element connecting body can be connected, the inter-element connecting section 1031 of the inter-element connecting body and the current extraction electrode can be connected, and the inter-element connecting section 1031 of the inter-element connecting body and the main body section 1032 of the inter-element connecting body can be connected. In this case, not all the connection regions 53 on the inter-element connecting body 1030 are connected to the light receiving element electrodes. However, in the present example, because the element electrode is the linear electrode, all the electric connection regions 53 on the inter-element connecting body 1030 do not always need to be in direct contact with the element electrode. The electric connection regions 53 only have to conduct in the lateral direction in the linear electrode on the element to be connected to the inter-element connecting body through the portion connected to the element electrode.

In this way, the light receiving element with the inter-element connecting body shown in FIG. 50B can be formed. The light receiving element with the inter-element connecting body shown in FIG. 50C can be formed by injecting, as the bonding layer 26, an epoxy precursor into between the inter-element connecting body and the light receiving element as in the third embodiment. By repeating this process using a new light receiving element and the inter-element connecting body, it is possible to manufacture a light receiving element module same as the plan views of FIGS. 22 and 23 in the third embodiment except that the light receiving element module does not include uneven sections.

Figure 51:
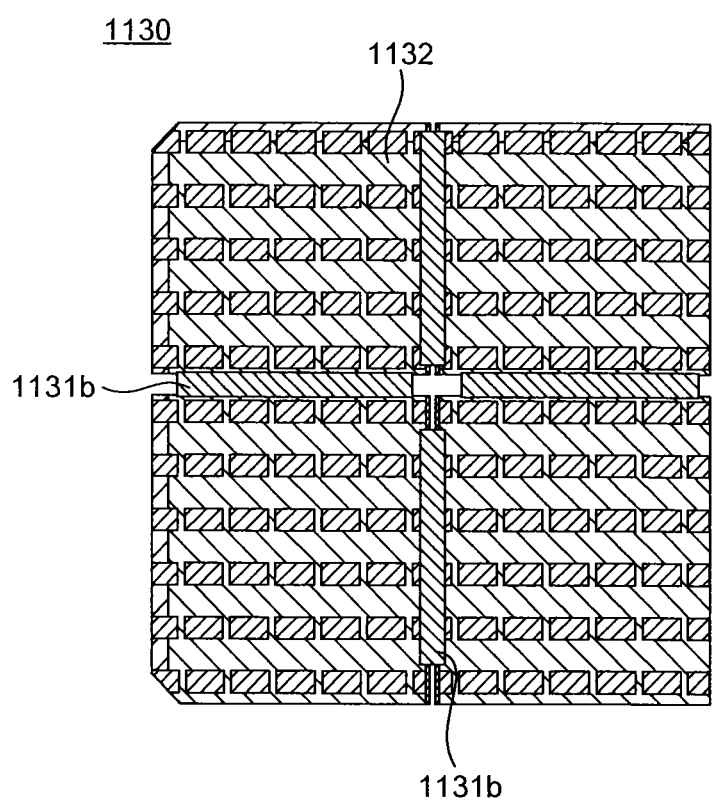
FIG. 51 is a diagram of a modification of the light receiving element with the inter-element connecting body according to the fourth embodiment.

The size of the inter-element connecting body can be reduced to reduce an extension length due to a coefficient of thermal expansions of the inter-element connecting body. For example, as indicated by a modification of the light receiving element with the inter-element connecting body shown in FIG. 51, connecting bodies in divided elements can be connected by conductors 1131b to form an inter-element connecting body 1130 of one element. When it is unnecessary to increase the light reflectance of the inter-element connecting body, the light receiving element can be connected by applying a conductive adhesive to the entire surface of a flat conductor and pressing the conductor against the electrodes on the light receiving element to be bonded.

As explained above, the insulating layer 26b is formed on the inter-element connecting body side. Consequently, it is possible to reduce the likelihood of a short circuit between the element electrode and the inter-element connecting body and improve insulation. Polyimide has high light transmissivity in a wavelength region of 800 to 1300 nanometers that a light receiving element made of silicon can easily transmit. Therefore, light can be reflected by copper in the surface layer of a main body section 1132 of the inter-element connecting body without being attenuated and can be made incident on the light receiving element again. Therefore, the photoelectric conversion efficiency is not deteriorated.

Effects same as the effects of the inter-element connecting body in the fourth embodiment can be obtained by these structures. Effects same as the effects in the first to third embodiments can be obtained in the inter-element connecting body, the light receiving element with the inter-element connecting body, and the light receiving element module in the fourth embodiment.

Fifth Embodiment

The light receiving element module 1 in a fifth embodiment is different from the light receiving element module 1 in the third embodiment in the configuration and the shape of the main body section 1132 of the inter-element connecting body and a method of connection between element electrodes and a main body section 1232 of an inter-element connecting body. Therefore, the differences are mainly explained below. The other sections are the same as the sections explained in the third embodiment. Therefore, explanation of the sections is omitted.

Figure 52A:
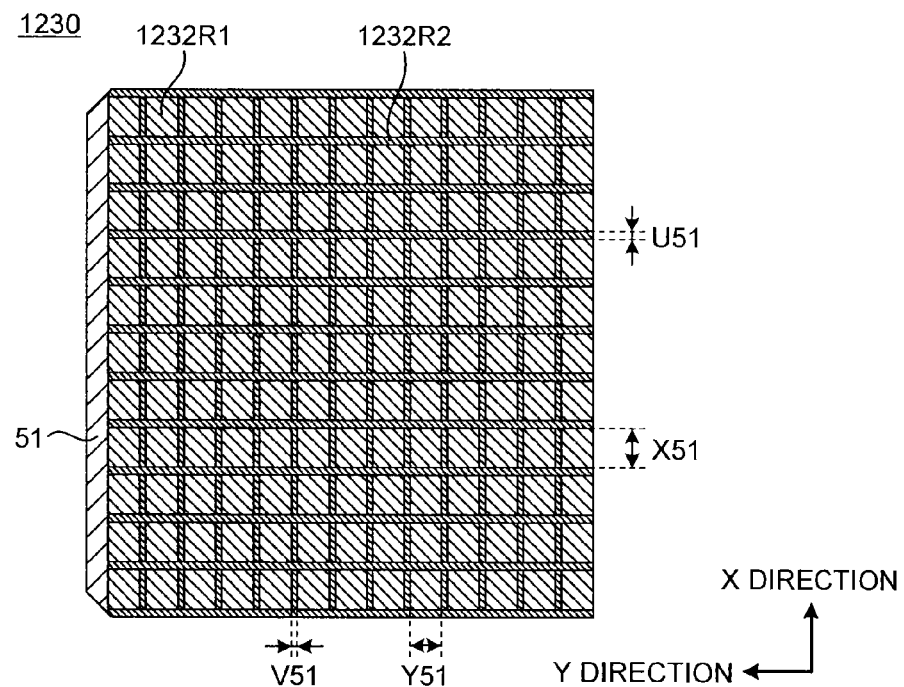
FIG. 52A is a plan view of an inter-element connecting body according to a fifth embodiment viewed from a front surface (a surface connected to an element substrate)
Figure 52B:
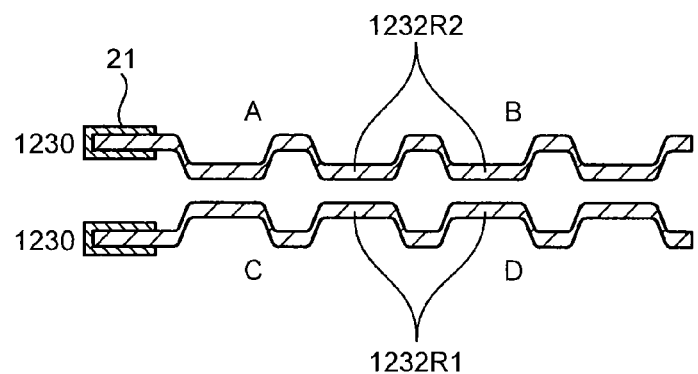
FIG. 52B is a sectional view of the inter-element connecting body according to the fifth embodiment and is a schematic diagram of cross sections passing A-B and C-D in FIG. 53.
Figure 53:
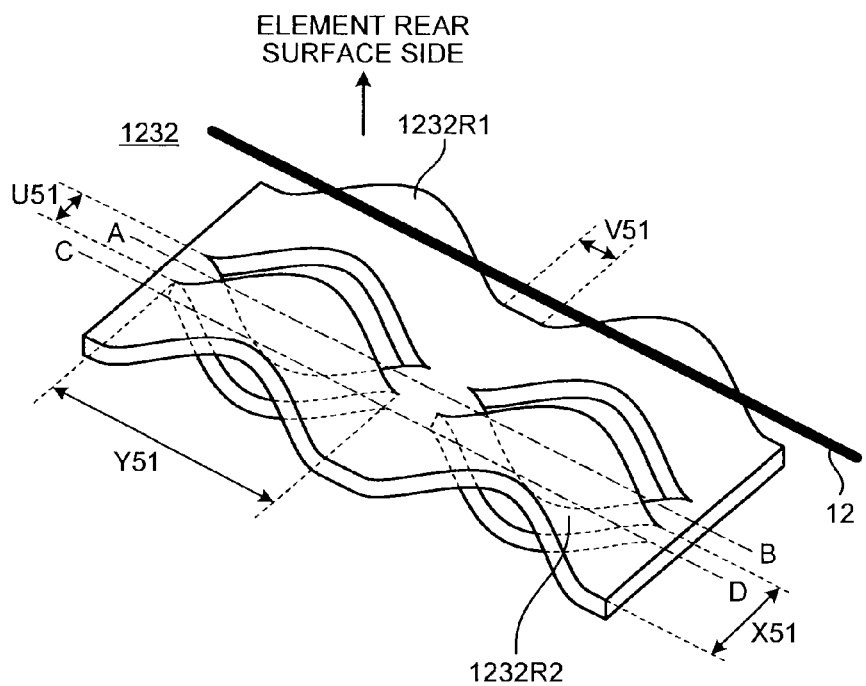
FIG. 53 is a perspective view of a positional relation between a part of the inter-element connecting body and a part of linear electrodes according to the fifth embodiment.

FIG. 52A is a plan view of an inter-element connecting body according to the fifth embodiment viewed from a front surface (a surface connected to an element substrate). FIG. 52B is a sectional view of the inter-element connecting body according to the fifth embodiment and is a schematic diagram of cross sections passing A-B and C-D in FIG. 53. FIG. 53 is a perspective view of a positional relation between a part of the inter-element connecting body and a part of linear electrodes according to the fifth embodiment.

For example, copper having thickness of about 1 to 500 micrometers can be used as a base of an inter-element connecting body 1230. As shown in the figures, the copper is notched. At least in the portion connected to the element electrode of a light receiving element, a copper foil in the notched portion projects from the copper foil concave sections 1232R2 of other portions to form convex sections 1232R1. The projecting portion (the convex sections 1232R1) is connected to the element electrode of the light receiving element and a light receiving element with a connecting body and a light receiving element module are formed. The convex sections 1232R1, which are the projecting portions, are separated from the concave portions 1232R2, which are the other copper foil portions. The convex sections 1232R1 can move independently from the other portions and can be easily deformed. Therefore, it is possible to reduce stress to the element and a bend of the element due to a difference in a coefficient of thermal expansion between the element substrate 11 and the main body section 1232 of the inter-element connecting body. In particular, in a solar battery having a large area and a large influence of a difference in a coefficient of thermal expansion and in a back connection-type light receiving element including electrodes only on one principal plane, it is particularly important to reduce stress with such a structure.

The inter-element connecting body shown in FIG. 52A can be formed as explained below. A flat copper foil having thickness of about 20 micrometers is cut in size substantially the same as the size of the light receiving element and notches forming line segments having length of Y51 are separated by V51 in the Y direction to form rows of the notches. The rows of the notches are alternately formed at intervals of X51 and U51 in the X direction. The electric connection bodies 33 to be convex sections later and the inter-string connecting bodies 34 portions to be concave sections can be formed by being pushed by a pin in opposite directions. The size of X51 and Y51 can be set to be equal to or smaller than 10 millimeters. When the size is about 5 millimeters, a plurality of dot-like or linear element electrodes can be connected to one of the convex sections 1232R1 of the inter-element connecting body 1230. On the other hand, when X51 and Y51 are of the size of about 0.1 millimeter and is extremely small compared with an interval of the element electrodes, a plurality of the convex sections 1232R1 can be connected to one dot-like element electrode. When the shape of electrode on the light receiving element is linear, a plurality of the convex sections 1232R1 are connected to one linear electrode 12.

The substrate with the electrode in which the solder layer (the electric connection body 21) is formed only on the substrate electrode by the self-align process explained in the third embodiment is used. The element substrate with the electrodes and the convex sections 1232R1 on the main body section 1232 of the inter-element connecting body are bonded while being heated. Consequently, it is possible to form a light receiving element with a connecting body and a light receiving element module having effects same as the effects in the third embodiment. In this case, only the convex sections 1232R1 of the inter-element connecting body, in which electrical connection is actually formed, is locally heated by, for example, laser irradiation heating or induction current heating. Consequently, it is possible to suppress diffusion of heat to the entire inter-element connecting body and the entire light receiving element and reduce thermal expansion. It is possible to reduce a bend of the light receiving element with the inter-element connecting body and increase the strength of the light receiving element. Further, it is also possible to connect the light receiving element and the inter-element connecting body while cooling the concave sections 1232R2. Such advantages are realized because heat resistance of the inter-element connecting body is increased by the notches and a temperature difference tends to occur in the surface of the inter-element connecting body.

In the light receiving element with a connecting body and the light receiving element module, it is possible to reflect, with the copper foil having high reflectance, light transmitted through the substrate from the portion without the electrode on the element substrate with the electrode. It is possible to electrically connect the element substrate with the electrode and the main body section 1232 of the inter-element connecting body to the element electrodes with solder. It is possible to reduce current collection resistance on the substrate electrode. Copper is relatively soft metal having high light reflectance in a wavelength region of 800 to 1300 nanometers, in which the light absorption coefficient of the silicon substrate is small and a lot of light is transmitted, and having high electric conductivity. Therefore, copper is suitable for such a use.

As the structure of the inter-element connecting body, besides the structure shown in FIGS. 52A, 52B, and 53, it is also possible to use a base same as the base in the third embodiment or form a reflection layer or a connection layer of the light receiving element and the electrode. For example, metal other than copper can be used. As the main body section 1232 of the inter-element connecting body 1230 having high light reflectance, an aluminum foil, a silver foil, an alloy foil of aluminum and copper, and the like can be used. Aluminum formed by electroplating, thermal spraying, vapor deposition, or the like in portions other than connecting portion of the copper foil and the element electrode of the element, for example portions other than the convex sections 1232R1 shown in FIGS. 52A, 52B, and 53 can be used. By using aluminum in the surface reflection layer, even if the surface is oxidized, the aluminum only changes to alumina having high light transmissivity. Therefore, it is possible to keep high reflectance for a long period. Besides, for example, a copper foil to which an antioxidant such as benzotriazole is applied as a layer for preventing oxidation of the surface of copper (anti-oxidation film), a copper plate to which a coated cloth including an aluminum reflector such as Platinite R is applied, a copper foil partially stuck with an aluminum film by foil stamping, copper partially coated with polymer such as polyamide or fluorocarbon resin in a vacuum can be used. Further, a film of translucent resin, alumina, silica, or the like can be formed as an insulating layer in the concave sections 1232R2 of the main body section 1232 of the inter-element connecting body. By immersing the main body section 1232 of the inter-element connecting body, most of the surface of which is coated with a material having low solderability such as polyimide, in a solder bath, it is possible to form a solder layer mainly in the connecting portion to the element electrode on the inter-element connecting body. It is possible to increase solderability of the inter-element connecting body to the element electrode. As in the third embodiment, when only the convex sections 1232R1 of the inter-element connecting body 1230 are immersed in a layer in which solder is melted, the solder layer can also be formed only on the convex sections 1232R1.

Besides the solder, for example, silver epoxy resin including silver particles in epoxy resin can be used. The silver epoxy resin has a low Young's modulus. Therefore, by using the silver epoxy resin in the electric connection body 21, because the electric connection body 21 is deformed, it is possible to reduce stress between the element substrate and the main body section 1232 of the inter-element connecting body.

The inter-element connecting body according to the fifth embodiment includes the notches. Therefore, it is possible to supply an insulator precursor in a fluidized state, which becomes an insulating layer, from the notches. It is possible to easily form the insulating layer between the main body section 1232 of the inter-element connecting body and the light receiving element. Specifically, after the convex section 1232R1 of the inter-element connecting body 1230 to the linear electrode 12, which is the element electrode as in the third embodiment, ethylene vinyl acetate (EVA) resin formed in a bar shape is heated in a state in which the EVA resin is inserted into spaces under the concave sections 1232R2 in FIG. 52B. The EVA is changed to a fluidized state at high temperature. Consequently, it is possible to form the EVA as the bonding layer 26 between the concave sections 1232R2 and the light receiving element. During the heating, by applying pressure from the back of the light receiving element with the inter-element connecting body (the surface of the inter-element connecting body on the opposite side of the light receiving element) by a diaphragm, a stamper, or the like, it is possible to introduce the EVA in the fluidized state to between the convex sections 1232R1 of the main body section 1232 of the inter-element connecting body 1230 and the light receiving element.

Figure 54:
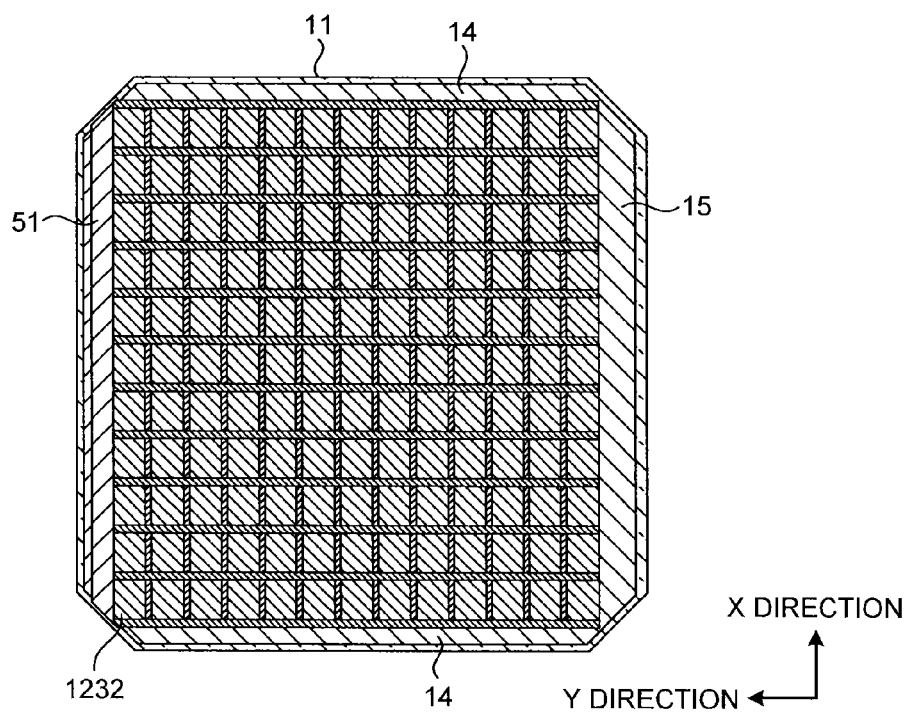
FIG. 54 is a plan view of a light receiving element with the inter-element connecting body according to the fifth embodiment.

Further, during the heating, it is preferable to put the light receiving element with the inter-element connecting body in a decompressed environment because it is possible to insert the EVA in the fluidized state into between the main body section 1232 of the inter-element connecting body 1230 and the light receiving element without a gap. The process for forming the bonding layer 26 can be simultaneously performed with a process for forming a module after a string is formed as in the third embodiment. However, the process can be performed after the inter-element connecting body is electrically connected to the element. In this case, the bonding layer 26 formed by the insulating layer can be formed over the entire rear surface of the inter-element connecting body excluding the connecting section 51 to the inter-element connecting section of the inter-element connecting body. In this case, insulation is improved. When the bonding layer 26 is formed only in a part of the rear surface of the inter-element connecting body, by forming as a structure in which the concave sections 1232R2 project further to the rear side than the bonding layer 26 formed by the insulating layer, it is possible to evaluate current and potential characteristics in a state of the light receiving element with the inter-element connecting body. A plan view of the light receiving element with the inter-element connecting body is shown in FIG. 54. In the figure, for clearness, the boning layer 26 is not shown.

Figure 55:
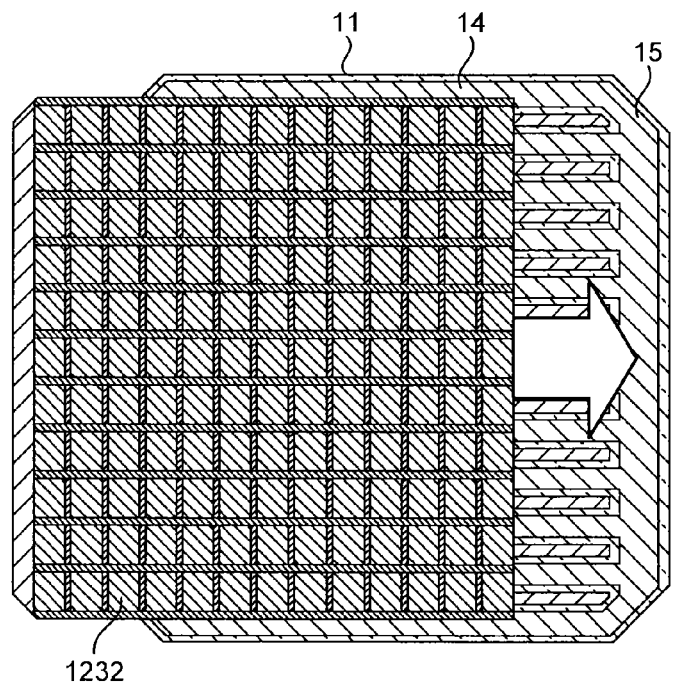
FIG. 55 is a diagram of a process for superimposing the inter-element connecting body on the light receiving element according to the fifth embodiment.

When X51 and Y51 are small to some degree, the EVA resin formed in the bar shape does not have to be used. An EVA sheet laid over the entire rear surface of the light receiving element with the inter-element connecting body is heated to high temperature to change the EVA to the fluidized state and, then, change the EVA to a decompressed state. Consequently, it is possible to cause the EVA to intrude into between the inter-element connecting body and the light receiving element. In this case, to prevent the concave sections 1232R2 from being short-circuited with the element electrodes, a bar, which less easily adheres to the EVA, can be heated in a state in which the bar is put in the spaces under the concave sections 1232R2. After the EVA solidifies to some degree, the bar can be pulled out to form the bonding layer 26. It is possible to prevent the concave sections 1232R2 from being easily short-circuited with the element electrode by heating the solidified EVA again when sealing is performed in modularization. In this way, in the inter-element connecting body 1230 in the fifth embodiment, positions of the current collecting electrode 14, which should be insulated from the inter-element connecting body 1230, and the concave sections 1232R2 of the inter-element connecting body 1230 are superimposed (FIG. 55). In particular, the concave sections 1232R2, which should be insulated, project to the opposite side of the light receiving element side. The space between the light receiving element and the inter-element connecting body 1230 is wide. The insulator precursor in the fluidized state, which becomes an insulating layer, is easily supplied. Therefore, it is easy to form the insulating layer in the concave sections 1232R2, which should be insulated. As a result, it is possible to obtain a light receiving element with an inter-element connecting body and a light receiving element module having excellent insulation.

In the fifth embodiment, both of linear electrodes and dot-like electrode can be used as the element electrodes. However, when the linear electrode 12 is used as the element electrode on the light receiving element to which the inter-element connecting body is connected, alignment in an electrode extending direction (the Y direction) of the convex sections 1232R1 on the inter-element connecting body and the element electrodes is unnecessary. Because the electrode of the light receiving element is the linear electrode 12, all the convex sections 1232R1 do not always have to be in contact with the element electrodes. If the number of the convex sections 1232R1 is large, positions where the convex sections 1232R1 are formed do not have to be aligned in a row shape and can be any positions. Therefore, it is easy to form the inter-element connecting body and the alignment of the light receiving element and the inter-element connecting body is simplified. In FIG. 53, a positional relation between the linear electrode 12 and the main body section 1232 of the inter-element connecting body 1230 is shown. The advantages are explained with reference to FIG. 53. When the electrode of the light receiving element is linear, a photocurrent generated near the convex sections 1232R1 shown in FIG. 53 is extracted to the dot-like electrode 12D through any one of the contact holes (the opening sections) indicated by 12h in FIG. 25B. For example, even if the convex sections 1232R1 shown in FIG. 53 are not in contact with the linear electrode 12, the photocurrent generated near the convex sections 1232R1 can reach the main body section 1232 of the inter-element connecting body 1230 through the linear electrode 12 and the concave sections 1232R2 while being conducted through the metal electrode having a relatively low resistance value.

On the other hand, when the element electrode is the dot-like electrode, a photocurrent generated near the convex sections 1232R1 shown in FIG. 53 is extracted to the dot-like electrode 12D through any one of the contact holes (the opening sections) indicated by 12h in FIG. 25B. However, for example, when the convex sections 1232R1 shown in FIG. 53 are not in contact with the linear electrode 12, because the photocurrent generated near the convex sections 1232R1 can reach the main body section 1232 of the inter-element connecting body 1230 only through the element substrate having high resistance, resistance rises. Therefore, when the dot-like electrode is used as the element electrode, it is preferable to apply treatment for, for example, reducing the distance V51 between the rows of the notches as in the third embodiment.

Because the main body section 1232 of the inter-element connecting body is easily deformed in the X direction, stress is easily reduced. However, in the Y direction, because a deformation amount is small, stress is applied to the element. To reduce the stress, as in the fourth embodiment shown in FIG. 51, the main body section 1232 of the inter-element connecting body 1230 can be divided. The divided main body sections 1232 can be connected by an electric connection body (not shown in the figure).

Figure 56:
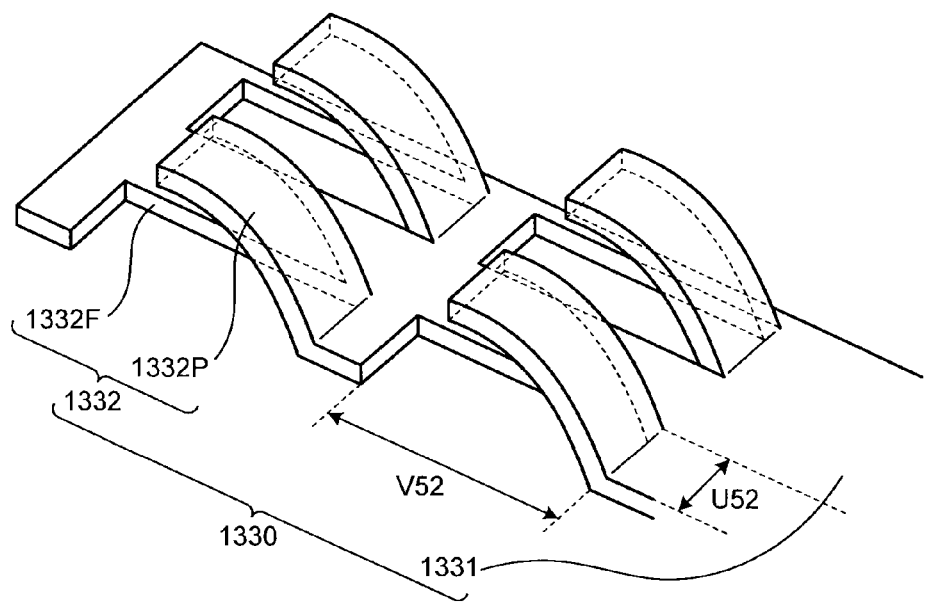
FIG. 56 is a perspective view of a modification of the inter-element connecting body according to the fifth embodiment.

As another modification, an inter-element connecting body 1330 formed by a unit shown in FIG. 56 can be used. In the inter-element connecting body, a main body section 1332 and an inter-element connecting section 1331 are integrally molded. The main body section 1332 includes a flat section 1332F and a cut and raised piece 1332P. The cut and raised piece 1332P formed by notching a metal plate at length V52 and width U52 contributes to connection to the element electrodes and plays a role of a current carrying section in conjunction with the flat section 1332F. The inter-element connecting body 1330 is simple in structure and covers substantially the entire surface of the element. In this example, as in the example explained above, the main body section 1332 can be molded separately from the inter-element connecting section 1331.

In the inter-element connecting bodies 1230 and 1330 in this embodiment, a double-sided light receiving element capable of receiving light on both front and rear surfaces and generating photoelectromotive force can be used as a light receiving element other than the light receiving element of the back connection type. Element-transmitted light is generated even in such an element, by using the inter-element connecting body in this embodiment, it is possible to reduce current collection resistance on the element. It is possible to make the element transmitted light incident on the light receiving element again and improve efficiency of use of light.

As explained above, in the inter-element connecting body, the light receiving element with the inter-element connecting body, and the light receiving element module according to the fifth embodiment, the connection portion of the inter-element connecting body and the element electrode have high wettability to solder. On the other hand, in the other portions, copper or aluminum is exposed to the surface, electric connectivity to the element electrodes is high, and current collection performance for an electric current from the element electrode is high. Therefore, it is possible to form an inter-element connecting body excellent in reflectivity for light transmitted through the element.

The light receiving element substrate after electrode formation is sometimes heated at high temperature, for example, for the purpose of connecting the light receiving element substrate and the inter-element connecting body. However, in the conventional light receiving element, because of a difference in a coefficient of thermal expansion between the element and the inter-element connecting body, a bend occurs in the element or a crack or the like occurs in the element electrode. The strength of the element decreases or the resistance of the element electrode increases. When the bend is large, the element is cracked when being laminated by the sealing material. Therefore, a problem occurs in the manufacturing of a solar battery having high efficiency and high reliability because of an increase in electrode peeling and an increase in a bend of the substrate due to an increase in the thickness of the metal electrodes. These problems are particularly significant when the thickness of the substrate is thin in the light receiving element of the back connection type in which the electrode is formed only on one surface of the principal plane of the semiconductor substrate.

On the other hand, in the light receiving element with the connecting body and the light receiving element module in the fifth embodiment, because the inter-element connecting body is notched, the convex sections 1232R1 can be relatively freely deformed with respect to the concave sections 1232R2. Therefore, it is possible to manufacture a light receiving element with a connecting body and the light receiving element module 1 in which a decrease in power generation output less easily occurs. The same applies to the inter-element connecting body 1330 in the modification. The cut and raised section 1332P can be relatively freely deformed with respect to the flat section 1332F. At the same time, because the notches are present, the insulating layer (the bonding layer 26) is easily formed between the inter-element connecting body and the light receiving element.

In a state in which the inter-element connecting body is notched and formed as a flat tabular body, the bonding layer 26 is formed in the inter-element connecting body, and the inter-element connecting body is set in contact with the light receiving element, the main body section of the inter-element connecting body can be pressurized toward a hot plate by a stamper. In this case, if the stamper in use has flexibility, when the main body section is pressurized, in portions without electrode and portions corresponding to the current collecting electrode 14 and the current extraction electrode 15 portion having small height, the stamper projects to the light receiving element side. In the dot-like electrodes 12D portion, the stamper recesses. Therefore, the inter-element connecting body satisfactorily comes into contact with the current collecting electrode 14 and the current extraction electrode 15.

In the fifth embodiment, the copper foil is formed on the surface of the inter-element connecting body. By melting the solder formed on the element electrodes and connecting the solder to the copper foil on the surface of the inter-element connecting body, a solder region having low light reflectance is formed in a self-aligning manner only in portions corresponding to the positions of the element electrodes on the inter-element connecting body 1230. It is possible to increase the light reflectance in the other portions. Consequently, according to the fifth embodiment, in light made incident on the light receiving element, light reaching the portions other than the element electrodes (the linear electrode 12, the current collecting electrode 14, and the current extraction electrode 15) on the rear surface of the light receiving substrate and transmitted through the substrate is reflected by the inter-element connecting bodies 1232 and 1332 and made incident on the light receiving element substrate again. Therefore, it is possible to reduce a light transmission loss. It is possible to manufacture the light receiving element module 1 excellent in the photoelectric conversion efficiency. Besides, in the fifth embodiment, it is possible to obtain effects same as the effects in the first to fourth embodiments.

In the first to fifth embodiment, it is desirable that the bonding layer 26 formed of insulative resin including reflective particles is filled between the main body section including the element rear portion of the inter-element connecting body and the light receiving element 10 excluding connecting points (connecting regions) to the linear electrode 12 or the dot-like electrode 12D. It is possible to further improve light condensing properties by using the insulative resin including the reflective particles for sealing resin as well in the light receiving element module.

As explained above, with the light receiving element module including the inter-element connecting body according to the present invention, substantially the entire surface of the light receiving element is covered with the main body section formed by the metal continuous body. Therefore, an amount of light allowed to escape backward from the inter-element connecting body decreases. It is possible to improve light use efficiency. Because accurate alignment is unnecessary, the strength of the light receiving element module is high. The light receiving element module is less easily cracked, for example, during conveyance in a state in which the light receiving element is attached to the light receiving element module. The inter-element connecting body is connected to the light receiving element as a whole. Therefore, even in a string state, a force is not applied to one point and the light receiving element module is less easily cracked. Consequently, the light receiving element module according to the present invention is particularly effective for mounting of a thin light receiving element.

According to the present invention, the tabular main body section of the inter-element connecting body covers substantially the entire back of the light receiving element. Therefore, at least the first electrodes on the light receiving element are connected to the main body section of the inter-element connecting body by surface contact. Therefore, a connection distance from the first electrodes (the element electrodes) to the inter-element connecting body is short. The inter-element connecting body has an area substantially the same as the area of the light receiving element, sufficient thickness, and low resistance. Therefore, it is possible to greatly reduce a resistance loss. Further, it is possible to reflect transmitted light of the light receiving element and make the transmitted light incident on the light receiving element again. Therefore, there is an effect that it is possible to reduce a light transmission loss and improve a power generation output with respect to a setting area.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A light receiving element module comprising:
   a light receiving element of a back connection type including first and second electrodes with different polarities on a back side; and
   an inter-element connecting body;
   wherein the inter-element connecting body includes:
   a tabular main body section selectively connected to the first electrode, arranged on the second electrode via an insulating layer, and configured to cover substantially the entire back side of the light receiving element excluding a part of the second electrode; and
   an inter-element connecting section connected to a part of the second electrode of the light receiving element uncovered with the main body section.

2. The light receiving element module according to claim 1 including a plurality of the light receiving elements, wherein
   one end of the inter-element connecting section is connected to the main body section and the other end is connected to the second electrode of the light receiving element adjacent to its own light receiving element.

3. The light receiving element module according to claim 1, wherein the main body section is made of a metal plate or a foil and joined to the first electrode of the light receiving element via an electric connection body selectively formed only for a connecting point between the main body section and the first electrode.

4. The light receiving element module according to claim 1, wherein the main body section is made of a metal plate or a foil and joined to the first electrode of the light receiving element via a solder layer.

5. The light receiving element module according to claim 1, wherein, in the main body section, the front-side surface in a portion other than a connecting point to the first electrode of the light receiving element is formed of a light reflector to reflect light transmitted through the light receiving element.

6. The light receiving element module according to claim 1, wherein, in a surface of the main body section opposed to the light receiving element, a concave section is formed with respect to the light receiving element in a region equivalent to the second electrode of the light receiving element.

7. The light receiving element module according to claim 1, wherein the main body section and the inter-element connecting section are integrally formed.

8. The light receiving element module according to claim 1, wherein the main body section and the inter-element connecting section are separately formed.

9. The light receiving element module according to claim 1, wherein an electric connection body is selectively formed only in joining sections between the first and second electrodes and the light receiving element.

10. The light receiving element module according to claim 1, wherein the first electrode on the light receiving element projects toward the main body side of the inter-element connecting body compared with the second electrode.

11. The light receiving element module according to claim 1, wherein the main body section of the inter-element connecting body has an uneven structure and is connected to the first electrode by a convex section.

12. The light receiving element module according to claim 11, wherein, a direction perpendicular to an extending direction of the second electrode, the width of a concave section with respect to a light receiving surface side in the uneven structure of the main body section of the inter-element connecting body is narrow than the width of the first electrode.

13. The light receiving element module according to claim 1, wherein the main body section has an insulating layer on a region equivalent to a second electrode of the main body's surface opposed to the light receiving element.

14. The light receiving element module according to claim 1, wherein insulative resin including reflective particles is filled between the main body section and the light receiving element.

15. The light receiving element module according to claim 1, wherein the main body section is formed by a two-layer structure of an element rear portion arranged on the light receiving element side and an outer side portion arranged on an outer side.

16. The light receiving element module according to claim 2, wherein
a plurality of the light receiving elements are connected by the inter-element connecting body to form a string, and the light receiving element at an end of the string has an electrode pattern similar to that of the light receiving element inside the string, and wherein
an element electrode of the light receiving element at the string end is arranged to be rotated with respect to an element electrode of the light receiving element inside the string by a sum of at least one external angles among external angles of a polygon formed by vertexes of an element substrate surface.

* * * * *